(12) United States Patent
Nii et al.

(10) Patent No.: US 7,504,161 B2
(45) Date of Patent: Mar. 17, 2009

(54) LUMINESCENT ELEMENT

(75) Inventors: Kazumi Nii, Kanagawa (JP); Hisashi Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 42 days.

(21) Appl. No.: 10/472,952

(22) PCT Filed: Mar. 28, 2002

(86) PCT No.: PCT/JP02/03101

§ 371 (c)(1),
(2), (4) Date: Sep. 26, 2003

(87) PCT Pub. No.: WO02/079343

PCT Pub. Date: Oct. 10, 2002

(65) Prior Publication Data

US 2004/0072017 A1    Apr. 15, 2004

(30) Foreign Application Priority Data

Mar. 30, 2001    (JP) ............... 2001-101027

(51) Int. Cl.
*H01L 51/50*    (2006.01)
(52) U.S. Cl. ............ 428/690; 428/917; 313/504; 313/506
(58) Field of Classification Search ........ 428/690, 428/917; 313/504, 506
See application file for complete search history.

(56) References Cited

U.S. PATENT DOCUMENTS

| | | | |
|---|---|---|---|
| 4,769,292 A * | 9/1988 | Tang et al. ............ | 428/690 |
| 5,518,824 A | 5/1996 | Funhoff et al. | |
| 5,766,779 A * | 6/1998 | Shi et al. ............ | 428/690 |
| 6,310,231 B1 * | 10/2001 | Igarashi et al. ......... | 556/489 |
| 6,461,747 B1 * | 10/2002 | Okada et al. ............ | 428/690 |
| 6,506,507 B1 * | 1/2003 | Okada et al. ............ | 428/690 |
| 6,555,959 B1 * | 4/2003 | Nii ...................... | 313/506 |
| 6,620,529 B1 * | 9/2003 | Ise et al. ............... | 428/690 |
| 6,635,364 B1 * | 10/2003 | Igarashi ................ | 428/690 |
| 6,696,178 B2 * | 2/2004 | Igarashi ................ | 428/690 |
| 6,821,645 B2 * | 11/2004 | Igarashi et al. ......... | 428/690 |
| 6,835,474 B2 * | 12/2004 | Okada et al. ............ | 428/690 |

FOREIGN PATENT DOCUMENTS

| | | | |
|---|---|---|---|
| JP | 11-292875 A | 10/1999 | |
| JP | 11-329734 A | 11/1999 | |
| JP | 11-335661 A | 12/1999 | |
| JP | 2000-21562 A | 1/2000 | |
| JP | 2000-302754 A | 1/2000 | |
| JP | 20001-21575 A | 1/2000 | |
| JP | 2000-77185 A | 3/2000 | |
| JP | 2000-133458 A | 5/2000 | |
| JP | 2000-351774 A | 12/2000 | |
| JP | 2000-351966 | * 12/2000 | |
| JP | 2000-355687 | * 12/2000 | |
| JP | 2001-60496 A | 3/2001 | |
| JP | 2001-85166 A | 3/2001 | |
| JP | 2001-192651 A | 7/2001 | |
| JP | 2002-43059 A | 2/2002 | |

OTHER PUBLICATIONS

Japanese Patent Office English abstract and computer-generated translation for JP 11329734 A, Sato et al., published Nov. 30, 1999.*
Japanese Patent Office English abstract and computer-generated translation for 11-335661 publication date Dec. 1999.*
Gao et al., Applied Physics Letters, vol. 74, No. 6, Feb. 8, 1999, p. 865-867.*
JPO machine translation of JP 2001-060496 published Mar. 2001.*
JPO machine translation of JP 2000-355687 published Dec. 2000.*

\* cited by examiner

*Primary Examiner*—Dawn Garrett
(74) *Attorney, Agent, or Firm*—Sughrue Mion, PLLC

(57) ABSTRACT

A light-emitting element comprises a substrate, a pair of opposed electrodes between which are provided a light-emitting layer containing at least one light-emitting material selected from compounds of general formula (I) and a host material, and which has an organic membrane having a larger ionization potential than that of the host material between the light-emitting layer and a cathode, with the organic membrane being in contact with the light-emitting layer:

general formula (I)

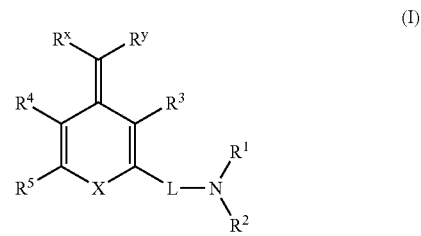

wherein $R^1$ to $R^5$ may be the same or different and each represents a hydrogen atom or a substituent, X represents an oxygen atom, a sulfur atom or $N-R^{Y1}$, $R^{Y1}$ represents a hydrogen atom or a substituent, L represents a linking group comprising a conjugated bond, $R^X$ and $R^Y$ may be the same or different and each represents a hydrogen atom or a substituent, with at least one of them being an electron-withdrawing group.

6 Claims, No Drawings

LUMINESCENT ELEMENT

TECHNICAL FIELD

The present invention relates to a light-emitting element which can be utilized in the field of back light, flat panel display, light sources for illumination, display elements, electrophotography, organic semiconductor lasers, recording light sources, reading light sources, signs, signboards, and optical communication devices.

BACKGROUND ART

In these days, research and development on various light-emitting elements have been vigorously conducted. Of them, organic electroluminescent (EL) elements have attracted attention as promising light-emitting elements due to their advantages of ultra-thin thickness and light weight, high response speed, wide viewing angle, and low driving voltage. In general, the organic EL elements comprise a light-emitting layer sandwiched by a pair of opposed electrodes and utilize a light emitted from excitons generated by recombination of an electron injected from a cathode and a hole injected from an anode.

Presently known organic EL elements capable of giving a highly bright luminance at a low voltage are those which are disclosed by Tang and which have a layered structure (Applied Physics Letters, vol.51, p.913, 1987). These elements have an electron-transporting and light-emitting material and a hole transporting material in a layered form which serves to emit a high-luminance green light, and they give a luminance as high as several thousands cd/m² at a direct current voltage of 6 to 7 V. However, in consideration of their use as a full color display or a light source, emission of lights of three primary colors or a white light is practically necessary. The above-described elements use a 8-quinolinol aluminum complex as a light-emitting material, and the color of the light emitted therefrom is limited to green. Hence, light-emitting elements capable of emitting a light of other color have been desired to be developed. As materials capable of emitting a light of a longer wavelength than green, there have so far been developed such light-emitting materials as 4-(dicyanomethylene)-2-methyl-(4-dimethylaminostyryl)-4H-pyran (DCM) and its derivatives, Nile Red derivatives and Eu (III) complexes. However, they have the defects of, for example, poor color purity, low luminance of an emitted light, low light-emitting efficiency, and low durability.

Thus, various investigations have been made. Elements using compounds having a cyclic acidic nucleus such as those compounds which are described in JP-A-11-335661 were prepared and evaluated and were found to be excellent in red color purity, emitted light luminance, light-emitting efficiency and durability.

However, in the case of preparing an element wherein one and the same compound is used as the electron injecting and transporting layer on the cathode side and a host material in the light-emitting layer as with the vacuum deposition type element described in the Example, there result a poor luminance response and a large temperature dependence of the pulse width of an emitted light in pulse driving. Therefore, in the case of applying them to light sources for exposure, they are not adapted for creating a wide gradation by pulse modulation. Thus, improvement of response properties upon pulse driving, particularly temperature dependence of the pulse width of an emitted light, have been desired. Also, light-emitting efficiency has been desired to be more improved.

DISCLOSURE OF THE INVENTION

An object of the invention is to provide a light-emitting element which has improved response properties upon pulse driving, particularly shows a small temperature dependence of the pulse width of an emitted light.

Another object of the invention is to provide a light-emitting element which is excellent in red color purity, light-emitting efficiency and durability.

The above-described objects of the invention are attained by the following.

1. A light-emitting element, which comprises a substrate having provided thereon a pair of opposed electrodes between which are provided a light-emitting layer containing at least one light-emitting material selected from the compounds represented by the following general formula (I) and a host material, and which has an organic membrane having a larger ionization potential than that of the host material between the light-emitting layer and the cathode, with the organic membrane being in contact with the light-emitting layer:

general formula (I)

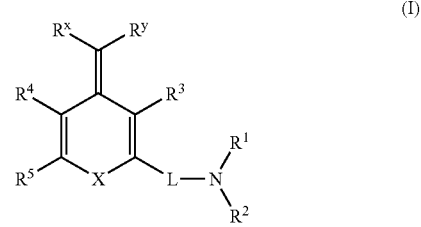

wherein $R^1$, $R^2$, $R^3$, $R^4$ and $R^5$ may be the same or different from each other and each represents a hydrogen atom or a substituent, X represents an oxygen atom, a sulfur atom or N—$R^{Y1}$, $R^{Y1}$ represents a hydrogen atom or a substituent, L represents a linking group comprising a conjugated bond, $R^X$ and $R^Y$ may be the same or different from each other and each represents a hydrogen atom or a substituent, with at least one of them being an electron-withdrawing group.

2. The light-emitting element as described in 1, wherein the difference in ionization potential between the organic membrane and the host material in the light-emitting layer is 0.01 eV to 2 eV.

3. The light-emitting element as described in 1 or 2, wherein the ionization potential of the organic membrane is more than 5.7 eV and not more than 7.0 eV.

4. The light-emitting element as described in one of 1 to 3, wherein the organic membrane comprises at least one compound selected from among the compounds represented by the general formulae (V) to (XI):

general formula (V)

general formula (VI)

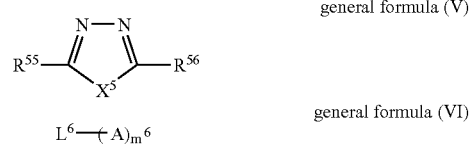

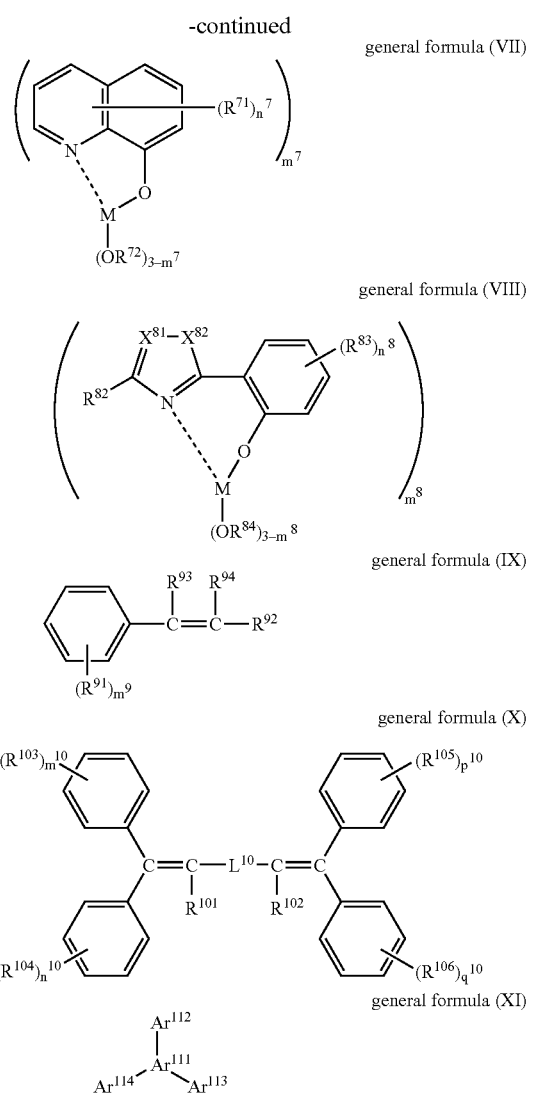

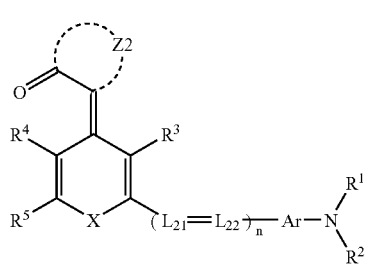

wherein, in the general formula (V), $R^{55}$ and $R^{56}$ may be the same or different from each other and each represents an alkyl group, an aryl group or a hetero ring group, $X^5$ represents an oxygen atom, a sulfur atom or N—$R^{Y5}$, and $R^{Y5}$ represents a hydrogen atom or a substituent and, in the general formula (VI), A represents a hetero ring group containing two or more hetero atoms, with the hetero ring groups represented by A being optionally the same or different from each other, $m^6$ represents an integer of 2 or more, and $L^6$ represents a linking group and, in the general formula (VII), $R^{71}$ represents a substituent, $R^{72}$ represents a hydrogen atom, an aliphatic group, an aryl group or an aromatic hetero ring group, M represents a metal atom, $n^7$ represents an integer of 0 to 6 and $m^7$ represents 2 or 3, with the proviso that, when $m^7=3$, then $n^7 \ne 0$ and, in the general formula (VIII), $X^{81}$ represents a nitrogen atom or C—$R^{81}$, $X^{82}$ represents an oxygen atom, a sulfur atom or N—$R^{Y8}$, $R^{81}$, $R^{82}$, $R^{83}$ and $R^{Y8}$ may be the same or different from each other and each represents a hydrogen atom or a substituent, with $R^{81}$ and $R^{82}$ being optionally connected to each other to form a ring, $R^{84}$ represents a hydrogen atom, an alkyl group, an aryl group or an aromatic hetero ring group, M represents a metal atom, $n^8$ represents an integer of 0 to 4, and $m^8$ represents 2 or 3 and, in the general formula (IX), $R^{91}$ represents a substituent, with a plurality of $R^{91}$s optionally being connected to each other to form a fused ring, $R^{92}$ to $R^{94}$ may be the same or different from each other and each represents a hydrogen atom or a substituent, and $m^9$ represents an integer of 0 to 5 and, in the general formula (X), $R^{101}$ and $R^{102}$ may be the same or different from each other and each represents a hydrogen atom or a substituent, $R^{103}$ to $R^{106}$ may be the same or different from each other and each represents a substituent, $L^{10}$ represents a linking group, and $m^{10}$, $n^{10}$, p10 and $q^{10}$ may be the same or different from each other and each represents an integer of 0 to 5 and, in the general formula (XI), $Ar^{111}$ represents a trivalent arylene group, $Ar^{112}$ to $Ar^{114}$ may be the same or different from each other and each represents an aryl group.

5. The light-emitting element as described in one of 1 to 4, wherein the compound represented by the general formula (I) is a compound represented by the following general formula (II):

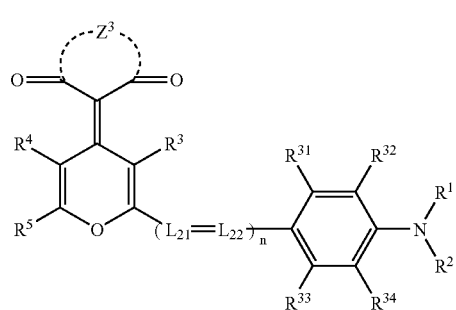

wherein $R^1$, $R^2$, $R^3$, $R^4$ and $R^5$ may be the same or different from each other and each represents a hydrogen atom or a substituent, X represents an oxygen atom, a sulfur atom or N—$R^{Y1}$, $R^{Y1}$ represents a hydrogen atom or a substituent, $Z^2$ represents atoms necessary for forming 5- or 6-membered ring, $L_{21}$ and $L_{22}$ may be the same or different from each other and each represents a methine group, a substituted methine group or a nitrogen atom, n represents an integer of 0 to 3, and Ar represents an arylene group or a divalent aromatic hetero ring group.

6. The light-emitting element as described in 6, wherein the compound represented by the general formula (II) is a compound represented by the following general formula (III):

(III)

wherein $R^1$, $R^2$, R3, $R^4$, $R^5$, $R^{31}$, $R^{32}$, $R^{33}$ and $R^{34}$ may be the same or different from each other and each represents a hydrogen atom or a substituent, $Z^3$ represents atoms necessary for forming 5- or 6-membered ring, $L_{21}$ and $L_{22}$ may be the same or different from each other and each represents a methine group, a substituted methine group or a nitrogen atom, and n represents an integer of 0 to 3.
7. The light-emitting element as described in 6, wherein the compound represented by the general formula (III) is a compound represented by the following general formula (IV):

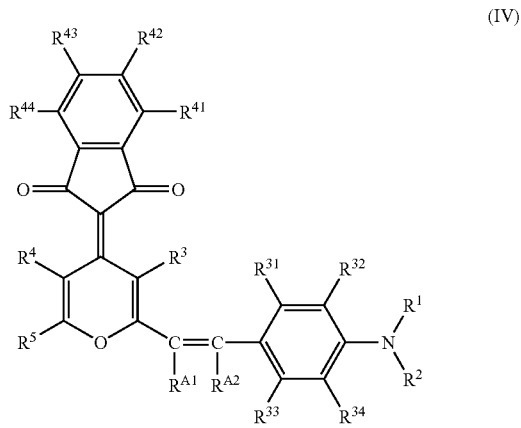

(IV)

wherein $R^1$, $R^2$, R3, $R^4$, $R^5$, $R^{31}$, $R^{32}$, $R^{33}$, $R^{34}$, $R^{41}$, $R^{42}$, $R^{43}$ and $R^{44}$ may be the same or different from each other and each represents a hydrogen atom or a substituent, and $R^{41}$ and $R^{42}$ may be the same or different from each other and each represents a hydrogen atom or a substituent and, when possible, $R^{41}$ and $R^{42}$ maybe connected to each other and further to other substituent to form a ring.
8. The light-emitting element as described in one of 1 to 7, wherein the host material is an aluminum quinoline derivative.
9. The light-emitting element as described in one of 1 to 8, wherein the content of the at least one compound selected from the compounds represented by the general formulae (I) to (IV) in the light-emitting layer is 0.01% by weight to 50% by weight.
10. The light-emitting element as described in one of 4 to 9, wherein the content of the at least one compound selected from the compounds represented by the general formulae (V) to (XI) in the organic membrane is 50% by weight to 100% by weight.

BEST MODE FOR CARRYING OUT THE INVENTION

The invention is described in detail below.
The light-emitting element of the invention is an element wherein a light-emitting layer or a plurality of organic compound layers including the light-emitting layer are formed between two electrodes of an anode and a cathode. It may have a hole injecting layer, a hole transporting layer, an electron injecting layer, an electron transporting layer and a protective layer in addition to the light-emitting layer. These layers may additionally exert functions of other layers.
First, the compounds of the invention represented by the general formula (I) are described below.
$R^1$, $R^2$, $R^3$, $R^4$ and $R^5$ may be the same or different from each other and each represents a hydrogen atom or a substituent.

Examples of the substituent represented by $R^1$ to $R^5$ include an alkyl group (containing preferably 1 to 20, more preferably 1 to 12, particularly preferably 1 to 8, carbon atoms, and being exemplified by methyl, ethyl, iso-propyl, tert-butyl, n-octyl, n-decyl, n-hexadecyl, cyclopropyl, cyclopentyl and cyclohexyl), an alkenyl group (containing preferably 2 to 20, more preferably 2 to 12, particularly 2 to 8, carbon atoms, and being exemplified by vinyl, allyl, 2-butenyl and 3-pentenyl), an alkynyl group (containing preferably 2 to 20, more preferably 2 to 12, particularly preferably 2 to 8, carbon atoms, and being exemplified by propargyl and 3-pentynyl), an aryl group (containing preferably 6 to 30, more preferably 6 to 20, particularly preferably 6 to 12, carbon atoms, and being exemplified by phenyl, p-methylphenyl, naphthyl, anthryl, phenanthryl and pyrenyl), an amino group (containing preferably 0 to 20, more preferably 0 to 12, particularly preferably 0 to 6, carbon atoms, and being exemplified by amino, methylamino, dimethylamino, diethylamino, diphenylamino and dibenzylamino), an alkoxy group (containing preferably 1 to 20, more preferably 1 to 12, particularly preferably 1 to 8, carbon atoms, and being exemplified by methoxy, ethoxy and butoxy), an aryloxy group (containing preferably 6 to 20, more preferably 6 to 16, particularly preferably 6 to 12, carbon atoms, and being exemplified by phenyloxy and 2-napthyloxy), a hetero ring oxy group (containing preferably 2 to 20, more preferably 3 to 16, particularly preferably 4 to 12, carbon atoms, and being exemplified by pyridinoxy pyrimidinoxy, pyridazinoxy and benzimidazolyloxy), a silyloxy group (containing preferably 3 to 40, more preferably 3 to 30, particularly preferably 3 to 20, carbon atoms, and being exemplified by trimethylsilyloxy and t-butyldimethyloxy), an acyl group (containing preferably 1 to 20, more preferably 1 to 16, particularly preferably 1 to 12, carbon atoms, and being exemplified by acetyl, benzoyl, formyl and pivaloyl), an alkoxycarbonyl group (containing preferably 2 to 20, more preferably 2 to 16, particularly preferably 2 to 12, carbon atoms, and being exemplified by methoxycarbonyl and ethoxycarbonyl), an aryloxycarbonyl group (containing preferably 7 to 20, more preferably 7 to 16, particularly preferably 7 to 10, carbon atoms, and being exemplified by phenyloxycarbonyl), an acyloxy group (containing preferably 2 to 20, more preferably 2 to 16, particularly preferably 2 to 10, carbon atoms, and being exemplified by acetoxy and benxoyloxy), an acylamino group (containing preferably 2 to 20, more preferably 2 to 16, particularly preferably 2 to 10, carbon atoms, and being exemplified by acetylamino and benzoylamino), an alkoxycarbonylamino group (containing preferably2 to 20, more preferably 2 to 16, particularly preferably 2 to 12, carbon atoms, and being exemplified by methoxycarbonylamino), an aryloxycarbonylamino group (containing preferably 7 to 20, more preferably 7 to 16, particularly preferably 7 to 12, carbon atoms, and being exemplified by phenyloxycarbonylamino), a sulfonylamino group (containing preferably 1 to 20, more preferably 1 to 16, particularly preferably 1 to 12, carbon atoms, and being exemplified by methanesulfonylamino and benzenesulfonylamino), a sulfamoyl group (containing preferably 0 to 20, more preferably 0 to 16, particularly preferably 0 to 12, carbon atoms, and being exemplified by sulfamoyl, methylsulfamoyl, dimethylsulfamoyl and phenylsulfamoyl), a carbamoyl group (containing preferably 1 to 20, more preferably 1 to 16, particularly preferably 1 to 12, carbon atoms, and being exemplified by carbamoyl, methylcarbamoyl, diethylcarbamoyl and phenylcarbamoyl), an alkylthio group (containing preferably 1 to 20, more preferably 1 to 16, particularly preferably 1 to 12, carbon atoms, and being exemplified by methylthio and ethylthio), an arylthio group (containing preferably 6 to 20, more preferably 6 to 16, particularly preferably 6 to 12, carbon atoms, and being exemplified by phenylthio), a hetero ring thio group (containing preferably 6 to 20, more preferably 6 to 16, particularly preferably 6 to 12, carbon atoms, and being exemplified by pyridinothio, pyrimidinothio, pyridazinothio, benzimidazolylthio and thiadiazolylthio), a sulfonyl group (containing preferably 1 to 20, more preferably 1 to 16, particularly preferably 1 to 12, carbon atoms, and being exemplified by mesyl and tosyl), a sulfinyl group (containing preferably 1 to 20, more preferably 1 to 16, particularly preferably 1 to 12, carbon atoms, and being exemplified by methanesulfinyl and benzenesulfinyl), an ureido group (containing preferably 1 to 20, more preferably 1 to 16, particularly preferably 1 to 12, carbon atoms, and being exemplified by ureido, methylureido and phenylureido), a phosphoric acid amido group diethylphosphoric acid amido and phenylphosphoric acid amido), a hydroxyl group, a mercapto group, a halogen atom (such as a fluorine atom, a chlorine atom, a bromine atom or an iodine atom), a cyano group, a sulfo group, a carboxyl group, a nitro group, a hydroxamic acid group, a sulfino group, a hydrazine group, an imino group, a hetero ring group (containing preferably 1 to 30, more preferably 1 to 12, carbon atoms and a hetero atom or atoms such as a nitrogen atom, an oxygen atom and a sulfur atom , and being exemplified by imidazolyl, pyridyl, quinolyl, furyl, thienyl, piperidyl, morpholino, benzoxazolyl, benzimidazolyl, benzothiazolyl, carbazolyl and azepinyl), and a silyl group (containing preferably 3 to 40, more preferably 3 to 30, particularly preferably 3 to 24, carbon atoms, and being exemplified by trimethylsilyl and triphenylsilyl). These substituents may further be substituted. Also, in the case where two or more substituents exist, they may be the same or different from each other. Also, where possible, they may be connected to each other to form a ring.

$R^1$ and $R^2$ each preferably represents a hydrogen atom, an aliphatic hydrocarbyl group, an aryl group, a hetero ring group or, when connected to L through an alkylene group, forms a 5- or 6-membered ring or, when taken together, $R^1$ and $R^2$ preferably form a 5- to 7-membered ring. More preferably, $R^1$ and $R^2$ each represents a hydrogen atom, an alkyl group, an aryl group or, when connected to L through an alkylene group, forms a 5- or 6-membered ring or, when taken together, $R^1$ and $R^2$ form a 5- to 7-membered ring. Particularly preferably, $R^1$ and $R^2$ each represents a methyl group, an ethyl group or, when connected to L through an alkylene group, forms a 5- or 6-membered ring or, when taken together, $R^1$ and $R^2$ form a 5- to 7-membered ring.

$R^3$ preferably represents a hydrogen atom, an aslkyl group, an aryl group, a halogen atom or a cyano group, more preferably, a hydrogen atom or an alkyl group, still more preferably a hydrogen atom.

$R^4$ preferably represents a hydrogen atom, an alkyl group, an aryl group, an aromatic hetero ring group or, when connected to $R^5$, forms a ring. More preferably, $R^4$ represents a hydrogen atom or an alkyl group, still more preferably a hydrogen atom.

$R^5$ preferably represents a hydrogen atom, an alkyl group, an aryl group, an aromatic hetero ring group or, when connected to $R^4$, forms a ring. More preferably, $R^5$ represents an alkyl group (preferably an alkyl group containing 2 to 20 carbon atoms, more preferably a branched or cyclic alkyl group containing 3 to 20 carbon atoms, still more preferably a branched or cyclic alkyl group containing 4 to 12 carbon atoms and containing a tertiary carbon atom, particularly preferably a tert-butyl group) or aryl group (preferably an aryl group having a substituent at an o-position, more preferably an alkyl-substituted phenyl group containing up to 30 carbon atoms and having a substituent at an o-position, still more preferably, a substituted 2,6-dimethyl phenyl group, particularly preferably a 2,4,6-trimethylphenyl group), particularly preferably a tert-butyl group, 2,4,6-trimethylphenyl group, most preferably a tert-butyl group.

X represents an oxygen atom, a sulfur atom or $N-R^{Y1}$, $R^{Y1}$ represents a hydrogen atom or a substituent. Examples of the substituent represented by $R^{Y1}$ include an alkyl group (containing preferably 1 to 20 carbon atoms, more preferably 1 to 12 carbon atoms, particularly preferably 1 to 8 carbon atoms and being exemplified by methyl, ethyl, iso-propyl, tert-butyl, n-octyl, n-decyl, n-hexadecyl, cyclopropyl, cyclopentyl and cyclohexyl), an alkenyl group (containing preferably 2 to 20, more preferably 2 to 12, particularly 2 to 8, carbon atoms, and being exemplified by vinyl, allyl, 2-butenyl and 3-pentenyl), an alkynyl group (containing preferably 2 to 20, more preferably 2 to 12, particularly preferably 2 to 8, carbon atoms, and being exemplified by propargyl and 3-pentynyl), an aryl group (containing preferably 6 to 30, more preferably 6 to 20, particularly preferably 6 to 12, carbon atoms, and being exemplified by phenyl, p-methylphenyl and naphthyl), an acyl group (containing preferably 1 to 20, more preferably 1 to 16, particularly preferably 1 to 12, carbon atoms, and being exemplified by acetyl, benzoyl, formyl and pivaloyl), an alkoxycarbonyl group (containing preferably 2 to 20, more preferably 2 to 16, particularly preferably 2 to 12, carbon atoms, and being exemplified by methoxycarbonyl and ethoxycarbonyl), an aryloxycarbonyl group (containing preferably 7 to 20, more preferably 7 to 16, particularly preferably 7 to 10, carbon atoms, and being exemplified by phenyloxycarbonyl), a sulfamoyl group (containing preferably 0 to 20, more preferably 0 to 16, particularly preferably 0 to 12, carbon atoms, and being exemplified by sulfamoyl, methylsulfamoyl, dimethylsulfamoyl and phenylsulfamoyl), a carbamoyl group (containing preferably 1 to 20, more preferably 1 to 16, particularly preferably 1 to 12, carbon atoms, and being exemplified by carbamoyl, methylcarbamoyl, diethylcarbamoyl and phenylcarbamoyl), a sulfonyl group (containing preferably 1 to 20, more preferably 1 to 16, particularly preferably 1 to 12, carbon atoms, and being exemplified by mesyl and tosyl), a sulfinyl group (containing preferably 1 to 20, more preferably 1 to 16, particularly preferably 1 to 12, carbon atoms, and being exemplified by methanesulfinyl and benzenesulfinyl), and a hetero ring group (containing preferably 1 to 20, more preferably 1 to 12, carbon atoms and a hetero atom or atoms such as a nitrogen atom, an oxygen atom and a sulfur atom, and being exemplified by imidazolyl, pyridyl, furyl, morpholino, benzoxazolyl, benzimidazolyl and benzothiazolyl). These substituents may further be substituted. Also, in the case where two or more substituents exist, they may be the same or different from each other. Also, where possible, they may be connected to each other to form a ring.

The substituent represented by $R^{Y1}$ is preferably an alkyl group, an alkenyl group, an alkynyl group, an aryl group or a hetero ring group, more preferably an alkyl group, an aryl group or an aromatic hetero ring group, and still more preferably an alkyl group or an aryl group.

X preferably represents an oxygen atom or $N-R^{Y1}$, more preferably an oxygen atom.

L represents a linking group of a conjugated bond. L is preferably a conjugated bond type linking group formed by C, N, O, S, Se, Te, Si, Ge, etc., more preferably alkenylene, alkynylene, arylene, a divalent aromatic hetero ring (preferably an aromatic hetero ring formed by an azine ring, an azole ring, a thiophene ring or a furan ring) or a group comprising a combination of N and one or more of these, still more preferably alkenylene, arylene, a divalent aromatic hetero ring or a group comprising N and one or more of these, particularly preferably a group comprising a combination of alkenylene and arylene containing 6 to 30 carbon atoms or a divalent aromatic hetero ring containing 2 to 30 carbon atoms, most preferably a group comprising a combination of alkenylene and arylene containing 6 to 30 carbon atoms.

Specific examples of the linking group represented by L include the following:

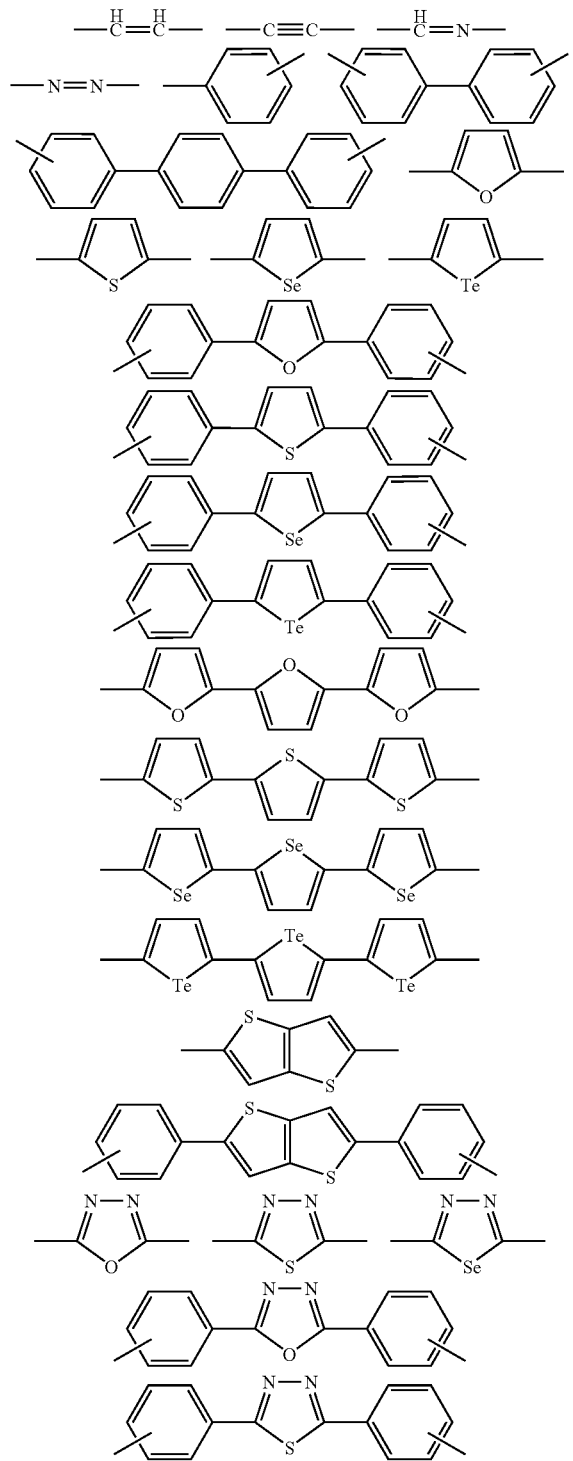

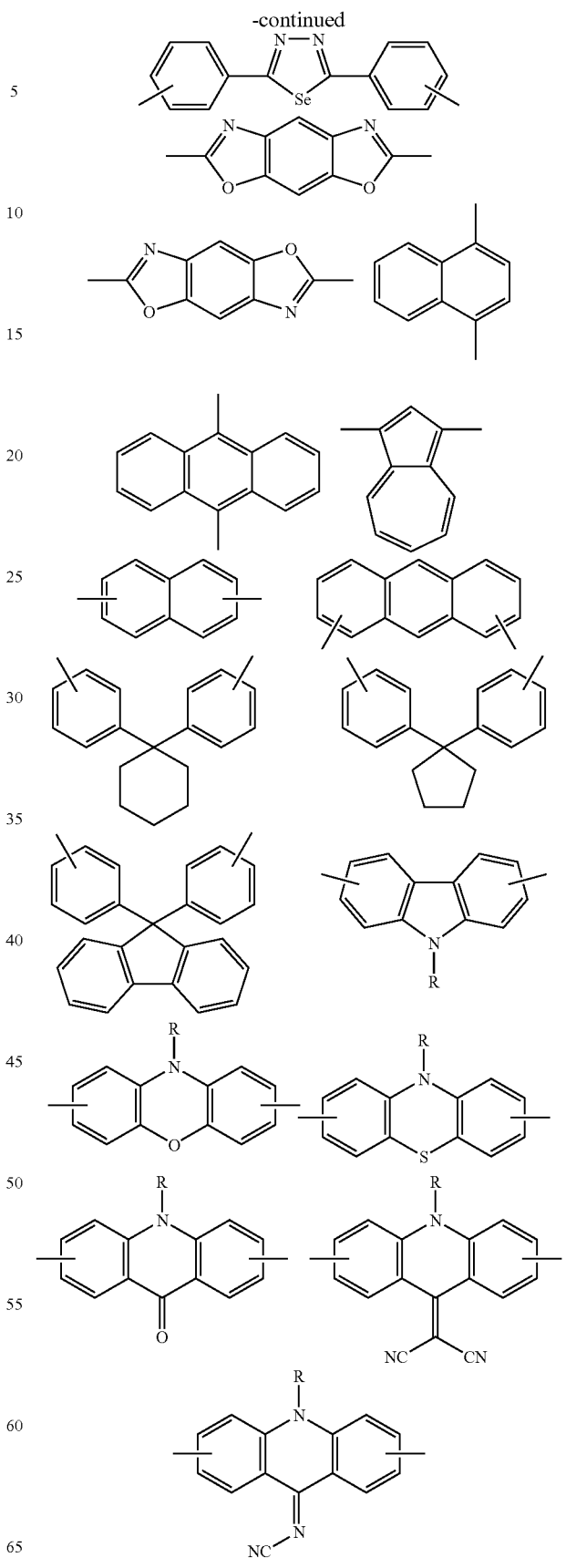

R represents a hydrogen atom, an aliphatic hydrocarbyl group, an aryl group or a hetero ring group.

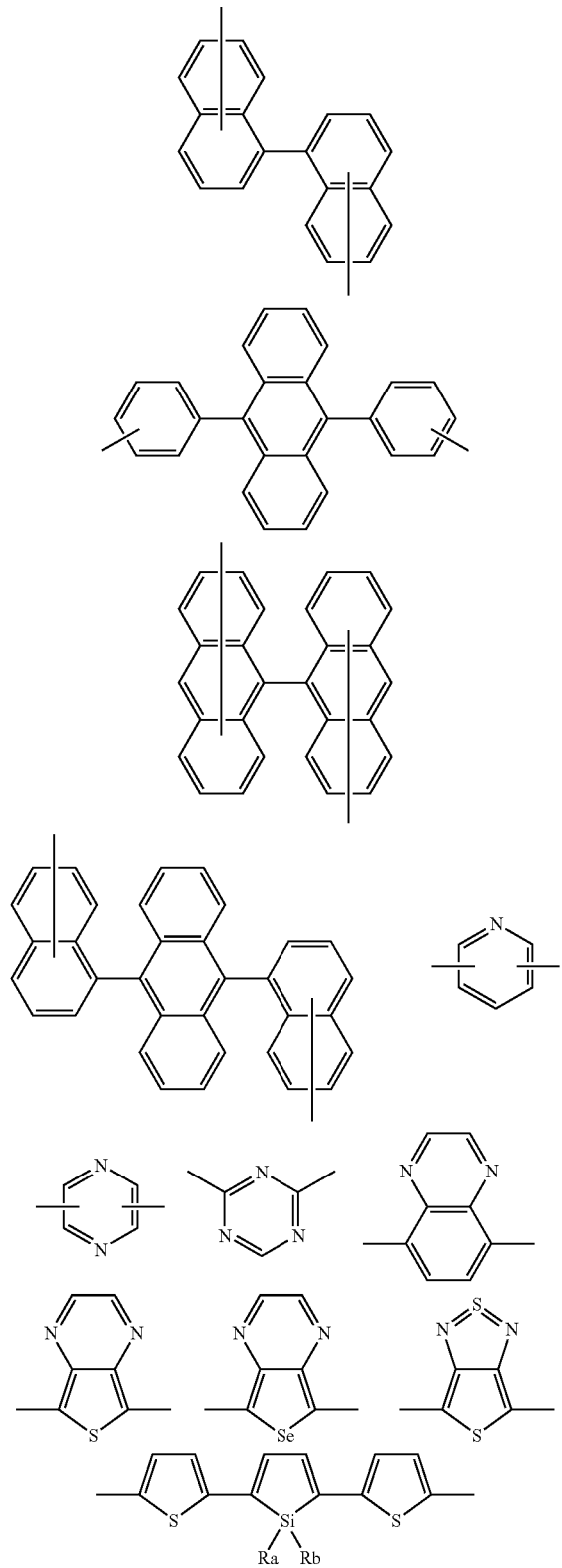

Ra and Rb each represents an aliphatic hydrocarbyl group, an aryl group or a hetero ring group.

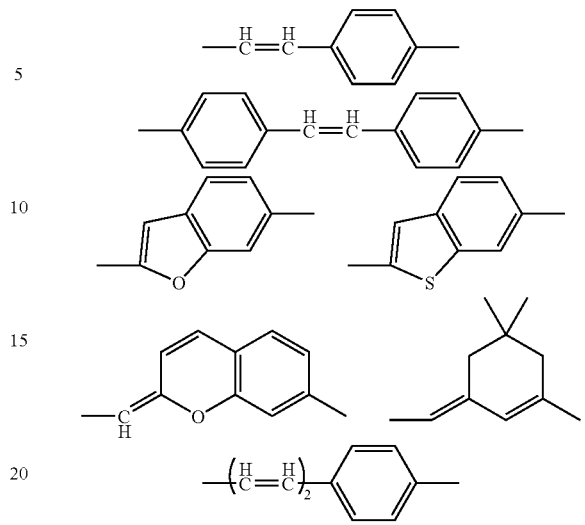

The linking group represented by L may have a substituent and, as the substituent, there may be used, for example, those illustrated as substituents represented by $R^1$ to $R^5$. Preferred examples of the substituent represented by L include an alkyl group, an alkenyl group, an alkynyl group, an aryl group, an alkoxy group, an aryloxy group, an acyl group, a halogen atom, a cyano group, a hetero ring group and a silyl group, more preferred examples thereof include an alkyl group, an alkenyl group, an alkynyl group, an aryl group, an alkoxy group, an aryloxy group, a halogen atom, a cyano group and an aromatic hetero ring group, and more preferred examples thereof include an alkyl group, an aryl group, an alkoxy group, an aryloxy group and an aromatic hetero ring group.

$R^X$ and $R^Y$ may be the same or different from each other and each represents a hydrogen atom or a substituent, with at least one of them representing an electron-withdrawing group. Also, $R^X$ and $R^Y$ may be connected to each other to form a ring.

As the substituents represented by $R^X$ and $R^Y$, there may be used, for example, those which have been illustrated as substituents of $R^1$ to $R^5$. Each of the substituents represented by $R^X$ and $R^Y$ is preferably an alkyl group, an alkenyl group, an aryl group, an alkoxy group, an aryloxy group, a carbonyl group, a thiocarbonyl group, an oxycarbonyl group, an acylamino group, a carbamoyl group, a sulfonylamino group, a sulfamoyl group, a sulfonyl group, a sulfinyl group, a phosphoryl group, an imino group, a cyano group, a halogen atom, a silyl group or an aromatic hetero ring group. More preferably, they are electron-withdrawing groups of 0.2 or more in Hammett's σ value. Still more preferably, each of them is an aryl group, an aromatic hetero ring group, a cyano group, a carbonyl group, a thiocarbonyl group, an oxycarbonyl group, a carbamoyl group, a sulfamoyl group, a sulfonyl group, an imino group, a halogen atom or, when taken together, they form a ring of an electron-withdrawing group. Particularly preferably, each of them is an aromatic hetero ring group, a carbonyl group, a cyano group, an imino group or, when taken together, they form a ring of an electron-withdrawing group. Most preferably, each of them is a cyano group or, when taken together, they form a ring of an electron-withdrawing group. Above all, RX and RY are connected to each other to form a ring of an electron-withdrawing group.

As a ring formed by $R^X$ and $R^Y$ connected to each other together with the carbon atom to which they are bound, those which are usually used as acid nuclei in merocyanine dyes are preferred. Specific examples thereof are illustrated below.

(a) 1,3-dicarbonyl nucleus: for example, 1,3-indanedione, 1,3-cyclohexanedione, 5,5-dimethyl-1,3-cyclohexanedione and 1,3-dioxane-4,6-dione (b) pyrazoline nucleus: for example, 1-phenyl-2-pyrazolin-5-one, 3-methyl-1-phenyl-2-pyrazolin-5-one and 1-(2-benzothiazolyl)-3-methyl-2-pyrazolin-5-one (c) isoxazolinone nucleus: for example, 3-phenyl-2-isoxazolin-5-one and 3-methyl-2-isoxazolin-5-one (d) hydroxyindole nuclei: for example, 1-alkyl-2,3-dihydro-2-hydroxyindole (e) 2,4,6-triketohexahydropyrimidine nucleus: for example, barbituric acid or 2-thiobarbituric acid and the derivatives thereof Examples of the derivatives include 1-alkyl derivatives thereof such as 1-methyl and 1-ethyl derivatives thereof, 1,3-dialkyl derivatives thereof such as 1,3-dimethyl, 1,3-diethyl and 1,3-dibutyl derivatives thereof, 1,3-diaryl derivatives thereof such as 1,3-diphenyl, 1,3-di(p-chlorophenyl) and 1,3-di(p-ethoxycarbonylphenyl) derivatives thereof, 1-alkyl-3-aryl derivatives thereof such as 1-ethyl-3-phenyl derivative thereof, and 1,3-di-hetero ring substituted derivatives thereof such as 1,3-di(2-pyridyl) derivative thereof.

(f) 2-thio-2,4-thiazolidinedione nucleus: for example, rhodanine and the derivatives thereof Examples of the derivatives include 3-alkylrhodanines such as 3-methylrhodanine, 3-ethylrhodanine and 3-allylrhodanine, 3-arylrhodanines such as 3-phenylrhodanine, and 3-hetero ring-substituted rhodanines such as 3-(2-pyridyl) rhodanine.

(g) 2-thio-2,4-oxazolidinedione (2-thio-2,4-(3H,5H)-oxazoledione) nucleus: for example, 3-ethyl-2-thio-2,4-oxazolinedione (h) thianaphthene nucleus: for example, 3(2H)-thianaphthenone-1,1-dioxide (i) 2-thio-2,5-thiazolidinedione nucleus: for example, 3-ethyl-2-thio-2,5-thiazolidinedione (j) 2,4-thiazolidinedione nucleus: for example, 2,4-thiazolidinedione, 3-ethyl-2,4-thiazolidinedione and 3-phenyl-2,4-thiazolidinedione (k) thiazolin-4-one nucleus: for example, 4-thiazolinone and 2-ethyl-4-thiazolinone (l) 4-thiazolidinone nucleus: for example, 2-ethylmercapto-5-thiazolin-4-one and 2-alkylphenylamino-5-thiazolin-4-one (m) 2,4-imidazolidinedione (hydantoin) nucleus: for example, 2,4-imidazolidinedione and 3-ethyl-2,4-imidazolidinedione (n) 2-thio-2,4-imidazolidinedione (2-thiohydantoin) nucleus: for example, 2-thio-2,4-imidazolidinedione and 3-ethyl-2-thio-2,4-imidazolidinedione (o) imidazolin-5-one nucleus: for example, 2-propylmercapto-2-imidazolin-5-one (p) 3,5-pyrazolidinedione nucleus: for example, 1,2-diphenyl-3,5-pyrazolidinedione and 1,2-dimethyl-3,5-pyrazolidinedione The ring formed by $R^X$, $R^Y$ and the carbon atom to which they are bound is preferably a 1,3-dicarbonyl nucleus, a pyrazolinone nucleus, a 2,4,6-triketohexahydropyrimidine nucleus (including thioketone body), a 2-thio-2,4-thiazolidinedione nucleus, a 2-thio-2,4-oxazolidinedione nucleus, a 2-thio-2,5-thiazolidinedione nucleus, a 2,4-imidazolidinedione nucleus, a 2-thio-2,4-imidazolidinedione nucleus, a 2-imidazolin-5-one nucleus or a 3,5-pyrazolidinedione nucleus, more preferably a 1,3-dicarbonyl nucleus, a 2,4,6-triketohexahydropyrimidine nucleus (including thioketone thereof) or a 3,5-pyrazolidinedione nucleus, particularly preferably a 1,3-dicarbonyl nucleus or a 2,4,6-triketohexahydropyrimidine nucleus (including thioketone body), most preferably a 1,3-indanedione nucleus.

Of the compounds represented by the general formula (I), those represented by the general formula (II) are preferred.

In the formula, $R^1$, $R^2$, $R^3$, $R^4$, $R^5$ and X each is the same as defined with respect to the general formula (I), with preferred scopes thereof also being the same. $Z^2$ represents atoms necessary for forming a 5- or 6-membered ring.

Preferred examples of the ring formed by $Z^2$ include a 1,3-dicarbonyl nucleus, a pyrazolinone nucleus, a 2,4,6-triketohexahydropyrimidine nucleus (including thioketone body), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus and a 1,3-pyrazolidinedione nucleus, more preferred examples thereof include a 1,3-dicarbonyl nucleus and a 2,4,6-triketohexahydropyrimidine nucleus (including thioketone body), still more preferred examples thereof include a 1,3-dicarbonyl nucleus, a barbituric acid derivative and a 2-thiobarbituric acid derivative, and particularly preferred example is a 1,3-dicaqrbonyl nucleus (preferably a 1,3-indanedione nucleus).

The ring formed by $Z^2$ may have a substituent and, as such substituent, there may be used, for example, those illustrated as substituents for $R^1$ and $R^2$.

$L_{21}$ and $L_{22}$, which may be the same or different from each other, each represents a methine group, a substituted methine group or a nitrogen atom, or $L_{21}$s, or $L_{22}$s, may be connected to each other, or $L_{21}$ and $L_{22}$ are connected to each other, via the substituent of the substituted methine group to form a 4- to 6-membered ring. Further, where possible, $L_{21}$ or $L_{22}$ may be connected to Ar or $R^3$ to form a ring.

As the substituent for the substituted methine group, there may be used, for example, those which are illustrated as substituents represented by $R^1$ to $R^5$. Preferred examples thereof include an alkyl group, an aryl group, an aralkyl group, an alkoxy group, an aryloxy group, an alkylthio group, an arylthio group, a cyano group and a halogen atom, and more preferred examples thereof include an alkyl group and an alkoxy group, with a lower alkyl group (containing preferably 1 to 4 carbon atoms) being still more preferred.

$L_{21}$ and $L_{22}$ are preferably a non-substituted methine group, an alkyl-substituted methine group or an alkoxy-substituted methine group, more preferably a non-substituted methine group, or $L_{22}$ is connected to Ar via the substituent to forms a 5- or 6-membered ring, still more preferably a non-substituted methine group.

n represents an integer of 0 to 3, preferably 0, 1 or 2, more preferably 0 or 1, still more preferably 1.

Ar represents an arylene group or a divalent aromatic hetero ring group. The aryelne group or the divalent aromatic hetero ring group represented by Ar may have a substituent and, as examples of the substituent, there may be illustrated, for example, those referred to as substituents of $R^1$ to $R^5$. Preferred examples of the substituent for Ar include an alkyl group, an alkenyl group, an alkynyl group, an aryl group, an alkoxy group, an aryloxy group, an acyl group, a halogen atom, a cyano group, a hetero ring group and a silyl group, more preferred examples thereof include an alkyl group, an alkenyl group, an alkynyl group, an aryl group, an alkoxy group, an aryloxy group, a halogen atom, a cyano group and an aromatic hetero ring group, more preferred examples thereof include an alkyl group, an aryl group, an alkoxy group and an aromatic hetero ring group, and particularly preferred examples thereof include an alkyl group containing 1 to 6 carbon atoms and an alkoxy group containing 1 to 6 carbon atoms.

Of the compounds represented by the general formula (II), those represented by the general formula (III) are more preferred.

In the formula, $R^1$, $R^2$, $R^3$, $R^4$ and $R^5$ are respectively the same as those defined with respect to the general formula (I), with preferred scopes thereof also being the same. $L_{21}$, $L_{22}$ and n are respectively the same as those defined with respect to the general formula (II), with preferred scopes thereof also being the same. $R^{31}$, $R^{32}$, $R^{33}$ and $R^{34}$ each represents a hydrogen atom or a substituent. As the substituent represented by $R^{31}$ to $R^{34}$, there may be used, for example, those which are illustrated as substituents of $R^1$ to $R^5$ in the general formula (I). $Z^3$ represents atoms necessary for forming a 5- or 6-membered ring. As the ring formed by $Z^3$, there are illustrated, from among the examples of the ring formed by $Z^2$ in the general formula (II), those which have a 1,3-dicarbonyl structure within the ring. Examples thereof include 1,3-cyclopentanedione, 1,3-cyclohexanedione, 1,3-indanedione and 3,5-pyrazolidinedione, preferred examples thereof include 1,3-indanedione and 3,5-pyrazolidinedione, more preferred examples thereof include 1,3-indanedione and 1,2-diaryl-3,5-pyrazolidinedione, and still more preferred examples thereof include 1,3-indanedione and 1,2-diphenyl-3,5-pyrazolidinedione, with 1,3-indanedione being particularly preferred.

The ring formed by $Z^3$ may have a substituent and, as such substituent, there may be used, for example, those illustrated as substituents for $R^1$ to $R^5$.

Of the compounds represented by the general formula (III), those represented by the general formula (IV) are more preferred.

In the formula, $R^1$, $R^2$, $R^3$, $R^4$, $R^5$ and $R^6$ are respectively the same as those defined with respect to the general formula (I), with preferred scopes thereof also being the same. $R^{31}$, $R^{32}$, $R^{33}$ and $R^{34}$ are respectively the same as those defined with respect to the general formula (III), with preferred scopes thereof also being the same. $R^{41}$, $R^{42}$, $R^{43}$ and $R^{44}$ each represents a hydrogen atom or a substituent. As the substituent represented by $R^{41}$, $R^{42}$, $R^{43}$ and $R^{44}$ there may be applied, for example, those which are illustrated as substituents of $R^1$ to $R^5$ in the general formula (I). Also, where possible, $R^{41}$, $R^{42}$, $R^{43}$ and $R^{44}$ may be connected to each other to form a ring. Preferred examples of $R^{41}$ to $R^{44}$ include a hydrogen atom, an alkyl group (containing preferably 1 to 20 carbon atoms, more preferably 1 to 12 carbon atoms, still more preferably 1 to 8 carbon atoms), an aryl group (containing preferably 6 to 30 carbon atoms, more preferably 6 to 20 carbon atoms, still more preferably 6 to 12 carbon atoms), a hetero ring group (containing preferably 2 to 30 carbon atoms, more preferably 2 to 20 carbon atoms, still more preferably 2 to 12 carbon atoms), a halogen atom, a cyano group, an alkoxy group (containing preferably 1 to 20 carbon atoms, more preferably 1 to 12 carbon atoms, still more preferably 1 to 8 carbon atoms), an aryloxy group (containing preferably 6 to 30 carbon atoms, more preferably 6 to 20 carbon atoms, still more preferably 6 to 12 carbon atoms), an alkoxycarbonyl group (containing preferably 1 to 20 carbon atoms, more preferably 1 to 12 carbon atoms, still more preferably 1 to 8 carbon atoms), an aryloxycarbonyl group (containing preferably 6 to 30 carbon atoms, more preferably 6 to 20 carbon atoms, still more preferably 6 to 12 carbon atoms), and a benzene ring or an aromatic azole ring formed by $R^{42}$ and $R^{43}$ connected to each other. More preferred examples thereof include a hydrogen atom, an alkyl group, an aryl group, a hetero ring group, a halogen atom, a cyano group, and a benzene ring formed by $R^{42}$ and $R^{43}$ connected to each other, with a hydrogen atom being particularly preferred.

$R^{A1}$ and $R^{A2}$ each represents a hydrogen atom or a substituent or, where possible, $R^{A1}$ and $R^{A2}$ are connected to each other or to other substituent to form a ring. As the substituent represented by $R^{A1}$ and $R^{A2}$, there may be applied, for example, those which are illustrated as substituents of $R^1$ to $R^5$ in the general formula (I). Preferred examples of $R^{A1}$ and $R^{A2}$ include a hydrogen atom, an alkyl group, an aryl group, an aralkyl group, an alkoxy group, an aryloxy group, an alkylthio group, an arylthio group, a cyano group and a halogen atom, and more preferred examples thereof include an alkyl group and an alkoxy group, with a lower alkyl group (containing preferably 1 to 4 carbon atoms) being still more preferred.

Also, the compounds represented by the general formula (I) may be low molecular weight compounds, high molecular weight compounds (having a weight-average molecular weight of preferably 1000 to 5000000, more preferably 5000 to 2000000, still more preferably 10000 to 1000000) wherein the residue is connected to the main chain of the polymer, or high molecular weight compounds (having a weight-average molecular weight of preferably 1000 to 5000000, more preferably 5000 to 2000000, still more preferably 10000 to 1000000) which have the compound represented by the general formula (I) in the main chain thereof. The high molecular weight compounds may be homopolymers or copolymers with other polymer. The copolymers may be random copolymers or block copolymers. As the compounds to be used in the invention, low molecular weight compounds are preferred.

Also, the compounds represented by the general formula (I) may be contained in a state of forming a metal chelate.

Specific examples of the compounds of the invention represented by the general formula (I), there may be illustrated, for example, those which are described in JP-A11-292875, JP-A-11-335661, JP-A-11-335368, Japanese Patent Application No. H11-161130, Japanese Patent Application No. H11-264380 and Japanese Patent Application No. 2001-16980. More preferred specific examples are illustrated below which, however, do not limit the invention in any way.

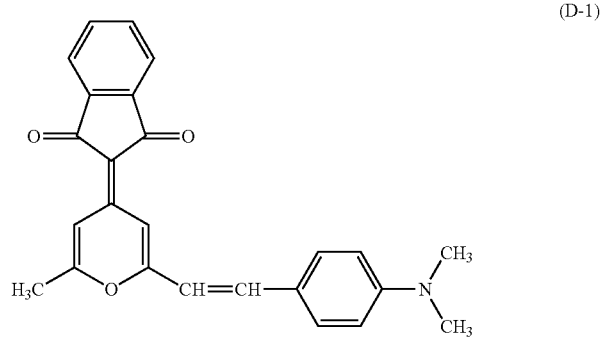

(D-1)

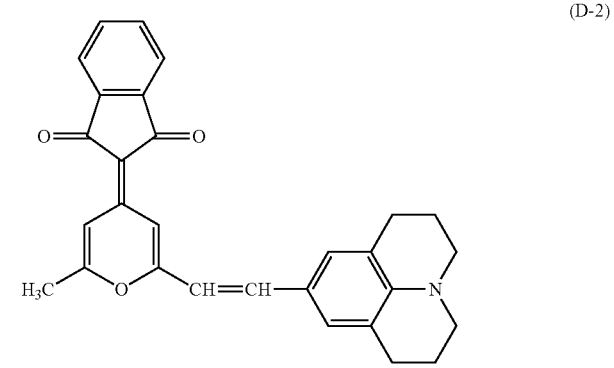

(D-2)

-continued
(D-3)
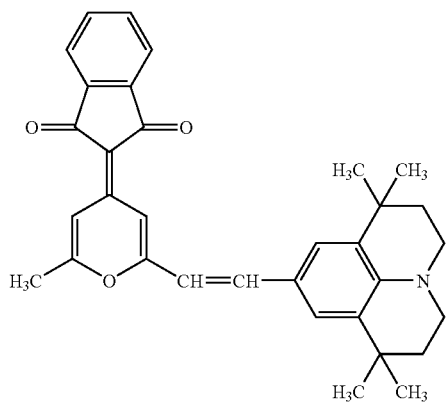
(D-4)
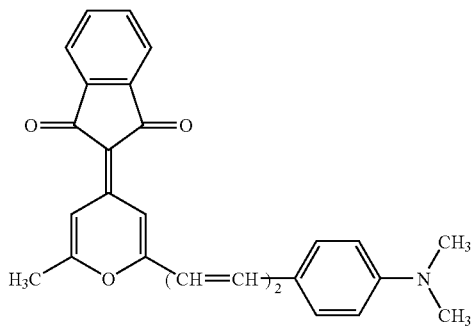
(D-5)
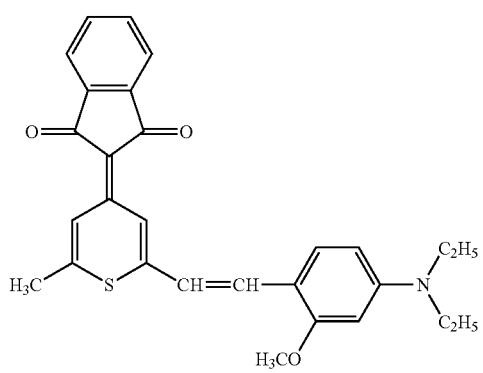
(D-6)
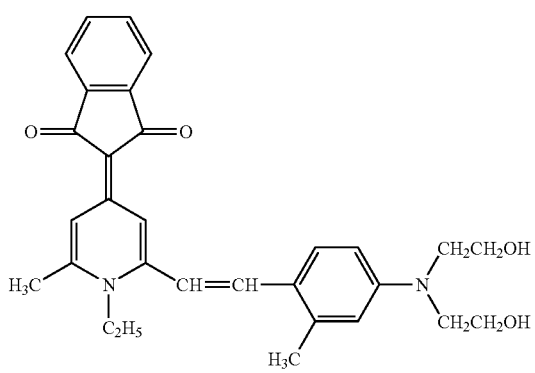
(D-7)
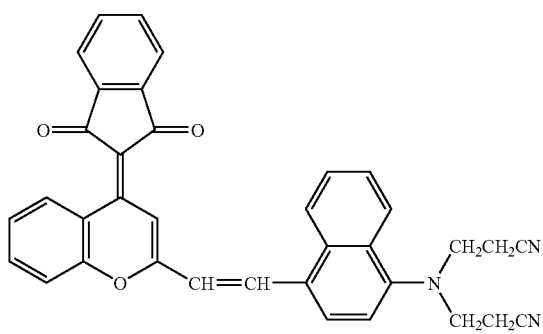
(D-8)
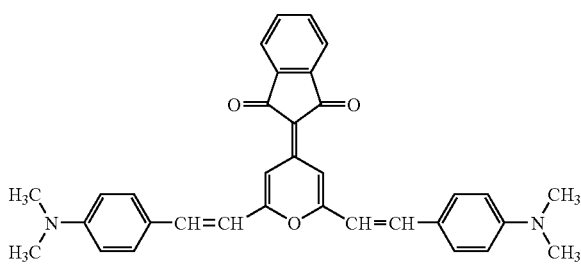
(D-9)
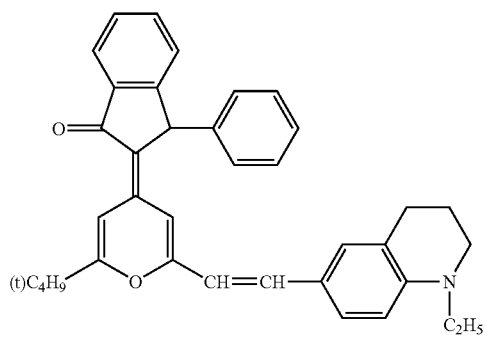
(D-10)
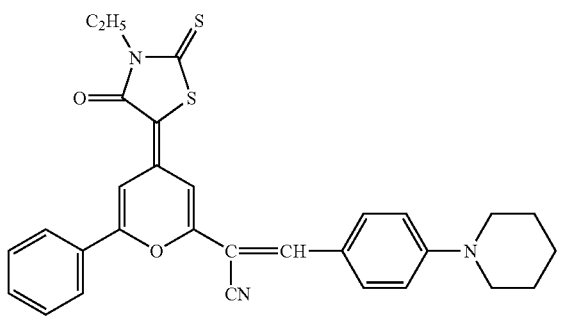

-continued
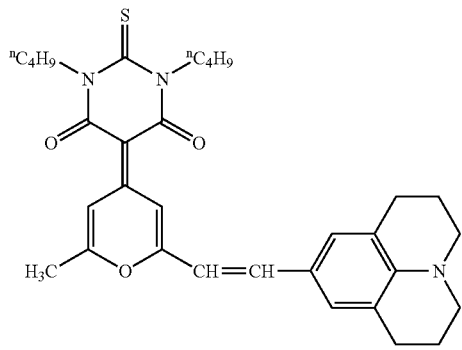
(D-11)
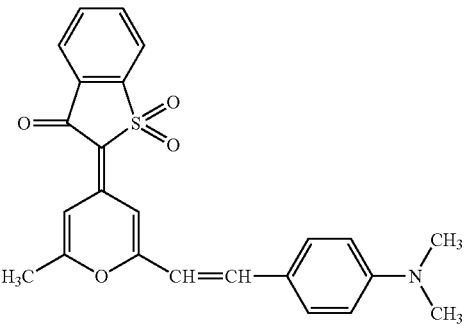
(D-12)
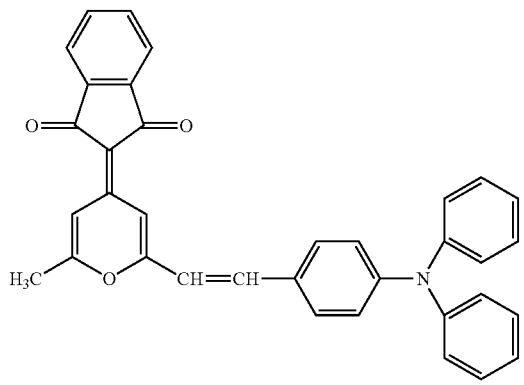
(D-13)
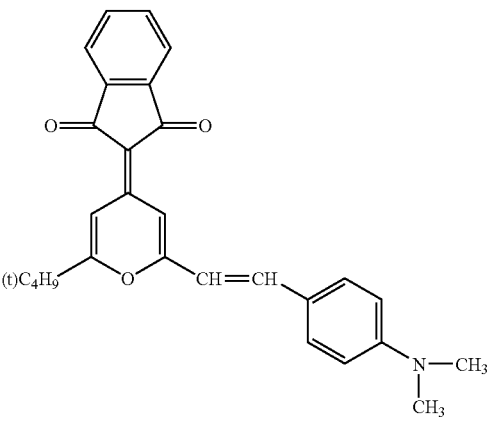
(D-14)
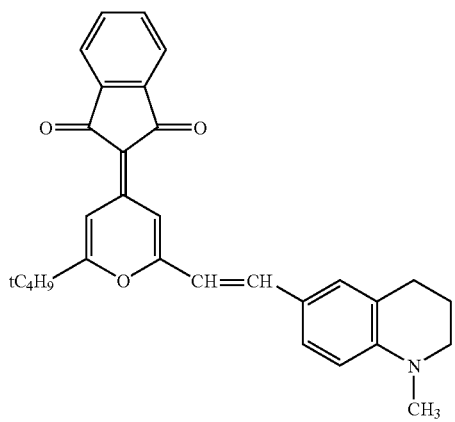
(D-15)
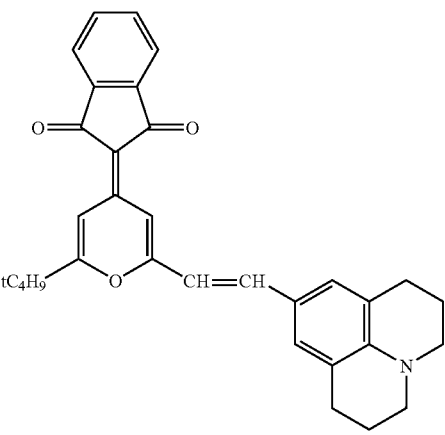
(D-16)
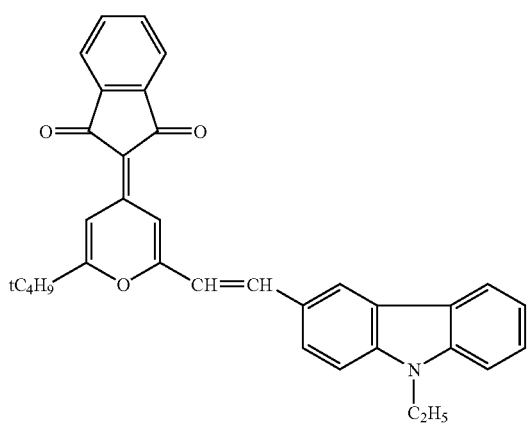
(D-17)
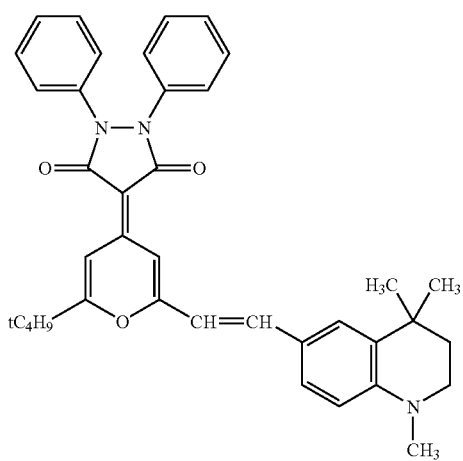
(D-18)

-continued
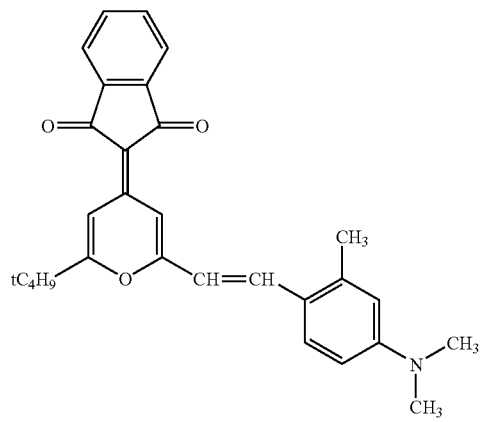
(D-19)
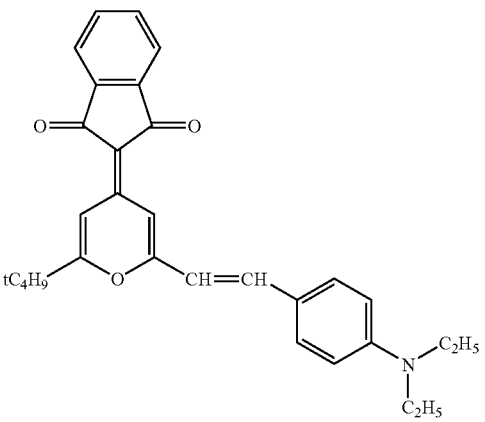
(D-20)
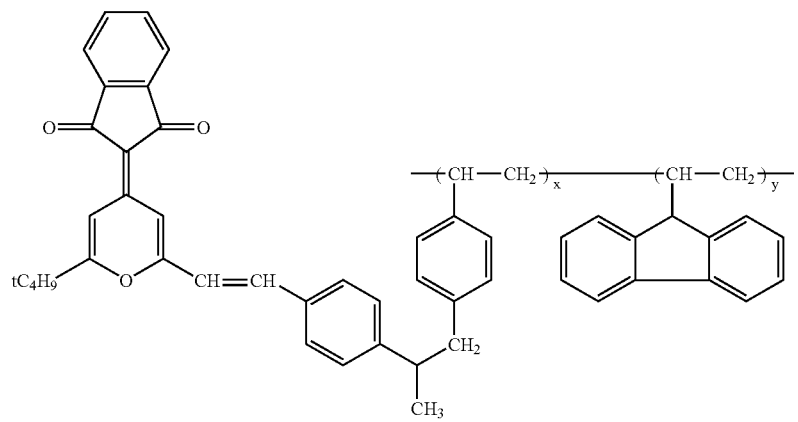
(D-21)
weight-average molecular weight (1200 in terms of polystyrene); x:y = (1:100)(weight ratio)
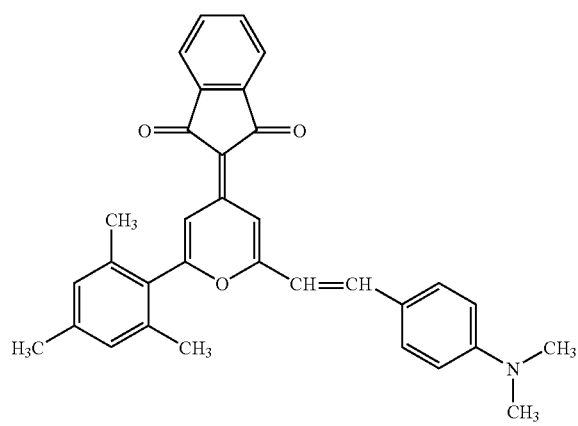
(D-22)
(D-23)
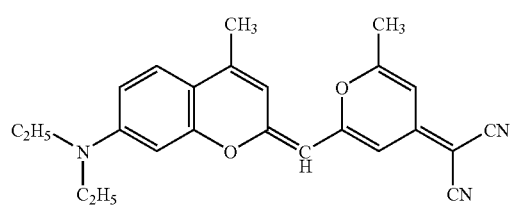
(D-24)
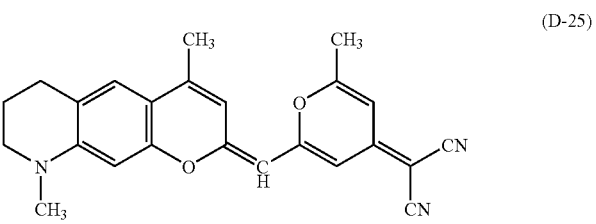
(D-25)

-continued
(D-26)
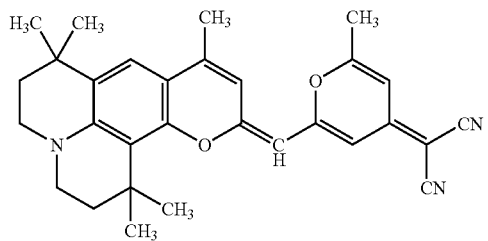
(D-27)
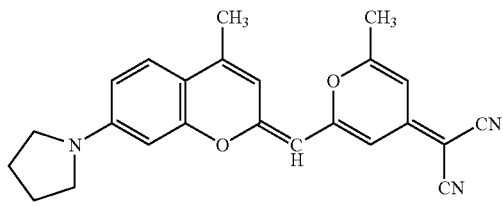
(D-28)
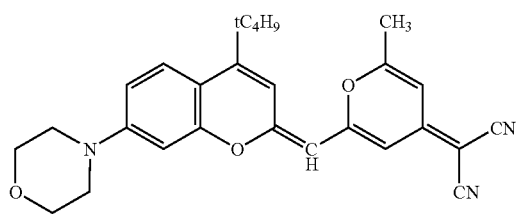
(D-29)
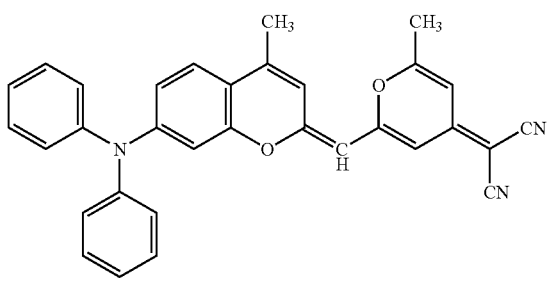
(D-30)
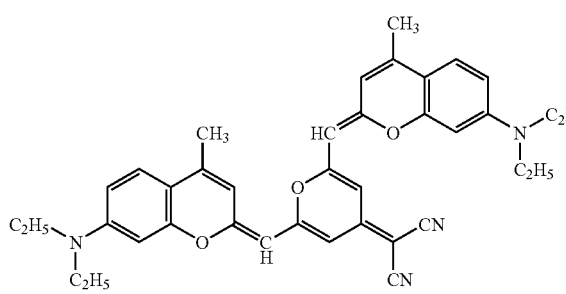
(D-31)
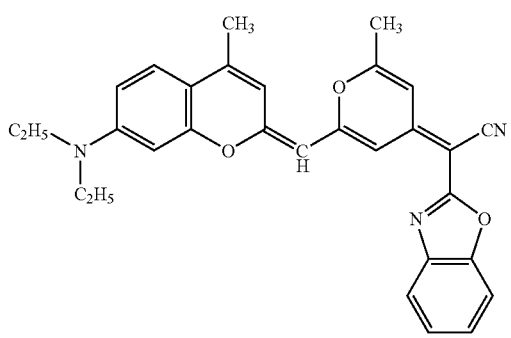
(D-32)
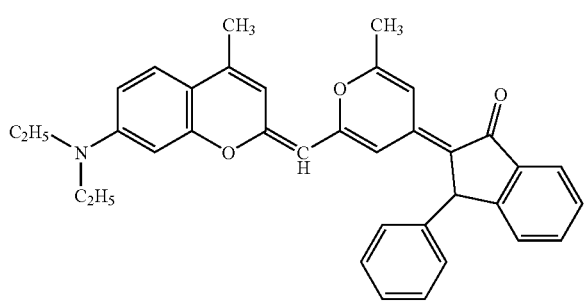
(D-33)
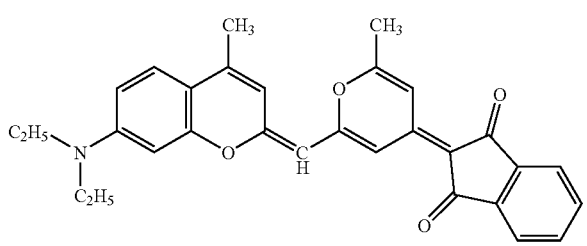
(D-34)
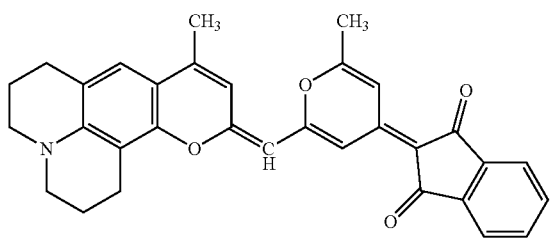
(D-35)
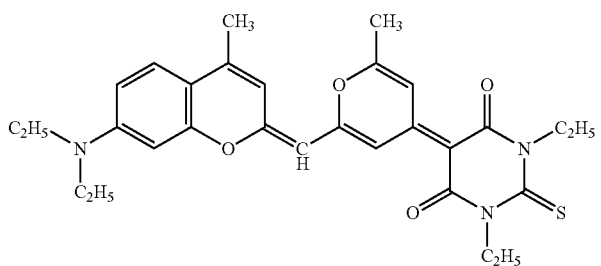

-continued
(D-36)
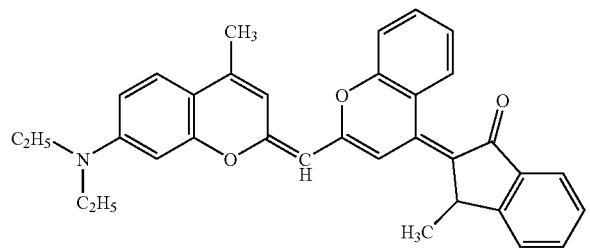
(D-37)
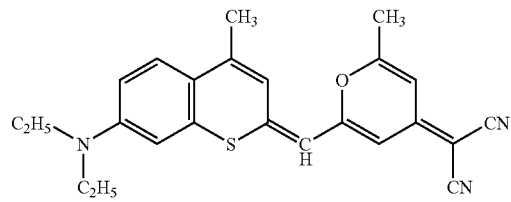
(D-38)
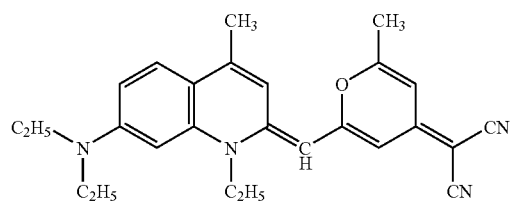
(D-39)
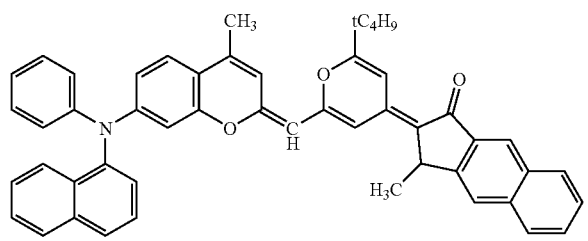
(D-40)
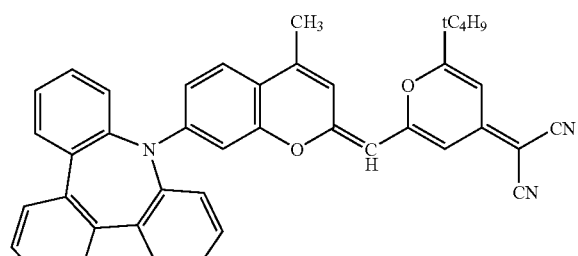
(D-41)
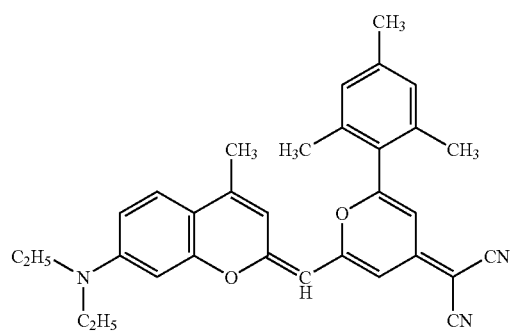
(D-42)
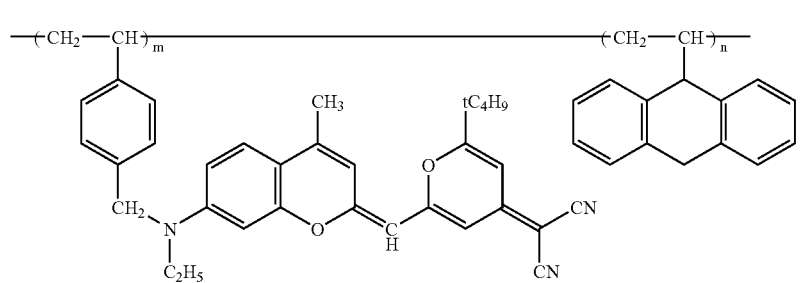
weight-average molecular weight: 11800 (in terms of polystyrene); m:n = 1:100 (weight ratio)
(D-43)
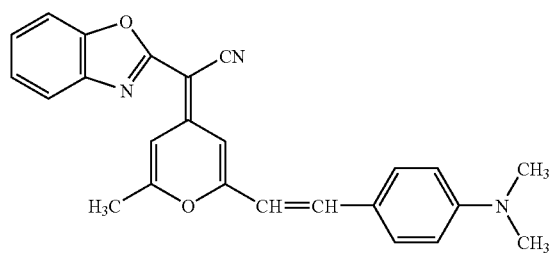
(D-44)
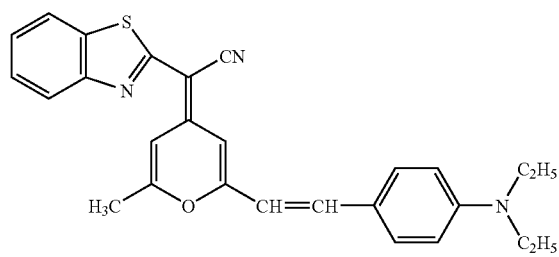

-continued
(D-45)
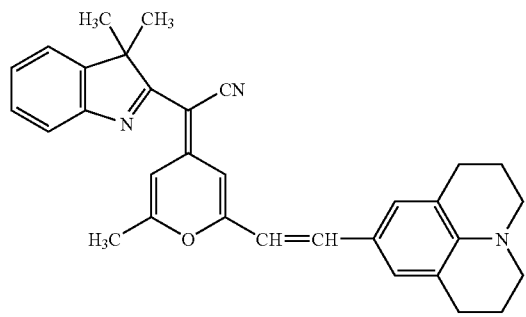
(D-46)
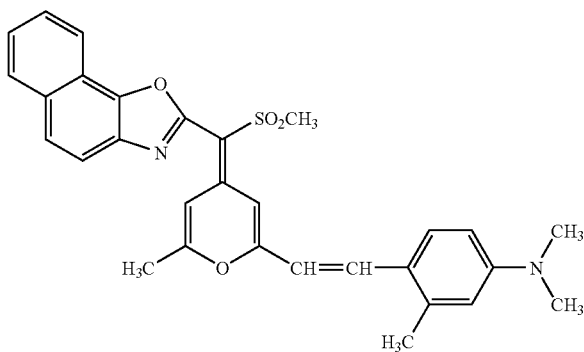
(D-47)
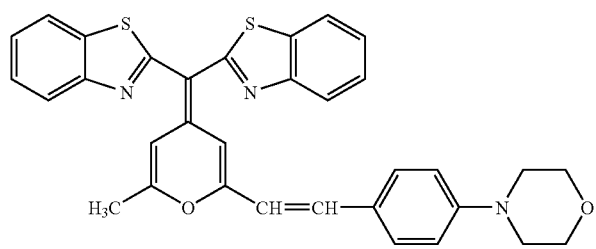
(D-48)
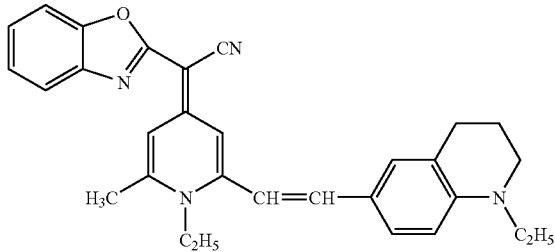
(D-49)
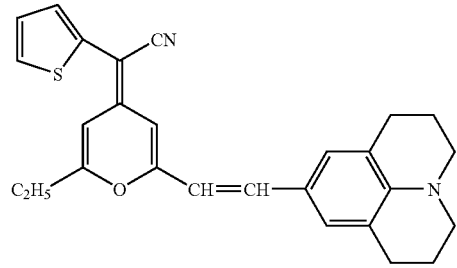
(D-50)
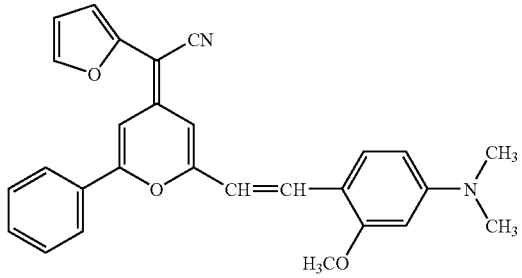
(D-51)
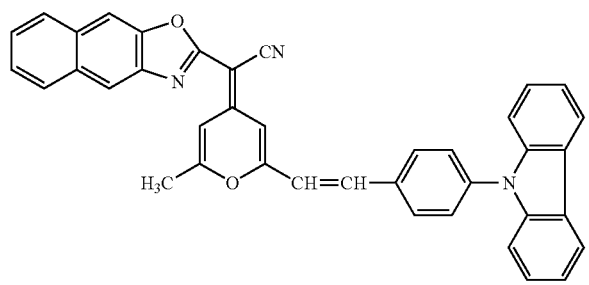
(D-52)
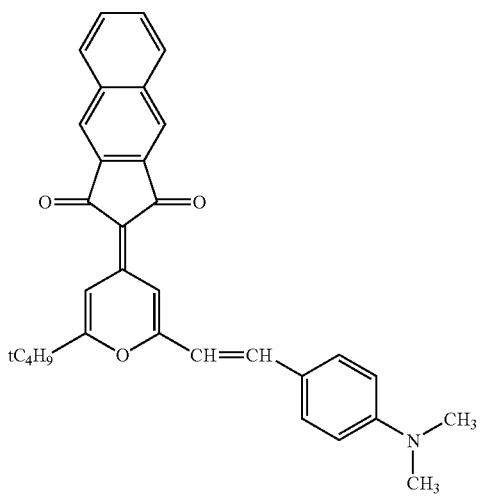

-continued
(D-53)
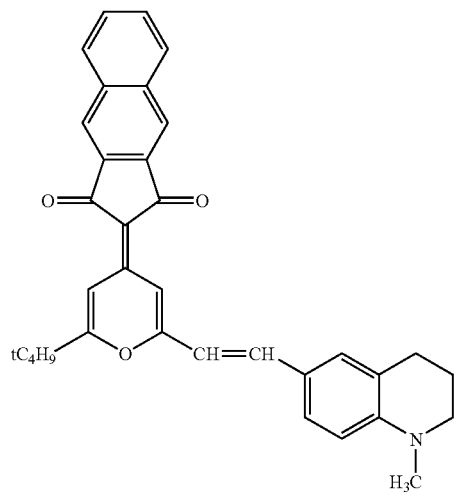
(D-54)
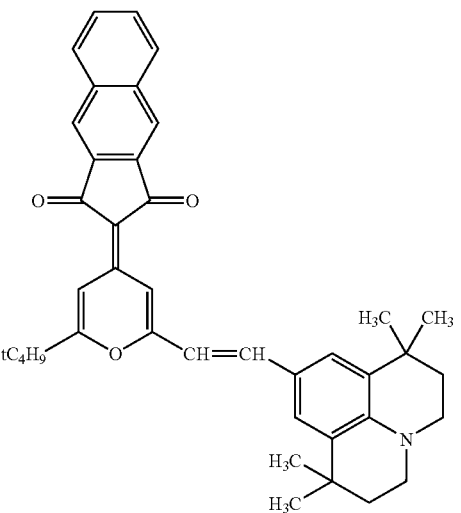
(D-55)
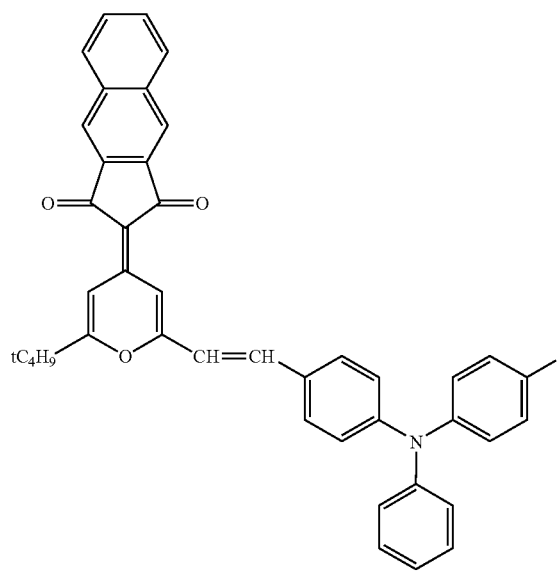
(D-56)
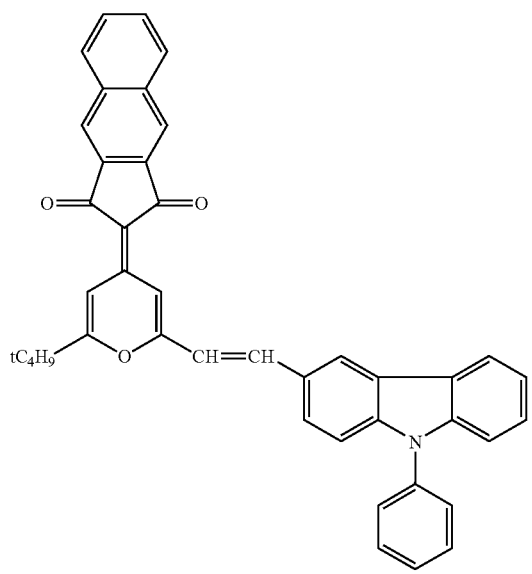
(D-57)
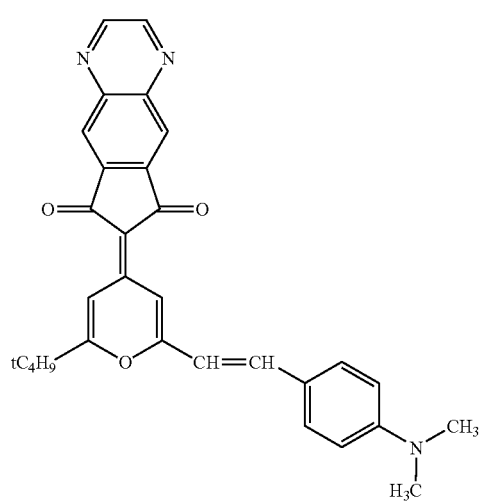
(D-58)
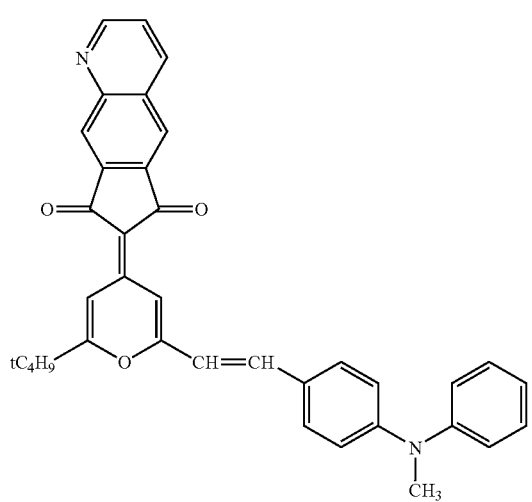

-continued
(D-59)
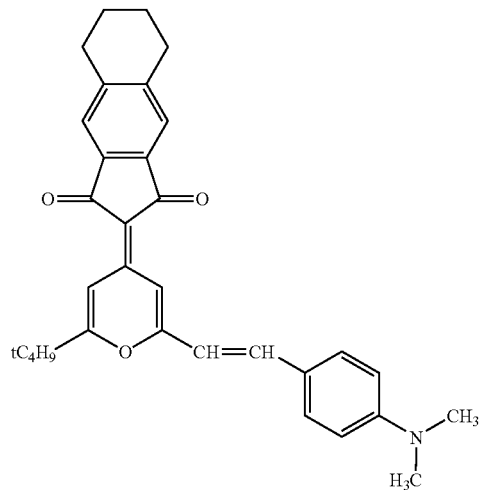
(D-60)
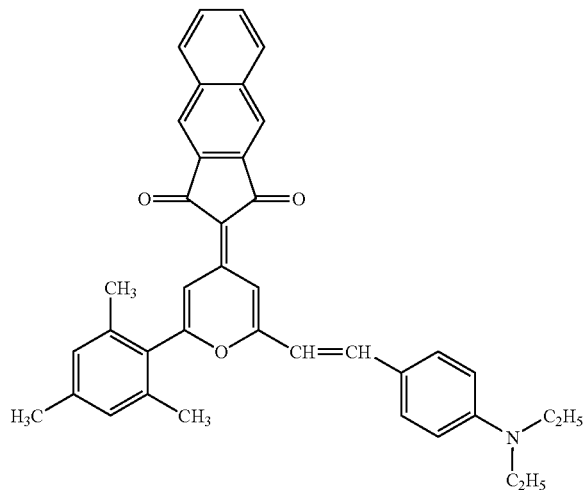
(D-61)
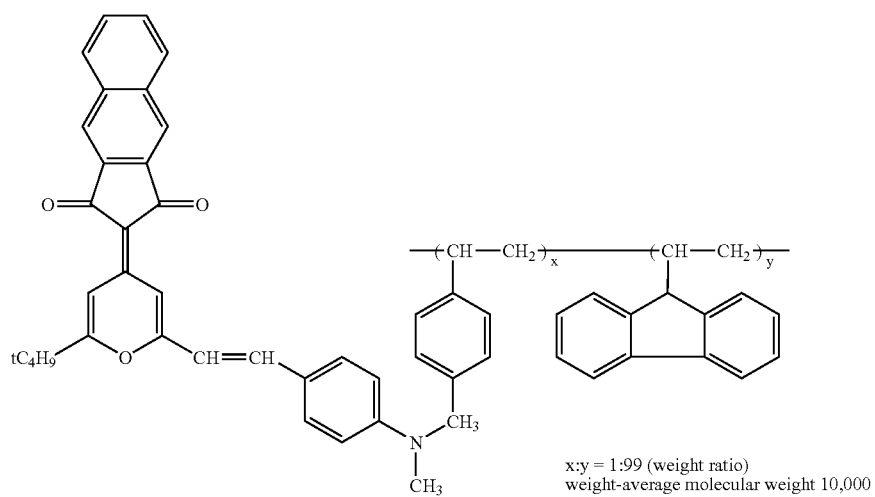
x:y = 1:99 (weight ratio)
weight-average molecular weight 10,000
(D-62)
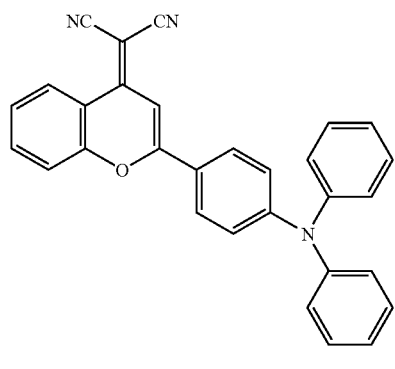
(D-63)
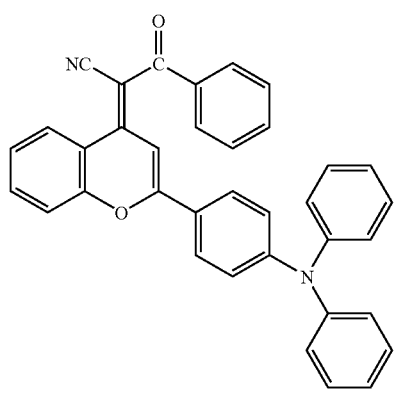

-continued
(D-64)
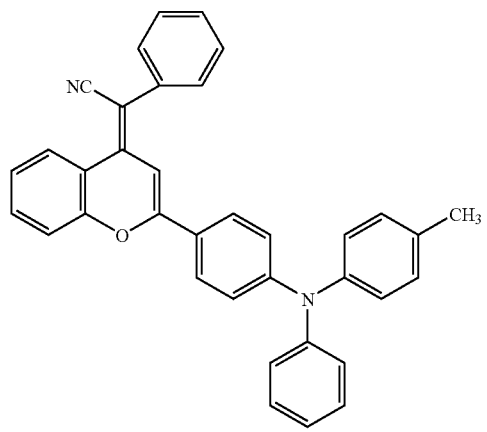
(D-65)
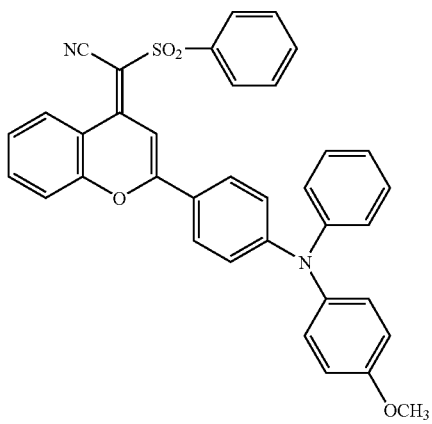
(D-66)
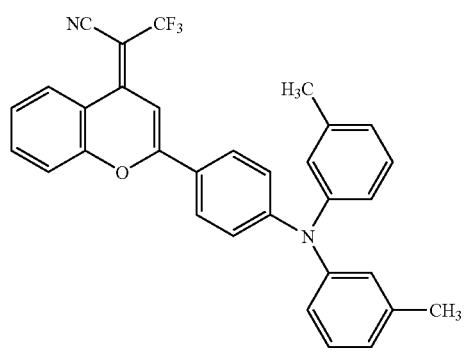
(D-67)
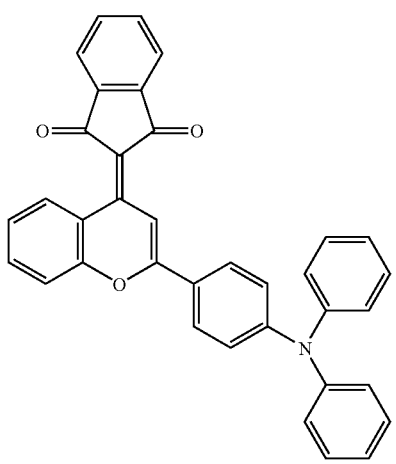
(D-68)
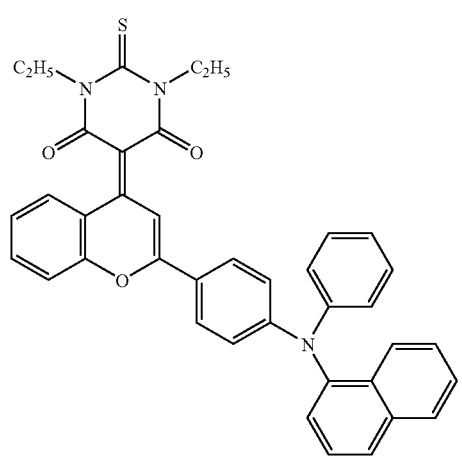
(D-69)
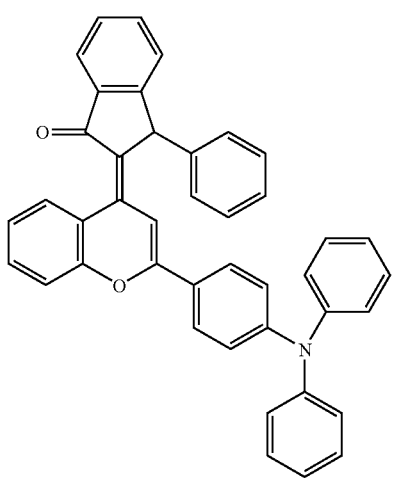

-continued
(D-70)
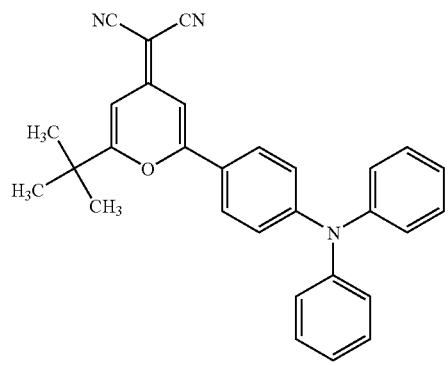
(D-71)
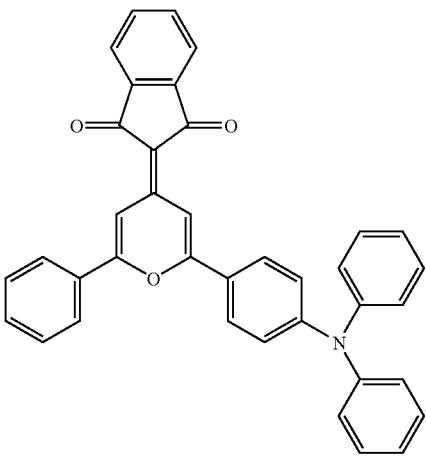
(D-72)
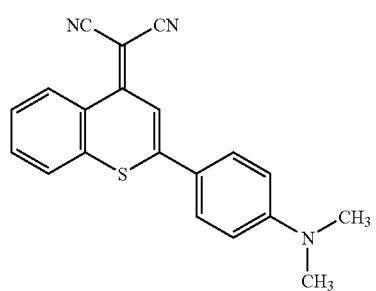
(D-73)
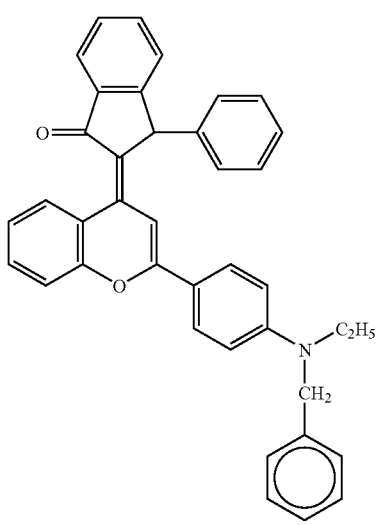
(D-74)
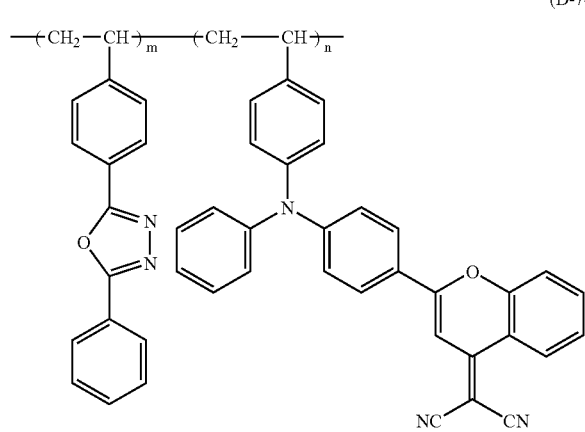
weight-average molecular weight 150,000
m:n = 2:1 by weight
(D-75)
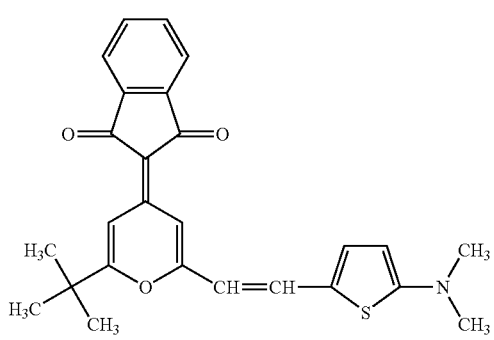

-continued
(D-76) 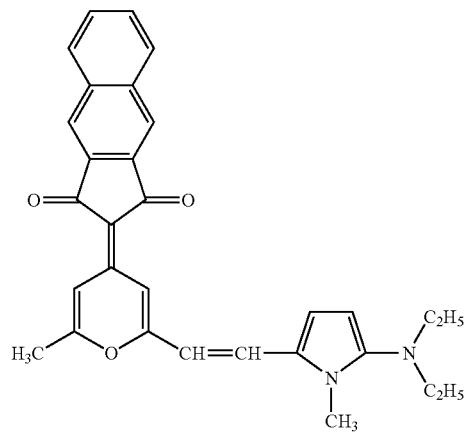
(D-77) 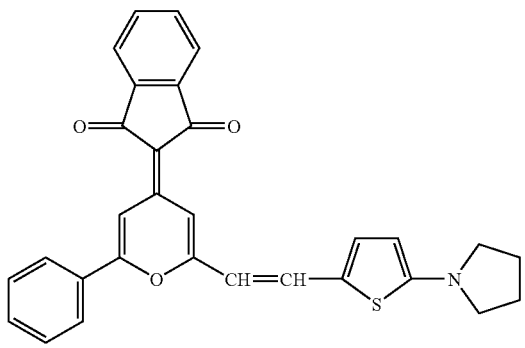
(D-78) 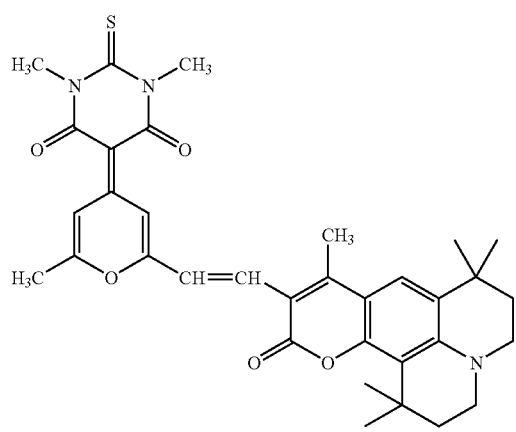
(D-79) 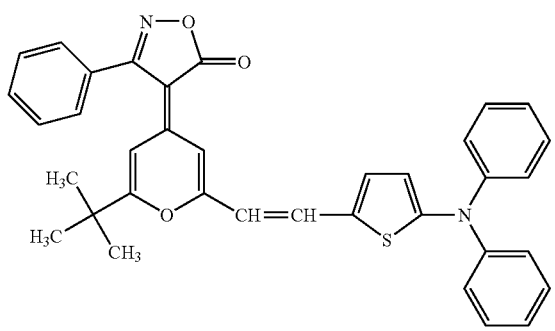
(D-80) 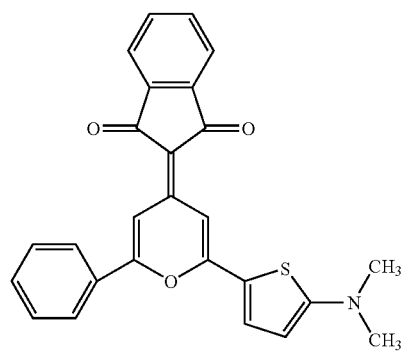
(D-81) 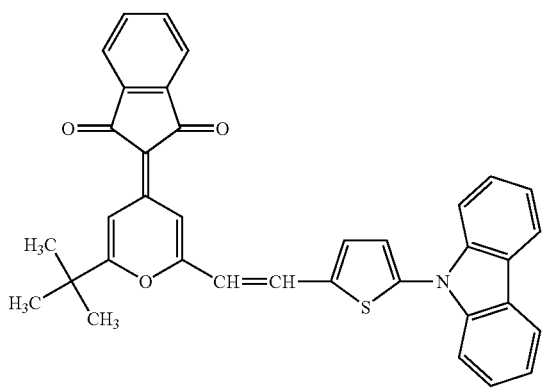
(D-82) 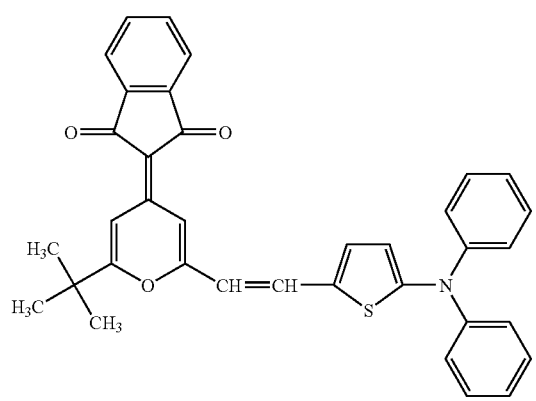
(D-83) 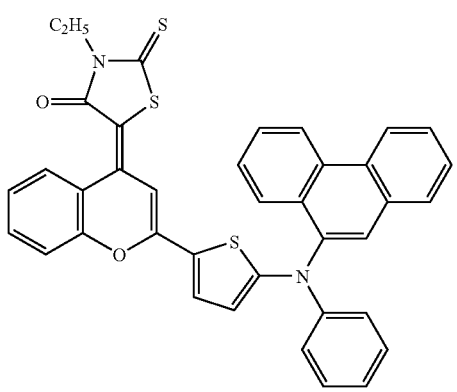

The above-described compounds may be used in the form of the tautomers or metal complexes thereof as the light-emitting materials.

The compounds of the invention represented by the general formula (I) may be synthesized by reference to, for example, processes described in JP-A-11-335661,JP-A-11-292875,JP-A-11-335368, Japanese Patent Application No. H11-161130, Japanese Patent Application No. H11-264380 and Japanese Patent Application No. 2001-16980.

The content of at least one compound selected from the compounds represented by the general formulae (I) to (IV) in the light-emitting layer is preferably 0.01% by weight to 50% by weight, more preferably 0.1% by weight to 10% by weight, still more preferably 0.3% by weight to 5% by weight.

Next, the organic membrane existing in contact with the light-emitting layer containing both the light-emitting material selected from the compounds of the invention represented by the general formula (I) and the host material and existing between the light-emitting layer and a cathode is described. The organic membrane of the invention has electron-transporting properties and has a larger ionization potential than the ionization potential of the host material in the light-emitting layer.

The ionization potential values of the organic membrane and the host material can be obtained by a method of preparing a single-layer membrane of the organic membrane and a single-layer membrane of the host material and measuring the ionization potential in a membrane state using a photo-electron spectrometer (made by Riken Keiki; &AC-1) or by a method of determining the oxidation potential according to the cyclic voltammetry and calculating the ionization potential as a solution.

The difference in ionization potential between the organic membrane and the host material in the light-emitting layer is preferably 0.01 eV to 2 eV, more preferably 0.1 eV to 2 eV, particularly preferably 0.2 eV to 2 eV. In contrast, in case where there exists no difference therebetween in ionization potential or where the ionization potential of the host material is larger, there results a deteriorated light-emitting efficiency and a poor response upon pulse driving, particularly a large temperature dependence of the photo pulse width.

The ionization potential of the organic membrane is preferably more than 5.7 eV and not exceeding 7.0 eV, more preferably 5.8 eV to 6.9 eV, still more preferably 5.9 eV to 6.8 eV, particularly preferably 6.0 eV to 6.8 eV.

Also, an electron transporting and electron injecting membrane may be provided between the organic membrane and the cathode, with known electron transporting and injecting materials being used.

The organic membrane-constituting compounds are preferably hetero ring compounds containing at least two hetero atoms, metal complexes containing a nitrogen-containing hetero ring and having a ligand, styryl derivatives and aryl-substituted arylene derivatives, more preferably hetero ring compounds containing at least two hetero atoms, metal complexes containing a nitrogen-containing hetero ring and having a ligand, and styryl derivatives, particularly preferably hetero ring compounds containing at least two hetero atoms.

The hetero ring compounds containing at least two hetero atoms are those compounds which have two or more atoms other than carbon atom and hydrogen atom within the fundamental skeleton, and may be of a single ring system or a fused ring system. The hetero ring skeleton has two or more atoms preferably selected from N, O and S atoms. More preferably, it is an aromatic hetero ring containing at least one N atom within the skeleton, with an aromatic hetero ring having two or more N atoms within the skeleton being particularly preferred. Also, the hetero atoms may exist either at the fused position or at non-fused position.

Examples of the hetero ring skeleton containing two or more hetero atoms include pyrazole, imidazole, oxazole, thiazole, triazole, oxadiazole, thiadiazole, pyrazine, pyrimidine, indazole, purine, phthalazine, naphthylidine, quinoxaline, quinazoline, cinnoline, pteridine, perimidine, phenanthroline, pyrroloimidazole, pyrrolotriazole, pyrazoloimidazole, pyrazolotriazole, pyrazolopyrimidine, pyrazolotriazine, imidazoimidazole, imidazopyridazine, imidazopyridine, imidazopyrazine, triazolopyridine, benzimidazole, naphthimidazole, benzoxazole, naphthoxazole, benzothiazole, naphthothiazole, benzotriazole, tetrazaindfene and triazine. Preferred examples thereof include triazole, oxadiazole, thiadiazole, imidazopyridazine, imidazopyridine, imidazopyrazine, benzimidazole, naphthimidazole, benzoxazole, naphthoxazole, benzothiazole, naphthothiazole and triazine. More preferred examples thereof include imidazopyridine, imidazopyrazine, benzimidazole and naphthimidazole. Still more preferred examples thereof include imidazopyridine, benzimidazole, naphtimidazole and triazine, with imidazopyridine being particularly preferred.

Preferred compounds having a hetero ring skeleton containing two or more hetero atoms are compounds represented by the following general formula (V) or (VI):

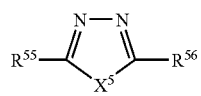

general formula (V)

general formula (VI)

In the general formula (V), $R^{55}$ and $R^{56}$, which may be the same or different from each other, each represents an alkyl group, an aryl group or a hetero ring group, $X^5$ represents an oxygen atom, a sulfur atom or $NR^{Y5}$, $R^{Y5}$ represents a hydrogen atom or a substituent (an alkyl group, an alkenyl group, an alkynyl group, an aryl group or a hetero ring group). Here, the alkyl group, the alkenyl group, the alkynyl group, the aryl group and the hetero ring group are the same as described with respect to R1 to R5 in the general formula (I), with preferred scopes thereof also being the same as described there.

In the general formula (VI), A represents a hetero ring group containing two or more hetero atoms, and a plurality of hetero ring groups represented by A maybe the same or different from each other. $m^6$ represents an integer of 2 or more. $L^6$ represents a linking group.

The linking group represented by $L^6$ is preferably a linking group formed by a single bond, C, N, O, S, Si or Ge, more preferably a single bond, alkylene, alkenylene, alkynylene, arylene, a divalent hetero ring (preferably an aromatic hetero ring, more preferably an aromatic hetero ring formed by an azole ring, a thiophene ring or a furan ring) or a group comprising a combination of N and these, still more preferably arylene, a divalent aromatic hetero ring or a group comprising a combination of N and these.

As the specific examples of the linking group represented by $L^6$, there are illustrated, for example, the following as well as the single bond.

-continued

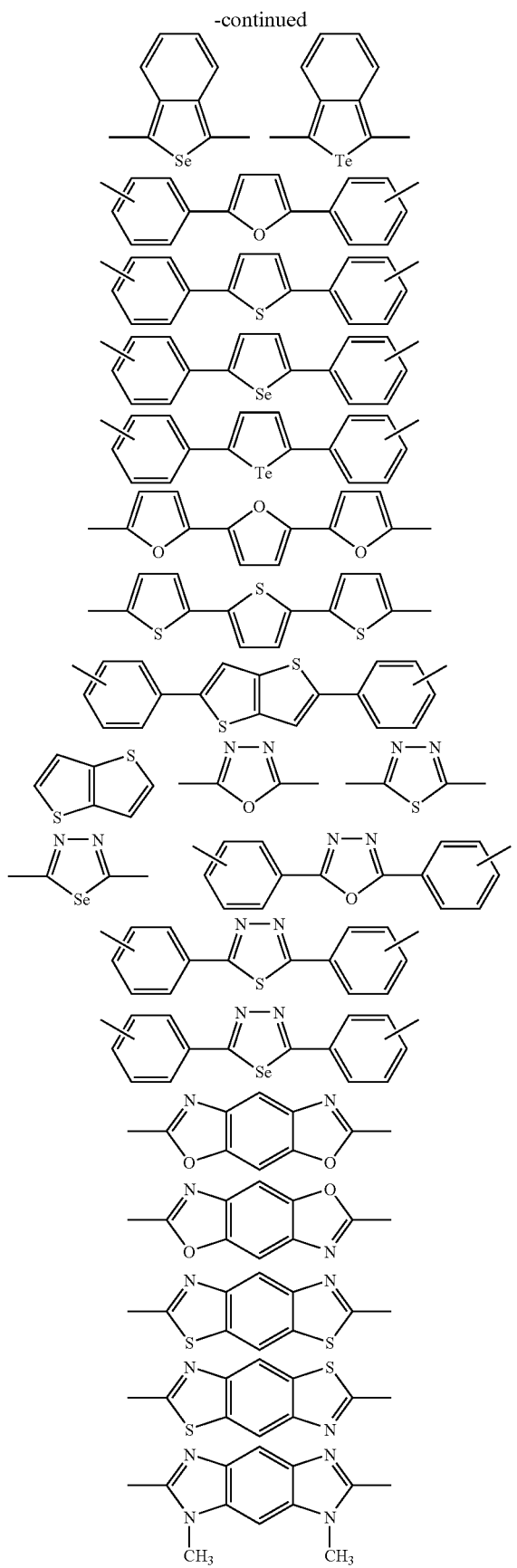
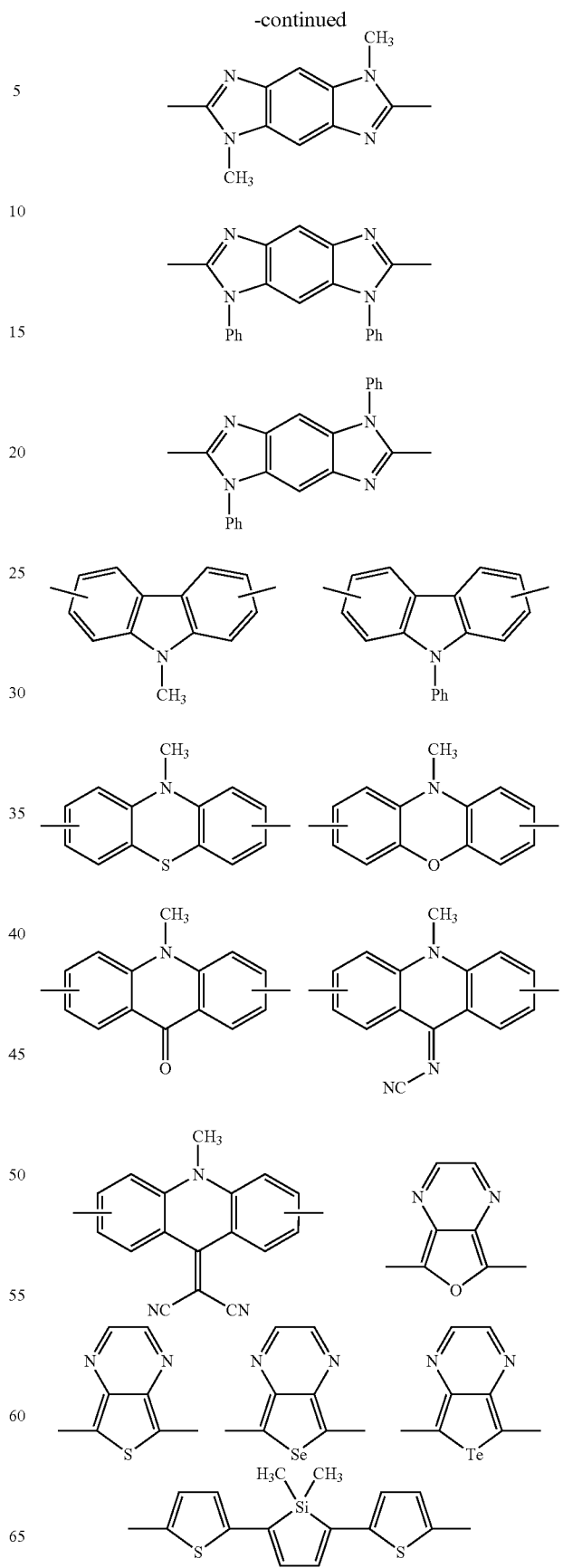

-continued
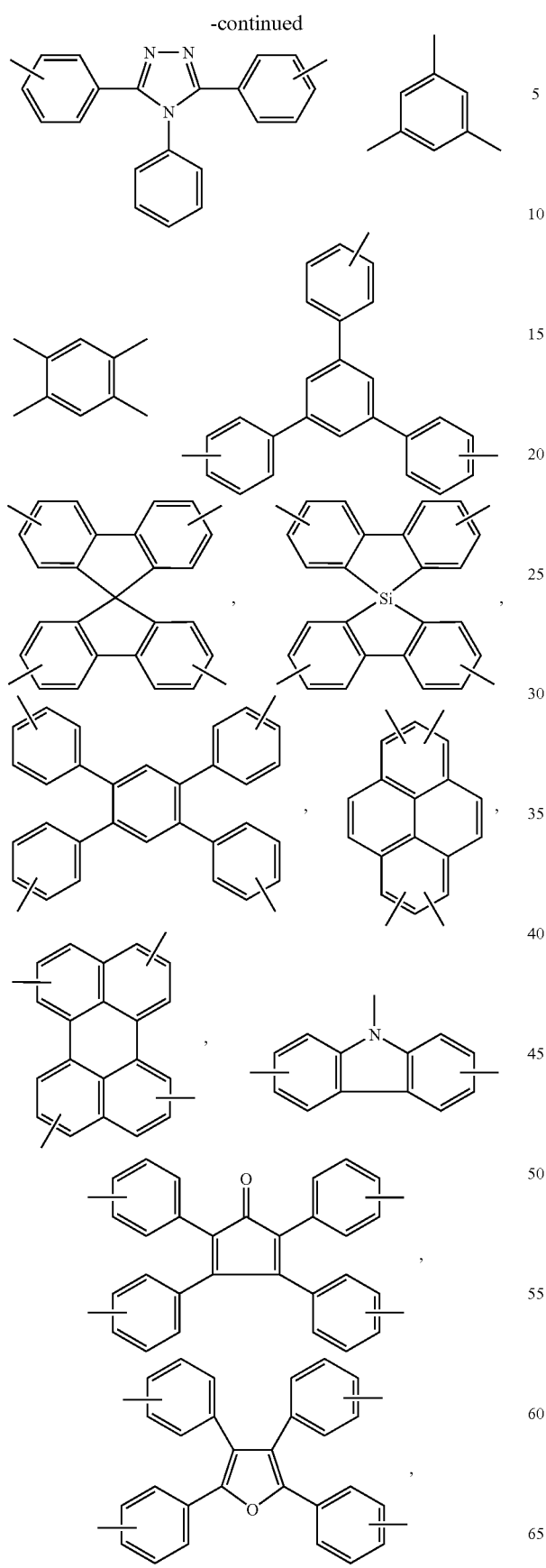
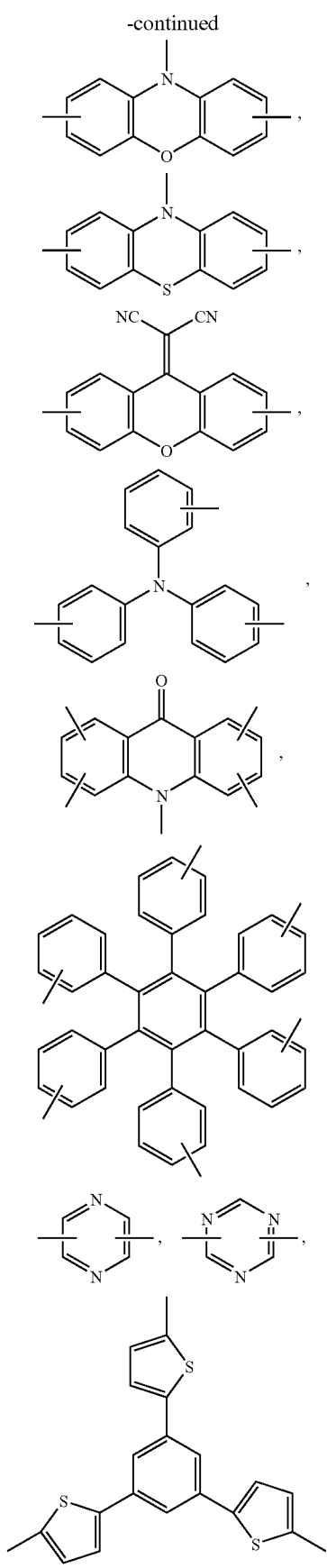

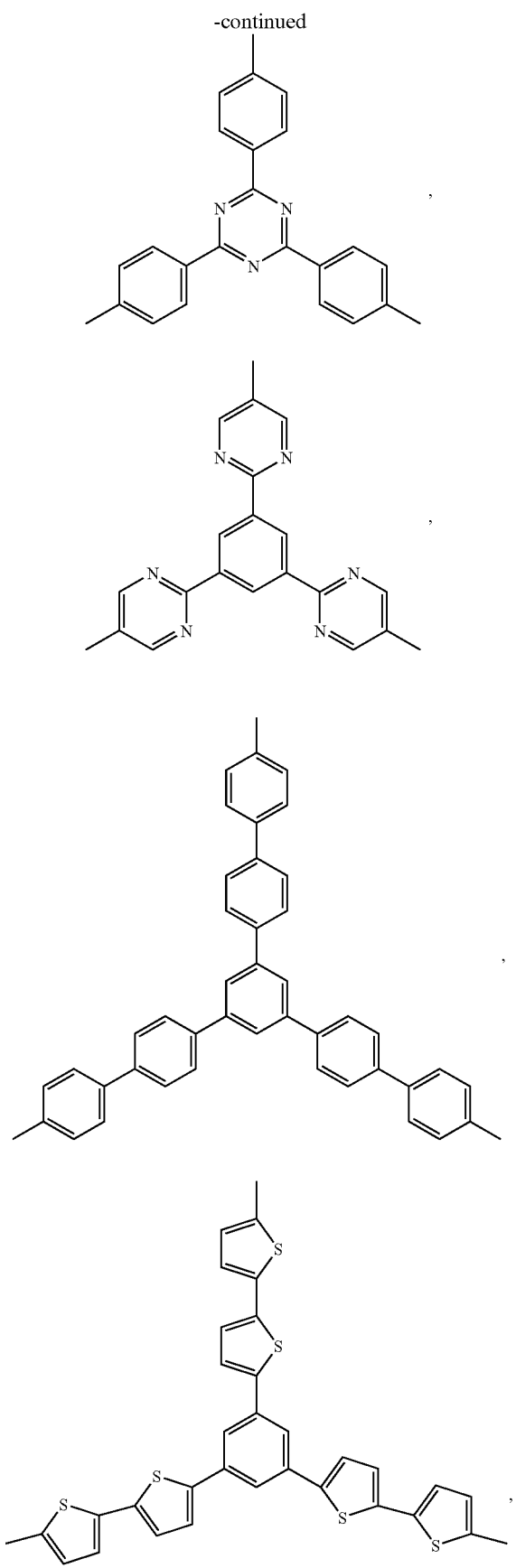

$m^6$ represents an integer of 2 or more, preferably 2 to 8, more preferably 2 to 6, still more preferably 2 to 4, particularly preferably 2 or 3, most preferably 3.

As the hetero ring group represented by Ar and containing two or more hetero atoms, there are preferably illustrated the compounds represented by the following general formula (E11):

general formula (E11)

wherein $X^E$ represents O, S, N—$R^a$ or C—$R^a$, $R^a$ represents a hydrogen atom or a substituent (an aliphatic hydrocarbyl group, an aryl group or a hetero ring group), Q represents atoms necessary to form a hetero ring together with N and $X^E$.

The aliphatic hydrocarbyl group represented by $R^a$ is a straight, branched or cyclic alkyl group (containing preferably 1 to 20 carbon atoms, more preferably 1 to 12 carbon atoms, particularly preferably 1 to 8 carbon atoms and being exemplified by methyl, ethyl, iso-propyl, tert-butyl, n-octyl, n-decyl, n-hexadecyl, cyclopropyl, cyclopentyl and cyclohexyl), an alkenyl group (containing preferably 2 to 20 carbon atoms, more preferably 2 to 12 carbon atoms, particularly preferably 2 to 8 carbon atoms and being exemplified by vinyl, allyl, 2-butenyl and 3-pentenyl) or an alkynyl group (containing preferably 2 to 20 carbon atoms, more preferably 2 to 12 carbon atoms, particularly preferably 2 to 8 carbon atoms and being exemplified by propargyl and 3-pentynyl) and, more prefrerably, an alkyl group.

The aryl group represented by $R^a$ is a single ring or fused ring aryl group containing preferably 6 to 30 carbon atoms, more preferably 6 to 20 carbon atoms, still more preferably 6 to 12 carbon atoms and is exemplified by phenyl, 2-methylphenyl, 3-methylphenyl, 4-methylphenyl, 2-methoxyphenyl, 3-trifluoromethylphenyl, pentafluorophenyl, 1-naphthyl and 2-naphthyl.

The hetero ring group represented by $R^a$ is a single hetero ring or fused hetero ring group (containing preferably 1 to 20 carbon atoms, more preferably 1 to 12 carbon atoms, still more preferably 2 to 10 carbon atoms) and is preferably an aromatic hetero ring group containing at least one of a nitrogen atom, an oxygen atom, a sulfur atom and a selenium atom. Specific examples of the hetero ring group represented by $R^a$ include pyrrolidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridine, phenanthroline, phenazine, tetrazole, benzimidazole, benzoxazole, benzothiazole, benzotriazole, tetrazaindene, carbazole and azepine. Preferred examples thereof include furan, thiophene, pyridine, ppyrazine, pyrimidine, pyridazine, triazine, quinoline, phthalazine, naphthyridine, quinoxaline and quinazoline, and more preferred examples thereof include furan, thiophene, pyridine and quinoline, with quinoline being still more preferred.

The aliphatic hydrocarbyl group, the aryl group or the hetero ring group represented by $R^a$ may have a substituent. As such substituent, those illustrated as substituents represented by $R^1$ to $R^5$ in the general formula (I) maybe applied, with a preferred scope thereof being also the same.

$R^a$ is preferably an alkyl group, an aryl group or an aromatic hetero ring group, more preferably an aryl group or an aromatic hetero ring group, still more preferably an aryl group.

$X^E$ is preferably O or N—$R^a$, more preferably N—$R^a$, particularly preferably N—Ar (Ar being an aryl group (containing preferably 6 to 30 carbon atoms, more preferably 6 to 20 carbon atoms, still more preferably 6 to 12 carbon atoms) or an aromatic hetero ring group (containing preferably 1 to 20 carbon atoms, more preferably 1 to 12 carbon atoms, still more preferably 2 to 10 carbon atoms), preferably an aryl group).

Q represents atoms necessary for forming a hetero ring by being connected to N and $X^E$. The hetero ring formed by Q is preferably an aromatic hetero ring, more preferably a 5- to 8-membered hetero ring, more preferably a 5- or 6-membered aromatic hetero ring, particularly preferably a 5-membered aromatic hetero ring.

Specific examples of the hetero ring formed by Q include an imidazole ring, an oxazole ring, a thiazole ring, a selenazole ring, a tellurazole ring, a triazole ring, a tetrazole ring, anoxadizole ring, a thiadiazole ring, an oxatriazole ring, a thiatriazole ring, a pyridine ring, a pyrazine ring, a pyridazine ring and a pyrimidine ring, more preferred examples thereof include an imidazole ring, an oxazole ring, a thiazole ring, an oxadiazole ring and a thiadiazole ring, and more preferably an imidazole ring and an oxazole ring, with an imidazole ring being still more preferred.

The hetero ring formed by Q may form a fused ring together with other ring, and may have a substituent. As the substituent, those illustrated as substituents represented by $R^1$ to $R^5$ in the general formula (I) may be applied. Preferred examples of the substituent for Q include an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, a sulfonylamino group, a sulfamoyl group, a carbamoyl group, an alkylthio group, an arylthio group, a sulfonyl group, a halogen atom, a cyano group and a hetero ring group, more preferred examples thereof include an alkyl group, an alkenyl group, an aryl group, an alkoxy group, an aryloxy group, a halogen atom, a cyano group and a hetero ring group, still more preferred examples thereof include an alkyl group, an aryl group, an alkoxy group, an aryloxy group and an aromatic hetero ring group, and particularly preferred examples thereof include an alkyl group, an aryl group, an alkoxy group and an aromatic hetero ring group.

Of the compounds represented by the general formula (VI), preferred compounds are those represented by the following general formula (E12):

general formula (E12):

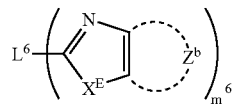

wherein $L^6$ and $m^6$ are the same as defined with respect to those in the general formula (VI), $X^E$ is the same as defined with respect to the general formula (E11), and preferred scopes thereof are also the same. $Z^b$ represents atoms necessary for form an aromatic ring. The aromatic ring formed by $Z^b$ may be an aromatic hydrocarbon ring or an aromatic hetero ring. Specific examples thereof include a benzene ring, a pyridine ring, a pyrazine ring, a pyrimidine ring, a pyridazine ring, a pyrrole ring, a furan ring, a thiophene ring, a selenophene ring, a tellurophene ring, an imidazole ring, a thiazole ring, a selenazole ring, a tellurazole ring, a thiadiazole ring, an oxadiazole ring and a pyrazole ring, preferred examples thereof include a benzene ring, a pyridine ring, a pyrazine ring, a pyrimidine ring and a pyridazine ring, more preferred examples thereof include a benzene ring, a pyridine ring and a pyrazine ring, and still more preferred examples thereof include a benzene ring and a pyridine ring, with a pyridine ring being particularly preferred.

The aromatic ring formed by $Z^b$ may form a fused ring together with other ring, and may have a substituent. As the substituent, those illustrated as substituents represented by $R^1$ to $R^5$ in the general formula (I) may be applied. Preferred examples of the substituent for the aromatic ring formed by $Z^b$ include an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group and a hetero ring group, more preferred examples thereof include an alkyl group, an alkenyl group, an aryl group, an alkoxy group, an aryloxy group, a halogen atom, a cyano group and a hetero ring group, still more preferred examples thereof include an alkyl group, an aryl group, an alkoxy group, an aryloxy group and an aromatic hetero ring group, and particularly preferred examples thereof include an alkyl group, an aryl group, an alkoxy group and an aromatic hetero ring group.

Of the compounds represented by the general formula (VI), still more preferred are those compounds which are represented by the general formula (E13):

general formula (E13)

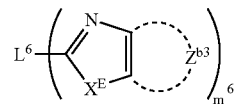

wherein $L^6$, $X^E$ and $m^6$ are the same as those in the general formulae (VI) and (E11), and preferred scopes thereof are also the same. $Z^{b3}$ represents atoms necessary for forming an aromatic hetero ring. The aromatic hetero ring formed by $Z^{b3}$ is preferably a 5- or 6-membered aromatic hetero ring, more preferably a 5- or 6-membered, nitrogen-containing aromatic hetero ring, still more preferably a 6-membered, nitrogen-containing aromatic hetero ring. Specific examples of the aromatic hetero ring formed by $Z^{b3}$ include furan, thiophene, pyran, pyrrole, imidazole, pyrazole, pyridine, pyrazine, pyrimidine, pyridazine, thiazole, oxazole, isothiazole, isoxazole, thiadiazole, oxadiazole, triazole, selenazole and tellurazole, preferred examples thereof include pyridine, pyrazine, pyrimidine and pyridazine, and still more preferred examples thereof include pyridine and pyrazine, with pyridine being particularly preferred. The aromatic ring formed by $Z^{b3}$ may form a fused ring together with other ring, and may have a substituent. As the substituent, those illustrated as substituents represented by $R^1$ to $R^5$ in the general formula (I) may be applied, and preferred scopes thereof are also the same as described there.

Of the compounds represented by the general formula (VI), still more preferred are those which are represented by the general formula (E14):

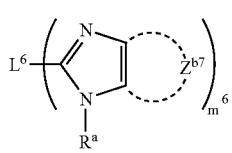

general formula (E14)

wherein $L^6$ and $m^6$ are the same as those in the general formulae (VI), and preferred scopes thereof are also the same. $Z^{b7}$ represents atoms necessary for forming a 6-membered, nitrogen-containing aromatic hetero ring. Specific examples of the 6-membered, nitrogen-containing aromatic hetero ring formed by $Z^{b7}$ include pyridine, pyrazine, pyrimidine, pyridazine and triazine, preferred examples thereof include pyridine, pyrazine, pyrimidine and pyridazine, and still more preferred examples thereof include pyridine and pyrazine, with pyridine being particularly preferred. The 6-membered, nitrogen-containing aromatic ring formed by $Z^{b7}$ may form a fused ring together with other ring, and may have a substituent.

Of the compounds represented by the general formula (VI), more preferred are those compounds which are represented by the following general formula (E15):

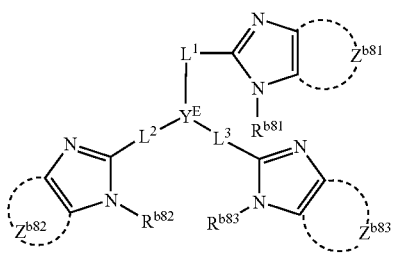

general formula (E15)

wherein $R^{b81}$, $R^{b82}$ and $R^{b83}$ are the same as $R^a$ in the general formulae (E11), and preferred scopes thereof are also the same. $Z^{b81}$ $Z^{b82}$ and $Z^{b83}$ are the same as $Z^{b3}$ in the general formula (E13), and preferred scopes thereof are also the same. $L^1$, $L^2$ and $L^3$ are the same as $L^6$ defined in the general formula (VI). $L^1$, $L^2$ and $L^3$ are a single bond, arylene, a divalent aromatic hetero ring and a linking group composed of a combination of these, more preferably are a single bond, benzene, naphthalene, anthracene, pyridine, pyrazine, thiophene, furan, oxazole, thiazole, oxadiazole, thiadiazole, triazole and a linking group composed of these, still more preferably a single bond, benzene, thiophene and a linking group composed of a combination of these, and particularly preferably a single bond, benzene and a linking group composed of a combination of these, with a single bond being most preferred. $L^1$, $L^2$ and $L^3$ may have a substituent and, as the substituent, there may be applied those which have been illustrated as $R^1$ to $R^5$ in the general formula (I), with preferred scopes thereof being the same.

YE represents a nitrogen atom or a 1,3,5-benzenetriyl group, with the latter optionally having a substituent. Examples of the substituent include an alkyl group, an aryl group and a halogen atom. $Y^E$ is preferably a nitrogen atom or an unsubstituted 1,3,5-benzenetriyl group, more preferably an unsubstituted 1,3,5-benzenetriyl group.

Next, the metal complex having a ligand containing a nitrogen-containing hetero ring compound is described below. Examples of the nitrogen-containing hetero ring skeleton include pyrazole, imidazole, oxazole, thiazole, triazole, oxadiazole, thiadiazole, pyridine, pyrazine, pyrimidine, pyridazine, quinoline, isoquinoline, indazole, purine, phthalazine, napohthylidine, quinoxaline, quinazoline, cinnoline, pteridine, perimidine, phenanthroline, pyrroloimidazole, pyrrolotriazole, pyrazoloimidazole, pyrazolotriazole, pyrazolopyrimidine, pyrazolotriazine, imidazoimidazole, imidazopyridazine, imidazopyridine, imidazopyrazine, triazolopyridine, benzimidazole, naphthimidazole, benzoxazole, naphthoxazole, benzothiazole, naphthothiazole, benzotriazole, tetrazaindene and triazine. Preferred examples thereof are triazole, oxazole, oxadiazole, thiadiazole, imidazopyridazine, imidazopyridine, imidazopyrazine, benzimidazole, naphthimidazole, benzoxazole, naphthoxazole, benzothiazole, naphthothiazole, pyridine, quinoline and triazine. Still more preferred examples are triazole, oxazole, oxadiazole, pyridine, quinoline and triazine. Particularly preferred examples are triazole, oxazole, oxadiazole, pyridine and quinoline.

The ligand contained in the metal complex preferably has an alkoxy group, an aryloxy group, a heteroaryloxy group, a sulfonamide group or an amido group in addition to the nitrogen atom of the nitrogen-containing hetero ring as coordinating groups to form a bidendate ligand. The metal complex is preferably a compound represented by the general formula (E21) or (E22).

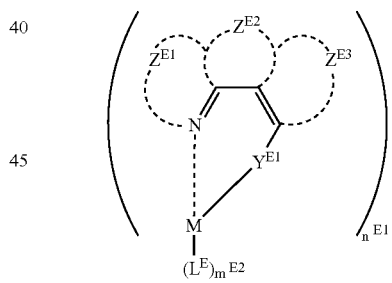

general formula (E21)

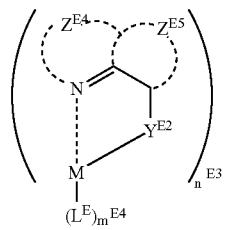

general formula (E22)

In the general formula (E21) or (E22), $Z^{E1}$ and $Z^{E4}$ each represents atoms necessary for forming a 5- to 6-membered, nitrogen-containing aromatic hetero ring. Specific examples of the nitrogen-containing aromatic hetero ring represented by $Z^{E1}$ or $Z^{E4}$ include an imidazole ring, an oxazole ring, a thiazole ring, a selenazole ring, a tellurazole ring, a triazole ring, a tetrazole ring, an oxadiazole ring, a thiadiazole ring, a pyridine ring, a pyrazine ring, a pyridazine ring and a pyrimidine ring.

At least one of $Z^{E2}$ and $Z^{E3}$ represents atoms for forming an aryl group or a 5- to 6-membered aromatic hetero ring group. ZE5 represents atoms for forming an aryl group or a 5- to 6-membered aromatic hetero ring group. As the aryl group or the 5- to 6-membered aromatic hetero ring group formed by $Z^{E2}$, $Z^{E3}$ or $Z^{E5}$, there are illustrated a benzene ring, an imidazole ring, an oxazole ring, a thiazole ring, a selenazole ring, a tellurazole ring, a triazole ring, a tetrazole ring, an oxadiazole ring, a thiadiazole ring, an oxatriazole ring, a thiatriazole ring, a pyridine ring, a pyrazine ring, a pyridazine ring and a pyrimidine ring. $Y^{E1}$ and $Y^{E2}$ each represents an oxygen atom, a dissociated sulfonamide group or a dissociated acylamino group, and may be connected to $Z^{E3}$ or $Z^{E5}$ to form a ring. The dissociated sulfonamido group and the dissociated acylamino group represented by $Y^{E1}$ or $Y^{E2}$ are those of the sulfonamide group and the acylamino group represented by $R^1$ to $R^5$ from which a dissociatable hydrogen atom is dissociated. $Y^{E1}$ and $Y^{E2}$ each preferably represents an oxygen atom or a dissociated sulfonamide group, more preferably an oxygen atom. $L^E$ represents an alkoxy group, an aryloxy group, a heteroaryloxy group or a hydroxyl group. nE1 and nE3 each represents 2 or 3, and mE2 and mE4 each represents 0 or 1. M represents a metal atom, preferably aluminum, zinc, boron or beryllium. The general formula (E21) preferably represents a compound represented by the general formula (VIII) and, of the compounds represented by the general formula (E22), preferred are compounds represented by the general formula (VII) or (VIII).

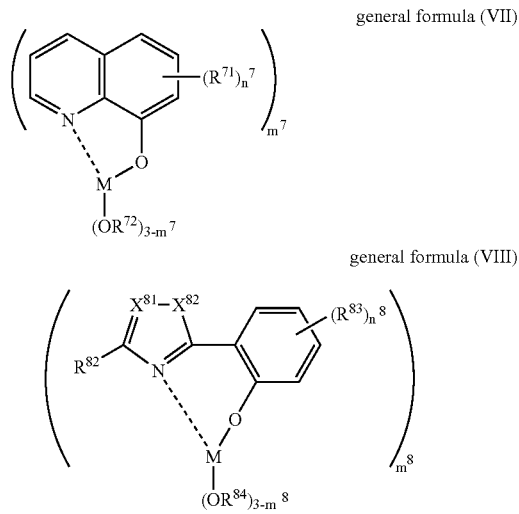

general formula (VII)

general formula (VIII)

In the general formula (VII), $R^{71}$ represents a substituent, $R^{72}$ represents a hydrogen atom, an aliphatic group, an aryl group or an aromatic hetero ring group, M represents a metal atom, and $n^7$ represents an integer of 0 to 6, $m^7$ represents 2 or 3, provided that, when $m^7=3$, then $n^7 \neq 0$. When $n^7$ represents an integer of 2 to 6, a plurality of $R^{71}$s may be the same or different, and may be connected to each other to form a ring. As the substituent represented by $R^{71}$, those illustrated as substituents represented by $R^1$ to $R^5$ in the general formula (I) may be applied, with preferred examples thereof also being the same. More preferably, $R^{71}$ is an aliphatic group, an aryl group or a hetero ring group. $R^{72}$ is preferably a hydrogen atom, an aryl group or an aromatic hetero ring group. In the general formula (VIII), $X^{81}$ represents a nitrogen atom or $C-R^{81}$, $X^{82}$ represents an oxygen atom, a sulfur atom or $N-R^{78}$, $R^{81}$, $R^{82}$, $R^{83}$ and $R^{78}$ each represents a hydrogen atom or a substituent. $R^{81}$ and $R^{82}$ may be connected to each other to form a ring. $R^{84}$ represents a hydrogen atom, an aliphatic group, an aryl group or an aromatic hetero ring group, and M represents a metal atom, preferably aluminum, zinc, boron or beryllium. n8 represents an integer of 0 to 4. $m^8$ represents 2 or 3. When $n^8$ represents an integer of 2 to 4, plural $R^{83}$s may be the same or different from each other, and may be connected to each other to form a ring. Preferred scopes of $R^{83}$ and $R^{84}$ are the same as those of $R^{71}$ and $R^{72}$, respectively. The nitrogen-containing hetero ring formed by $X^{81}$ and $X^{82}$ is preferably an imidazole ring, an oxazole ring, a thiazole ring, a selenazole ring, a tellurazole ring, a triazole ring, a tetrazole ring, an oxadiazole ring or a thiadiazole ring, more preferably an imidazole ring, an oxazole ring, a thiazole ring, a triazole ring, a tetrazole ring, an oxadiazole ring or a thiadiazole ring. $R^{81}$ and $R^{82}$ are the same as defined for $R^1$ to $R^5$ in the general formula (I), with preferred scopes thereof being also the same. $R^{81}$ and $R^{82}$ each preferably represents an aliphatic group, an aryl group or an aromatic hetero ring group.

Next, descriptions on the styryl derivatives are given below. The styryl derivatives are preferably those compounds which are represented by the general formula (IX) or (X).

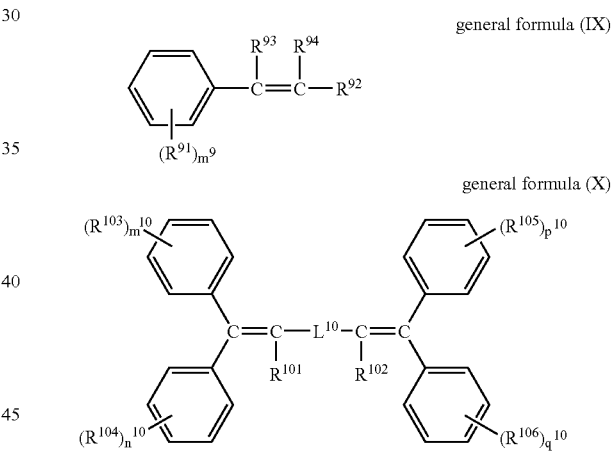

general formula (IX)

general formula (X)

In the general formula (IX), $R^{91}$ represents a substituent. $R^{92}$ to $R^{94}$ each represents a hydrogen atom or a substituent, and a plurality of $R^{91}$s may be connected to each other to form a fused ring. $m^9$ represents an integer of 0 to 5. As the substituents represented by $R^{91}$ to $R^{94}$, there are illustrated, for example, those illustrated as substituents of $R^1$ to $R^5$, with preferred examples thereof being the same. Preferred examples of $R^{91}$ and $R^{92}$ include an alkyl group, an alkenyl group, an alkynyl group, an aryl group, an aromatic hetero ring group and a silyl group, more preferred examples thereof include a hydrogen atom, an alkyl group, an aryl group, an aromatic hetero ring group and a silyl group, and particularly preferred examples thereof include a hydrogen atom, an aromatic hetero ring group and a silyl group. When $m^9$ represents 2 to 5, a plurality of $R^{91}$s maybe the same or different from each other, and maybe connected to each other to form a ring. Preferred examples of $R^{93}$ and $R^{94}$ include a hydrogen atom, an alkyl group, an aryl group and an aromatic hetero ring group.

In the general formula (X), R101 and $R^{102}$ each represents a hydrogen atom or a substituent, and $R^{103}$ to $R^{106}$ each represents a substituent. $L^{10}$ represents a linking group, $m^{10}$, $n^{10}$, $p^{10}$ and $q^{10}$ each represents an integer of 0 to 5. As the substituents represented by $R^{101}$ to $R^{106}$, there are illustrated, for example, those illustrated as substituents of $R^1$ to $R^5$, with preferred scopes thereof being the same. When $m^{10}$, $n^{10}$, $p^{10}$ and $q^{10}$ each represents 2 to 5, a plurality of $R^{103}$ to $R^{106}$ may be the same or different from each other, and may be connected to each other to form a fused ring. Also, $R^{103}$ and $R^{104}$, or $R^{103}$ and $R^{104}$, may be connected to each other to form a ring. Preferred examples of $R^{101}$ and $R^{102}$ include a hydrogen atom, an alkyl group, an aryl group and an aromatic hetero ring group, with a hydrogen atom being particularly preferred. Specific examples of the linking group represented by $L^{10}$ are the same as the specific examples of $L^6$ in the general formula (VI).

Next, the aryl-substituted arylene derivative is described below. The aryl-substituted arylene derivative represents that wherein aryl groups are connected by an arylene group. As specific examples of the arylene group, there are illustrated those arylene groups which have been illustrated as linking groups represented by L6 in the general formula (VI), with 2- or 3-valent arylene groups being preferred. The aryl-substituted arylene derivatives are preferably compounds represented by the general formula (XI).

general formula (XI)

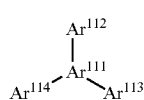

general formula (XI)

In the general formula (XI), specific examples of $Ar^{111}$ include the 3-valent arylene groups illustrated as linking groups represented by $L^6$ in the general formula (VI), with a 1,3,5-benzenetriyl group being more preferred. $Ar^{112}$ to $Ar^{114}$ each represents an aryl group containing preferably 6 to 40 carbon atoms, more preferably 6 to 30 carbon atoms, particularly preferably 6 to 20 carbon atoms, and are exemplified by phenyl, p-methylphenyl, naphthyl, anthryl, phenanthryl and pyrenyl. $Ar^{112}$ to $Ar^{114}$ may further be substituted, with preferred substituents being an alkyl group, an aryl group, an aromatic hetero ring group and a silyl group.

The content of at least one compound selected from the compounds represented by the general formula (V) to (XI) in the organic membrane is preferably 50% by weight to 100% by weight, more preferably 90% by weight to 100% by weight, still more preferably 100% by weight or less. As other components of the organic membrane, materials having no charge-transporting properties may be contained.

Specific examples of the compound constituting the organic membrane in contact with the light-emitting layer containing the light-emitting material of the invention represented by the general formula (I) and between the light-emitting layer and a cathode are illustrated below. In addition to them, there may be illustrated those described in Japanese Patent Application Nos. 2000-254171, 2000-290626, 2000-38578, 2000-111014, H11-108207, H11-217820, H11-36107 and H11-232744,JP-A-2000-229966, JP-A-2000-229957, JP-A-2000-229941,JP-A-11-185959 and JP-A-11-144872. However, the invention is not limited by these. Additionally, dotted lines in the following chemical formulae represent coordination bonds.

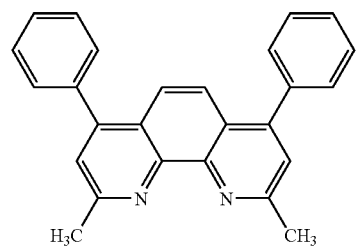

(E-1)

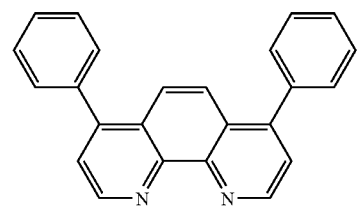

(E-2)

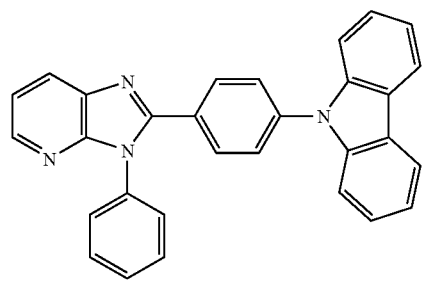

(E-3)

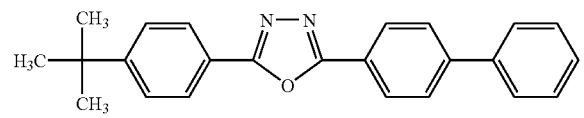

(E-4)

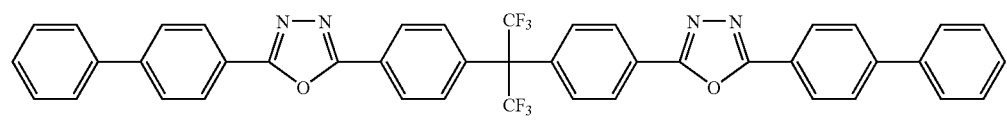

(E-5)

-continued
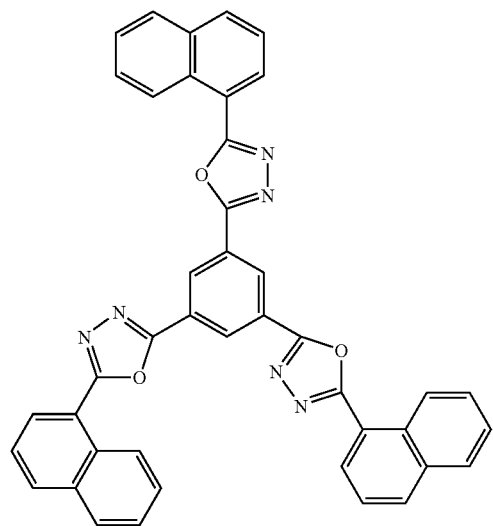
(E-6)
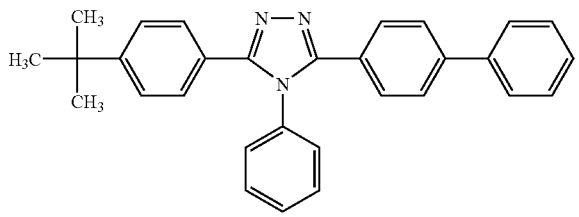
(E-7)
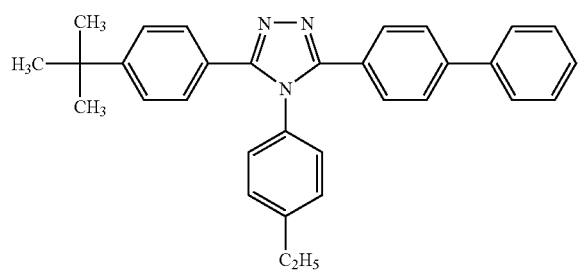
(E-8)
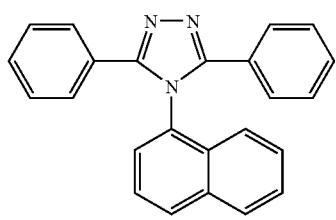
(E-9)
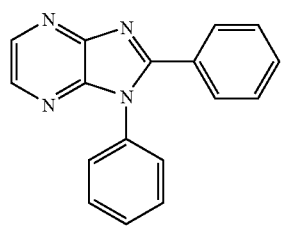
(E-10)
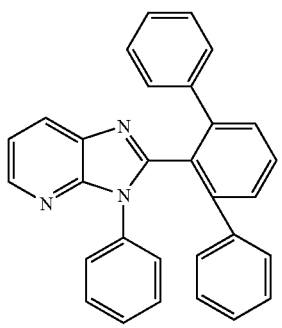
(E-11)
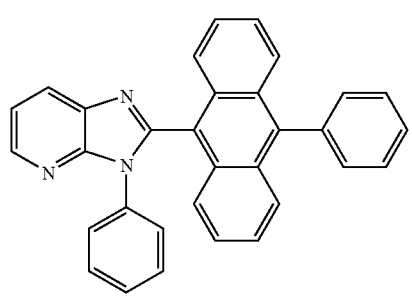
(E-12)
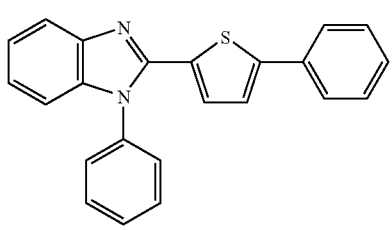
(E-13)

-continued
(E-14)
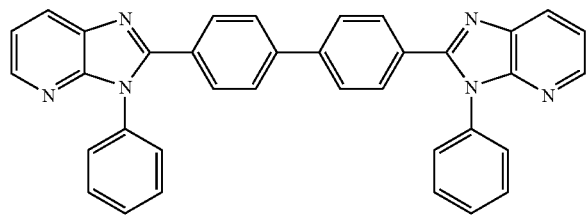
(E-15)
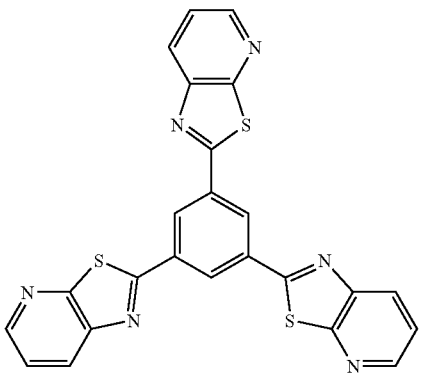
(E-16)
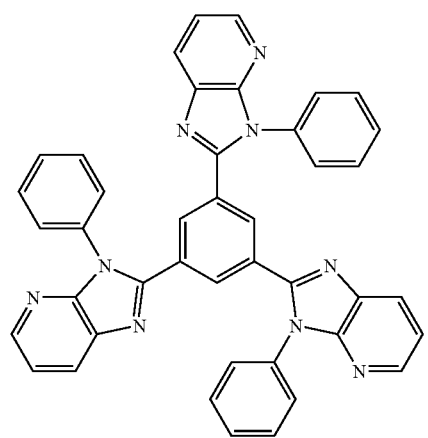
(E-17)
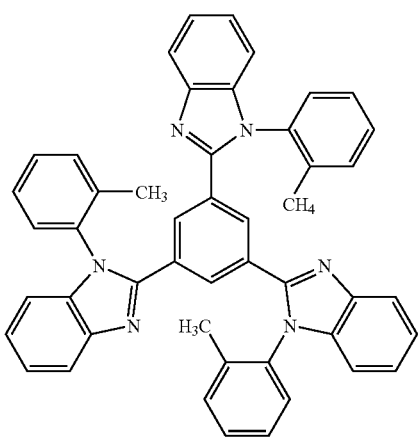
(E-18)
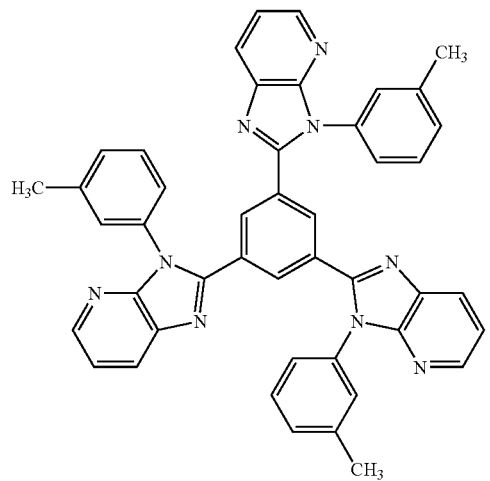
(E-19)
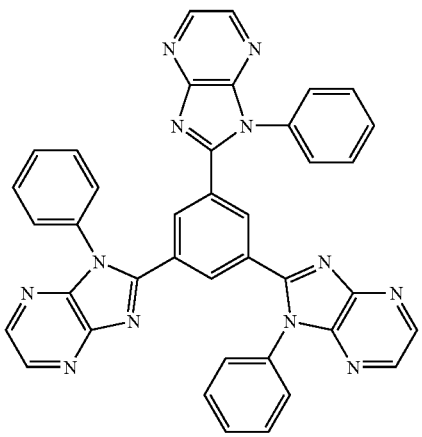

-continued
(E-20)
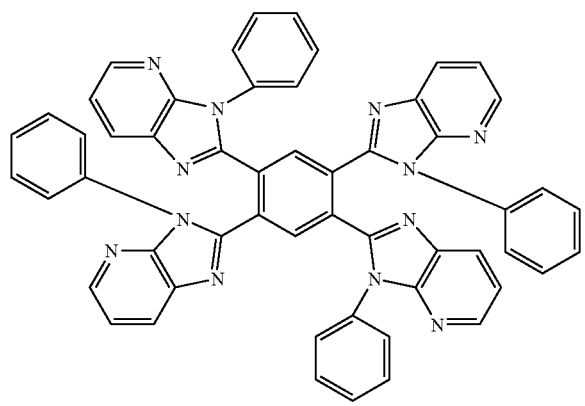
(E-21)
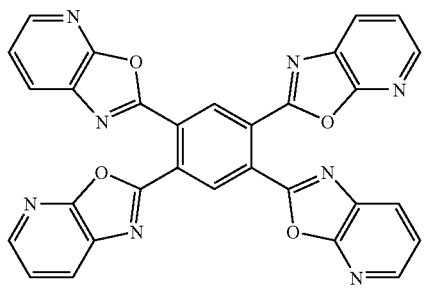
(E-22)
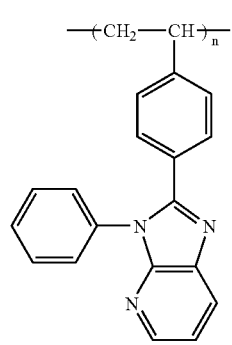
weight-average molecular weight:
16,500 (in terms of polystyrene)
(E-23)
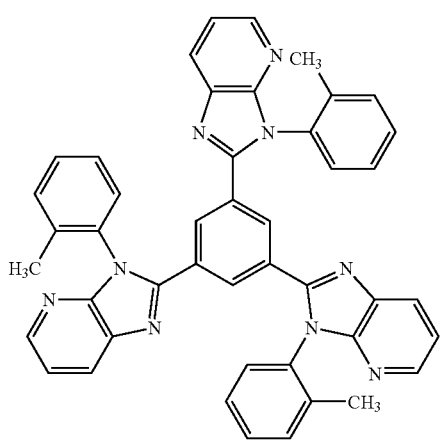
(E-24)
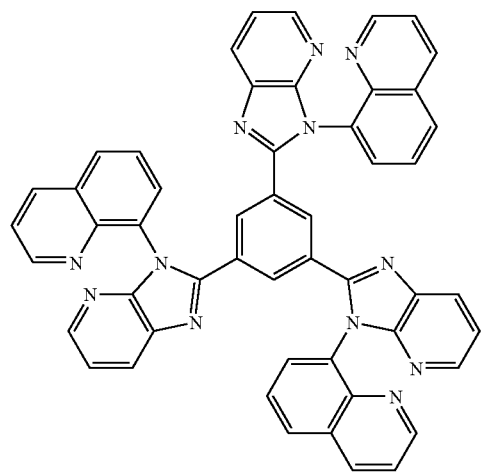
(E-25)
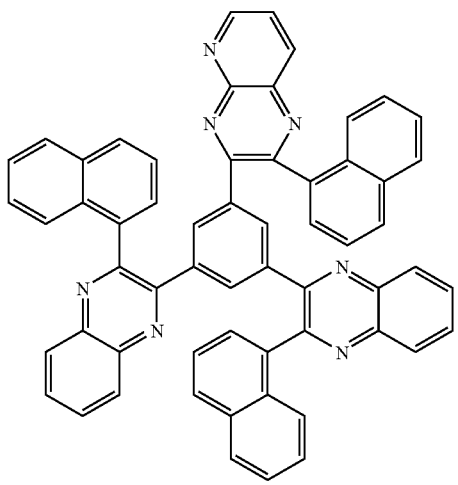

-continued
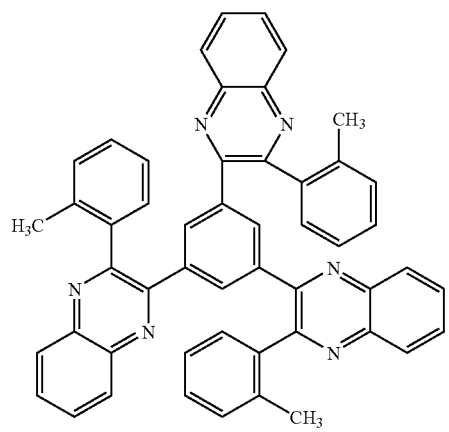
(E-26)
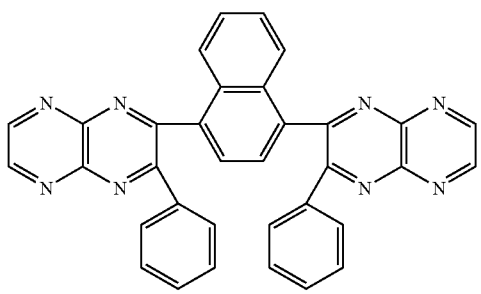
(E-27)
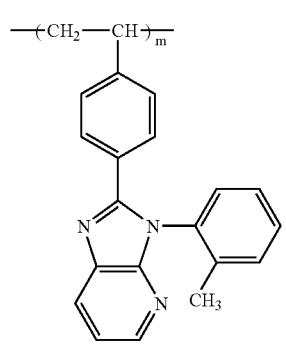
(E-28)
weight-average molecular weight:
21,000 (in terms of polystyrene)
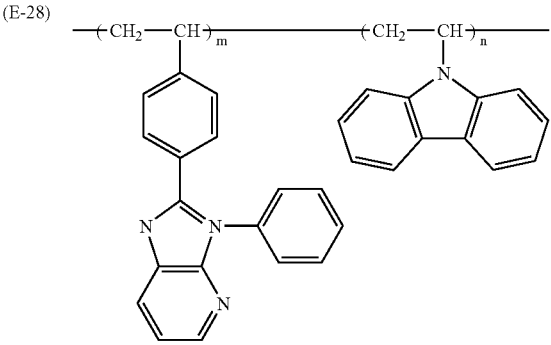
(E-29)
weight-average molecular weight:
17,000 (in terms of polystyrene)
m:n = 1:1 (molar ratio)
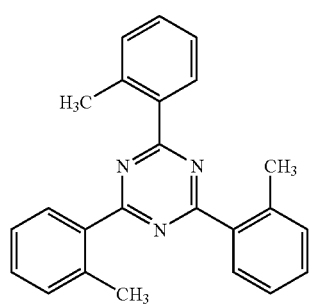
(E-30)
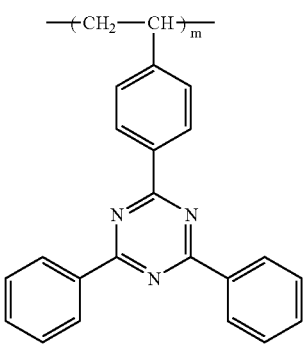
(E-31)
weight-average molecular weight:
74,000 (in terms of polystyrene)

-continued
(E-32)
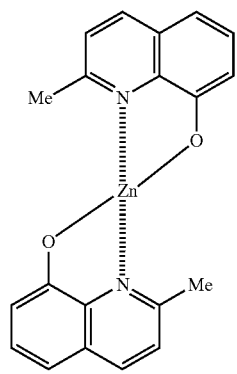
(E-33)
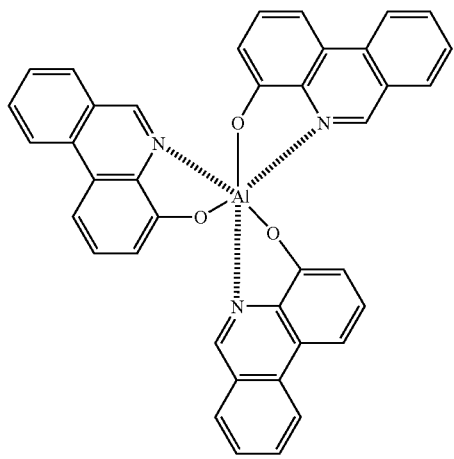
(E-34)
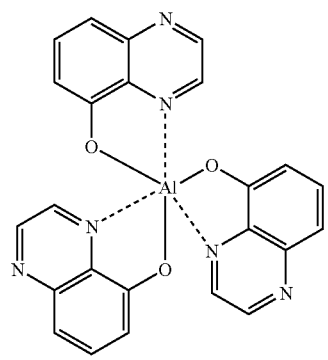
(E-35)
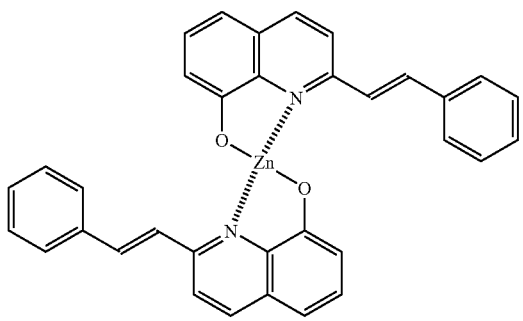
(E-36)
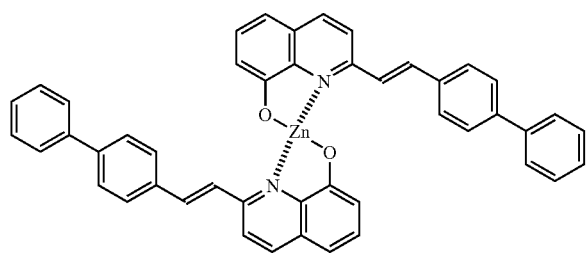
(E-37)
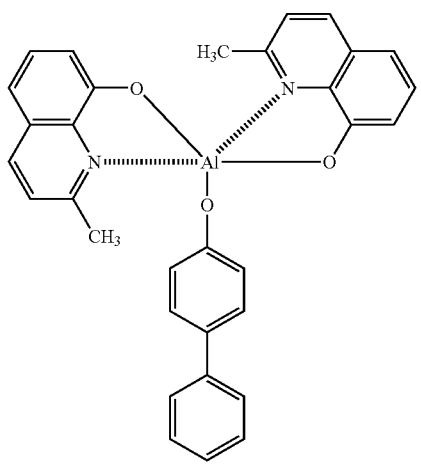
(E-38)
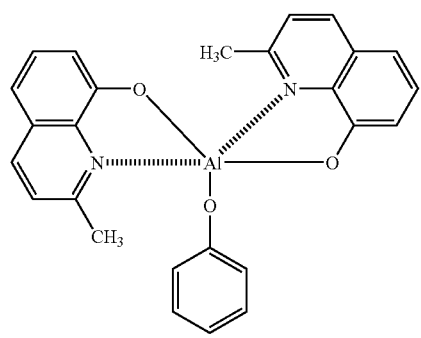
(E-39)
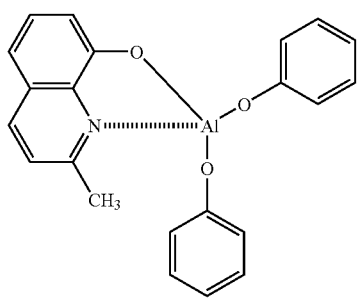

-continued
(E-40)
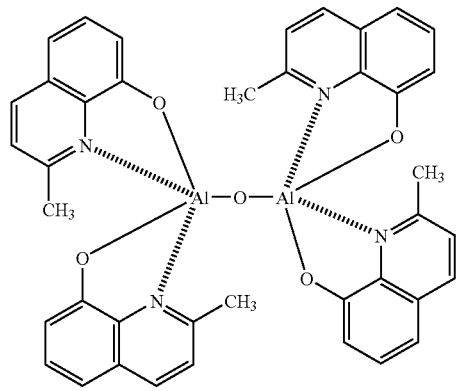
(E-41)
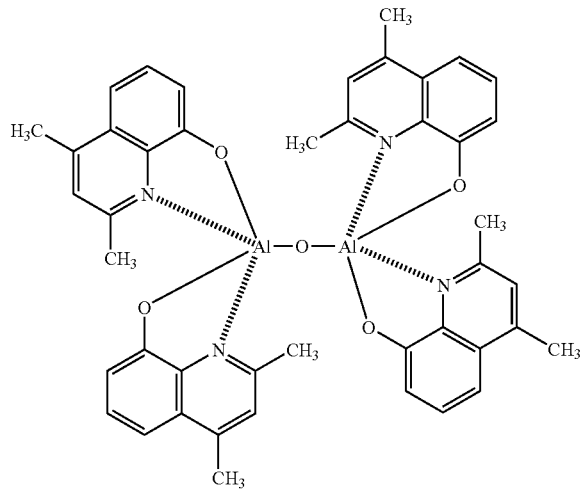
(E-42)
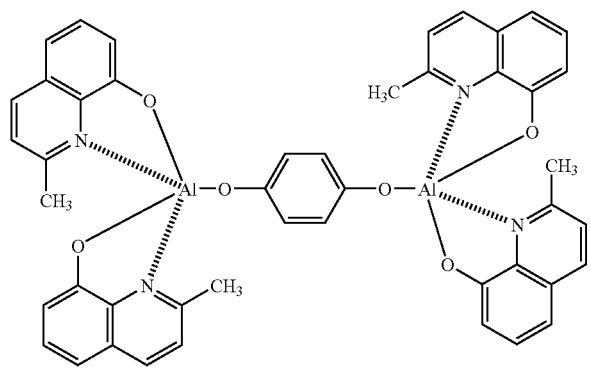
(E-43)
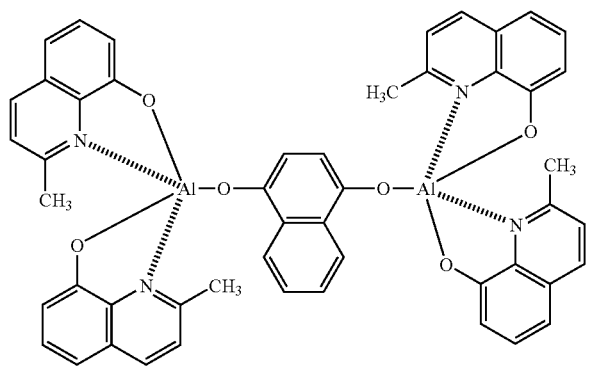
(E-44)
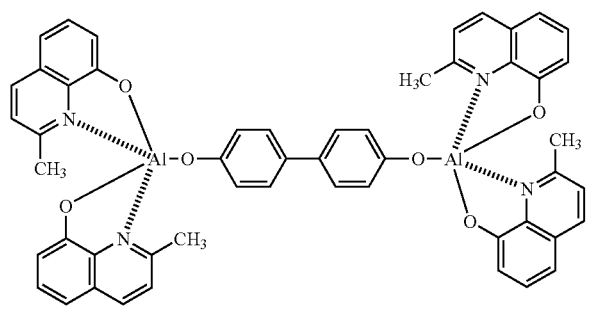
(E-45)
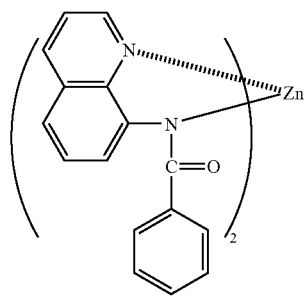
(E-46)
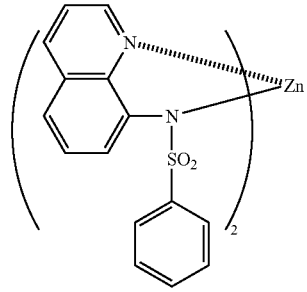
(E-47)
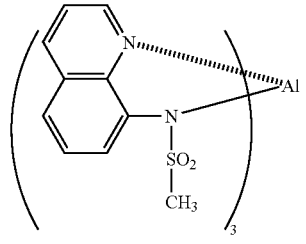

-continued
(E-48)
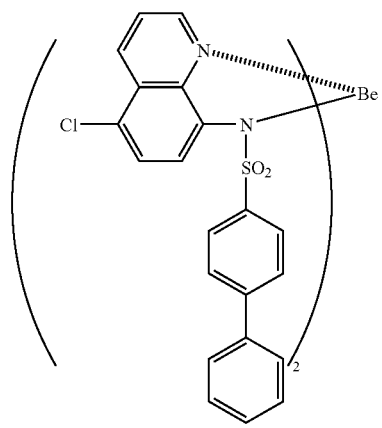
(E-49)
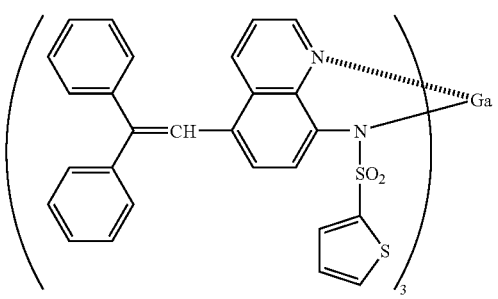
(E-50)
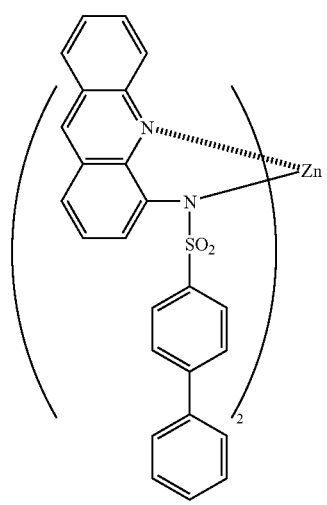
(E-51)
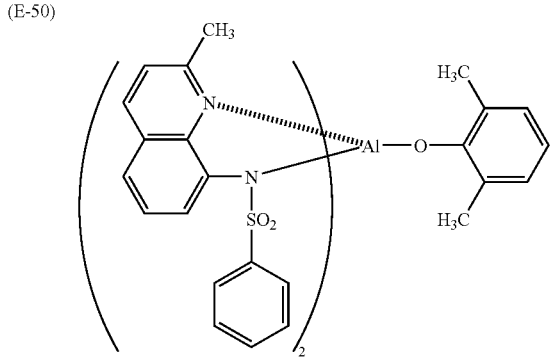
(E-52)
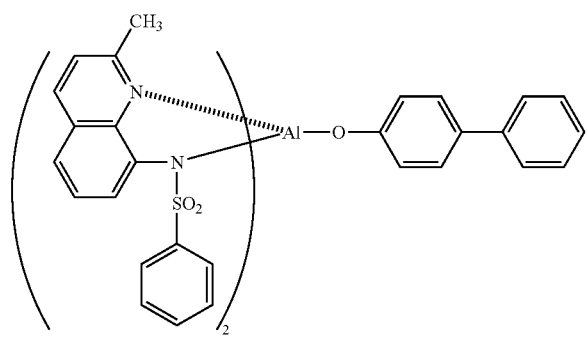
(E-53)
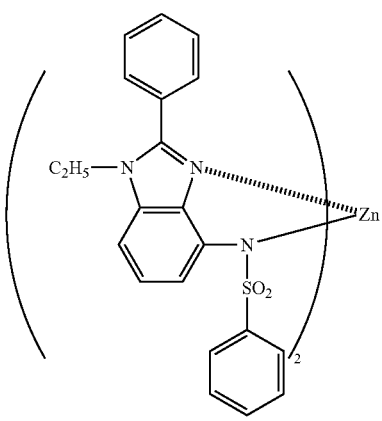

-continued
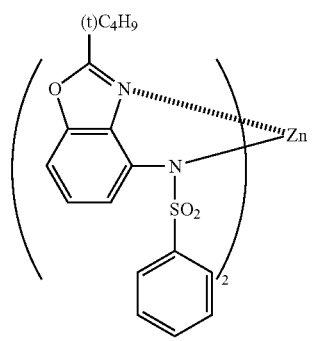
(E-54)
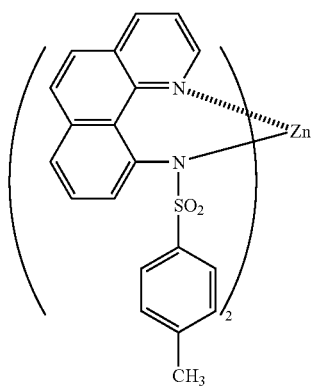
(E-55)
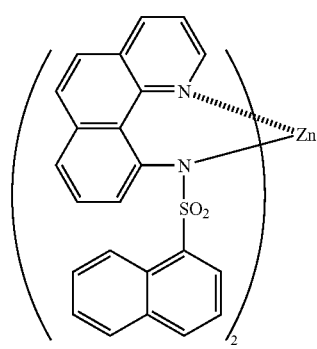
(E-56)
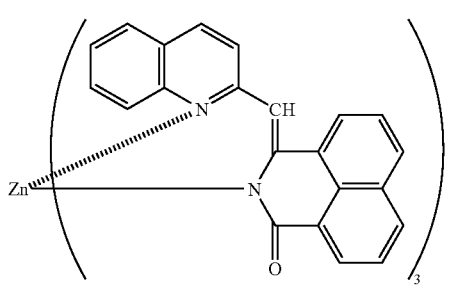
(E-57)
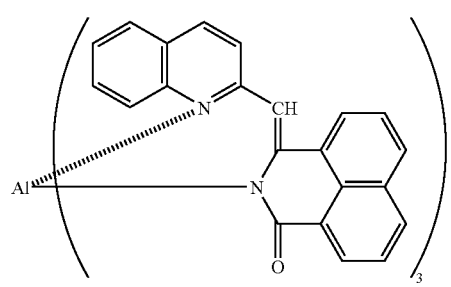
(E-58)
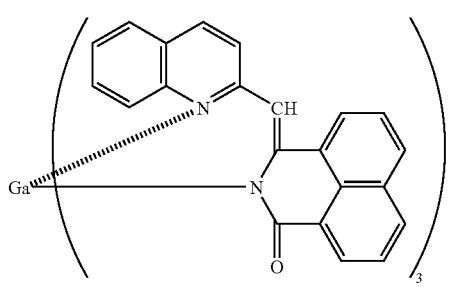
(E-59)
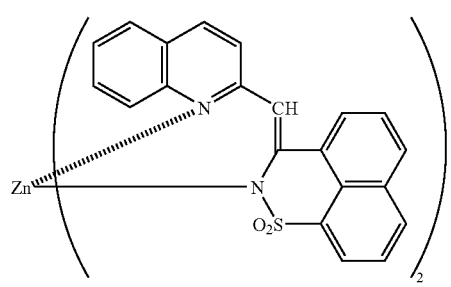
(E-60)
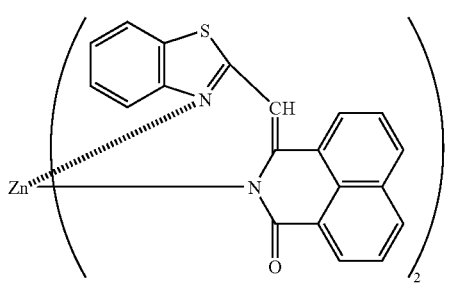
(E-61)

-continued
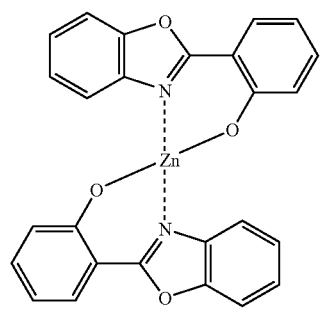
(E-62)
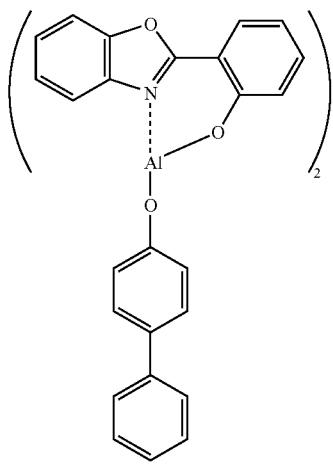
(E-63)
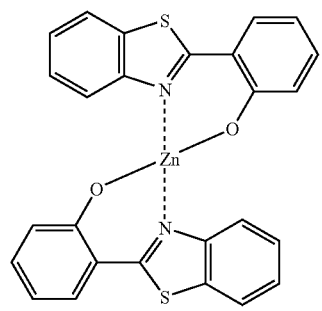
(E-64)
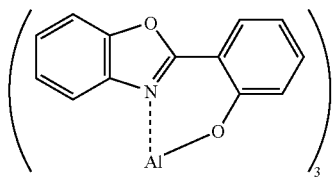
(E-65)
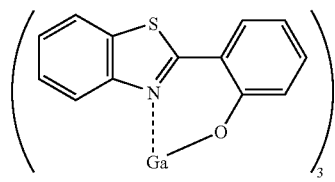
(E-66)
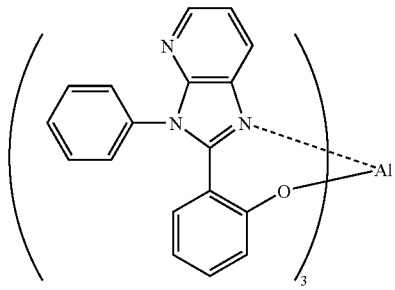
(E-67)
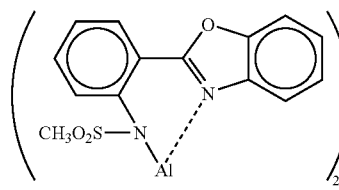
(E-68)
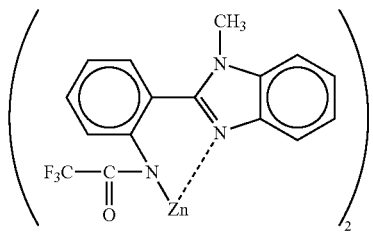
(E-69)
(E-70)
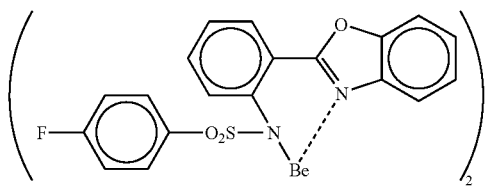
(E-71)

-continued
(E-72)
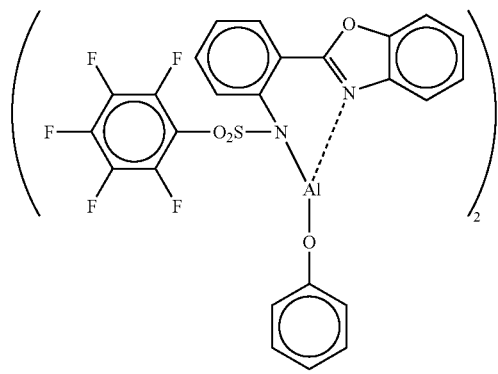
(E-73)
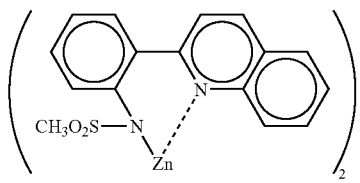
(E-74)
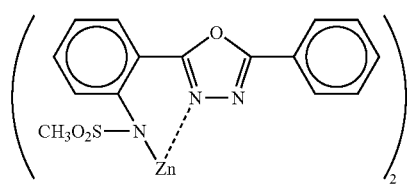
(E-75)
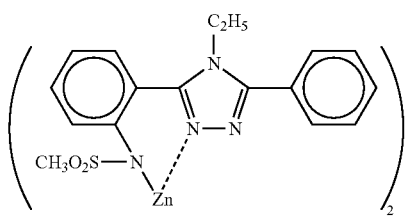
(E-76)
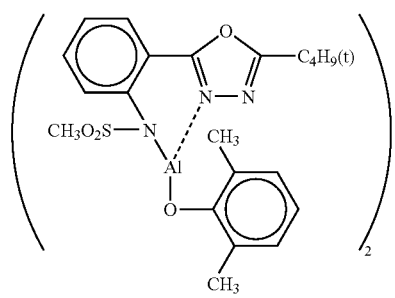
(E-77)
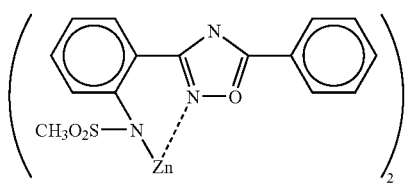
(E-78)
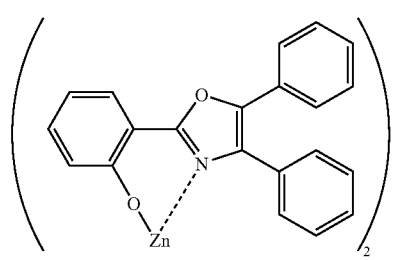
(E-79)
(E-80)
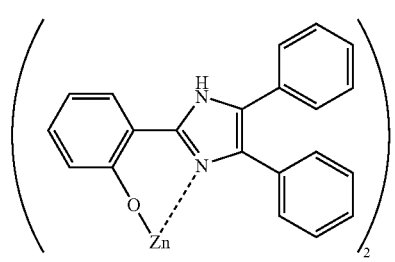
(E-81)
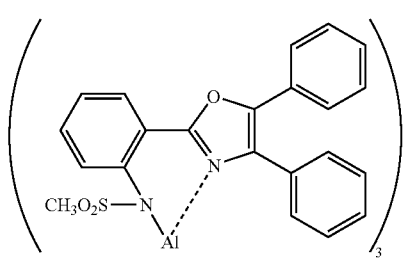

-continued
(E-82)
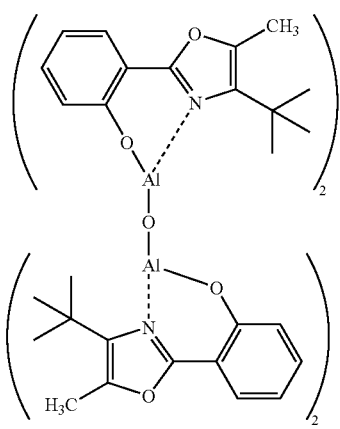
(E-83)
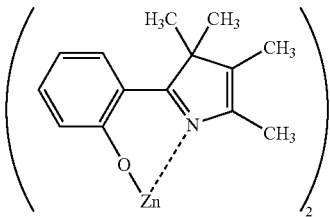
(E-84)
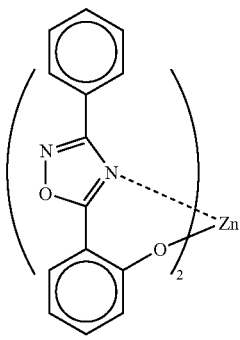
(E-85)
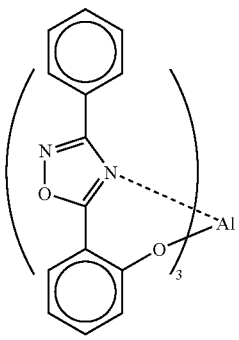
(E-86)
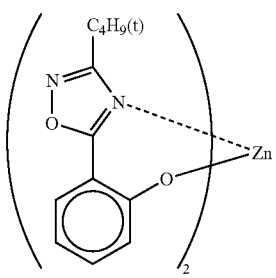
(E-87)
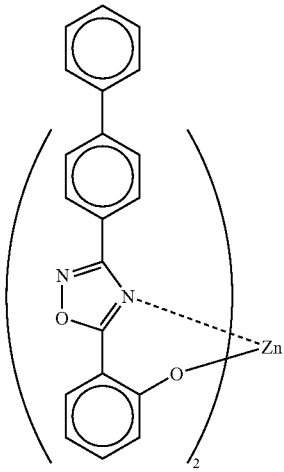
(E-88)
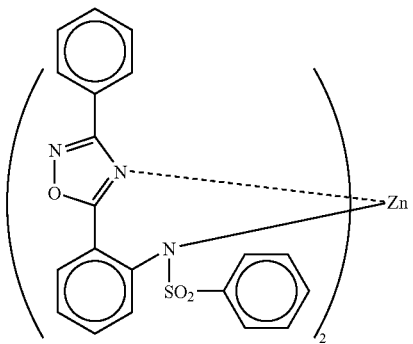
(E-89)
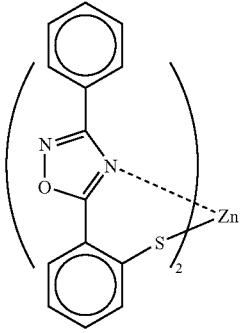

-continued
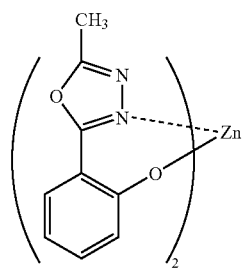 (E-90)
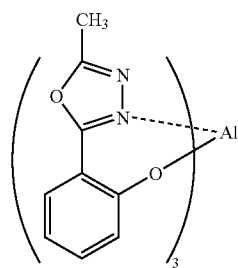 (E-91)
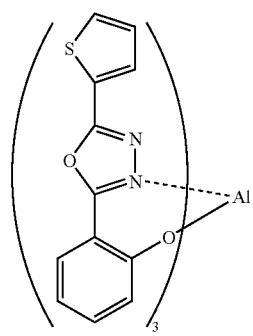 (E-92)
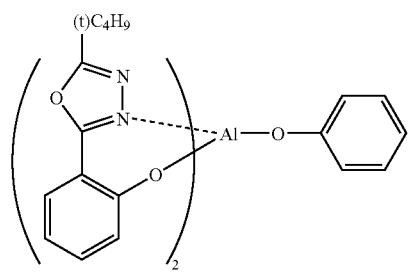 (E-93)
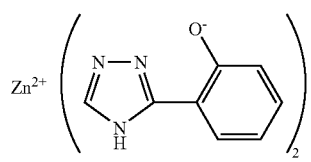 (E-94)
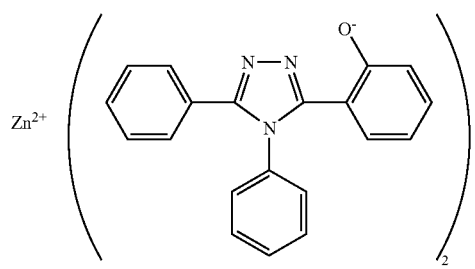 (E-95)
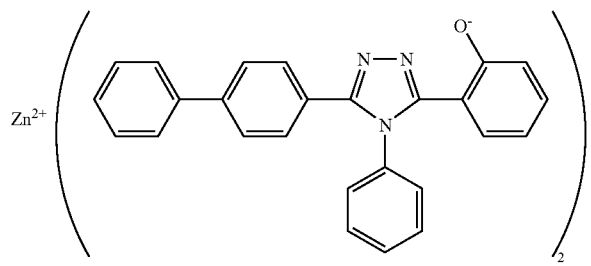 (E-96)
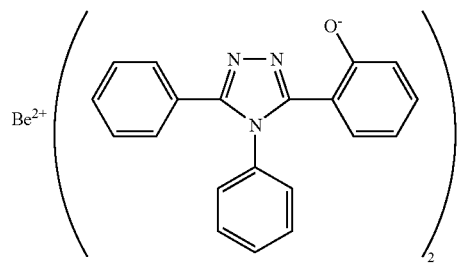 (E-97)
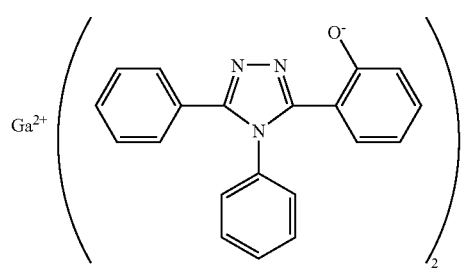 (E-98)
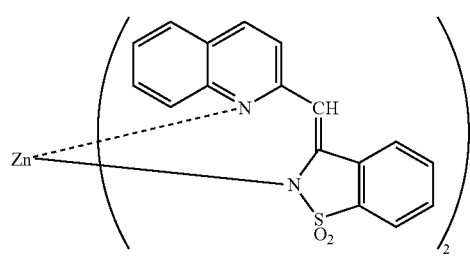 (E-99)

-continued
(E-100)
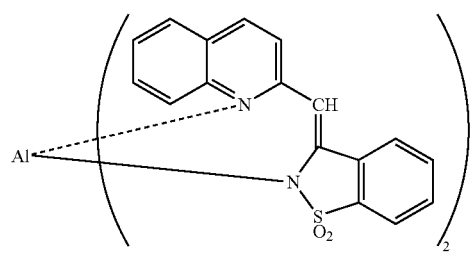
(E-101)
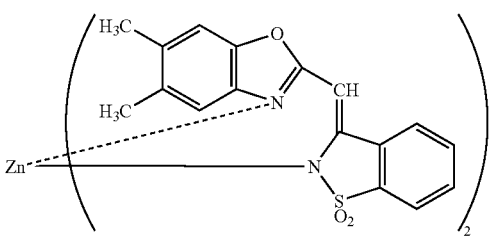
(E-102)
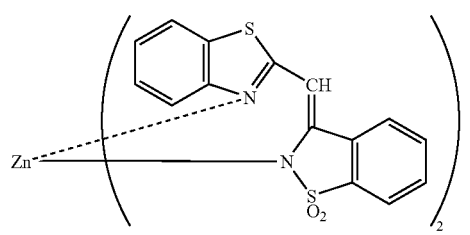
(E-103)
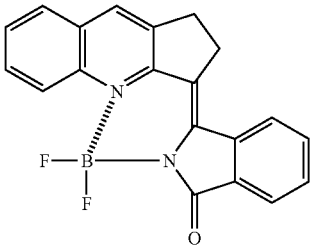
(E-104)
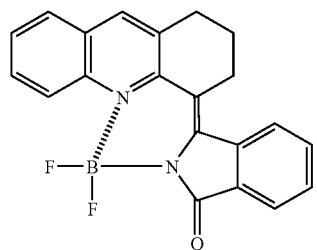
(E-105)
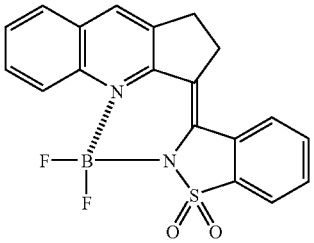
(E-106)
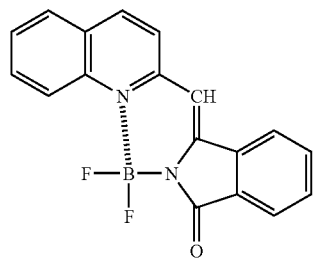
(E-107)
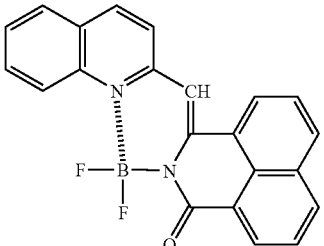
(E-108)
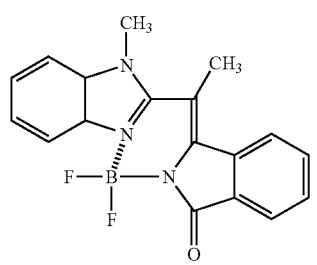
(E-109)
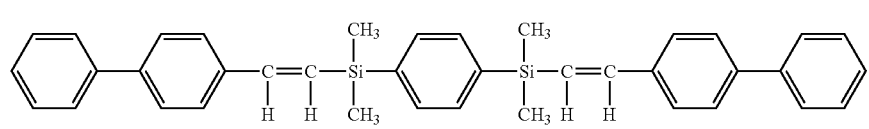
(E-110)
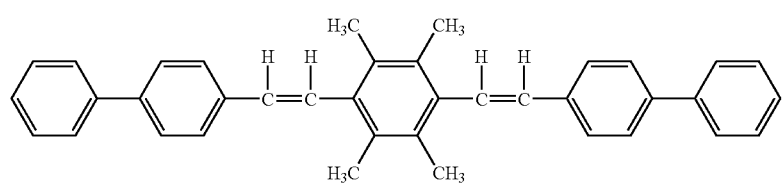

-continued
(E-111)
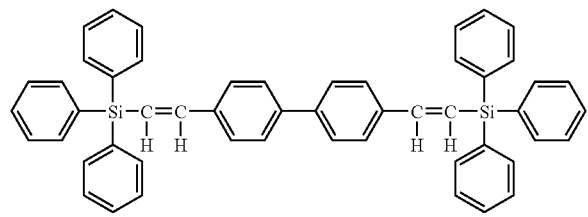
(E-112)
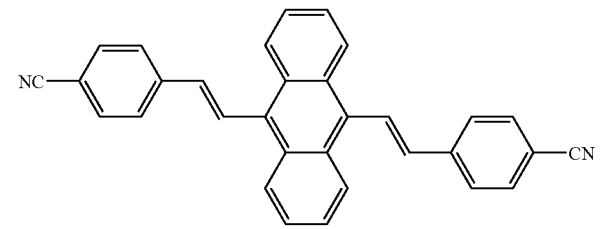
(E-113)
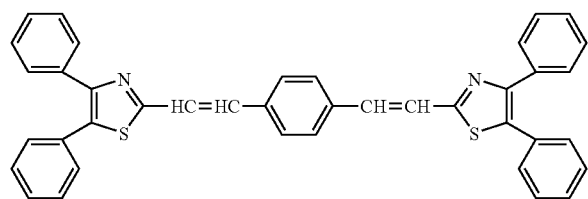
(E-114)
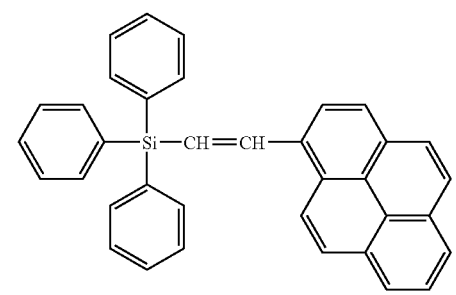
(E-115)
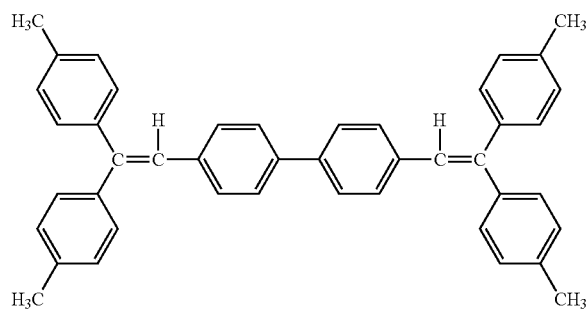
(E-116)
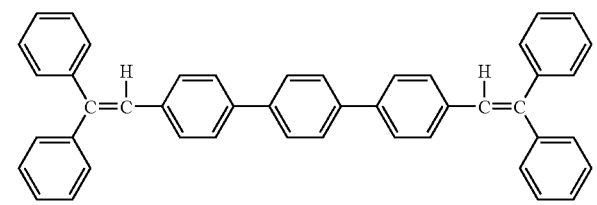
(E-117)
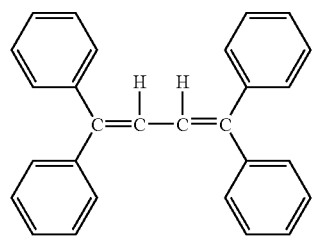
(E-118)
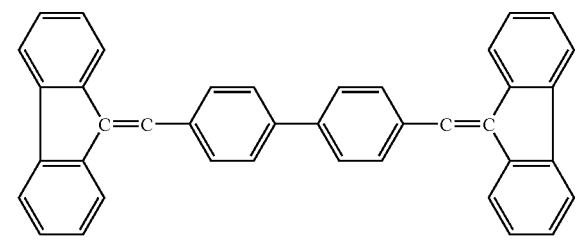
(E-119)
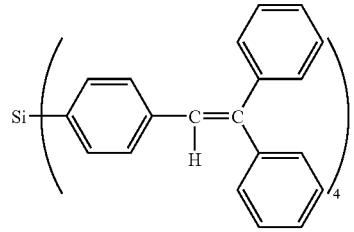
(E-120)
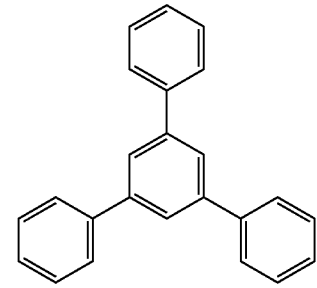

-continued
(E-121)
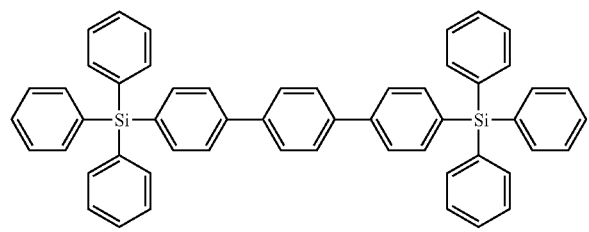
(E-122)
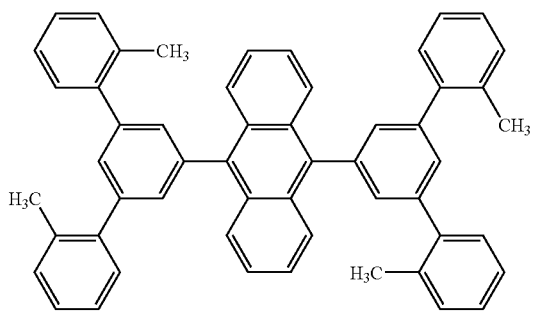
(E-123)
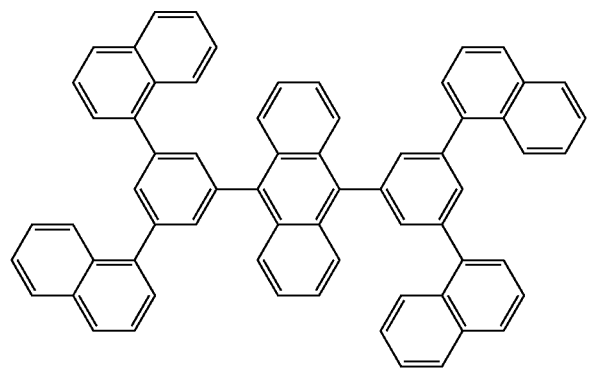
(E-124)
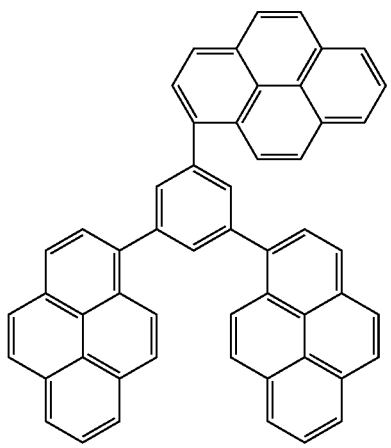
(E-125)
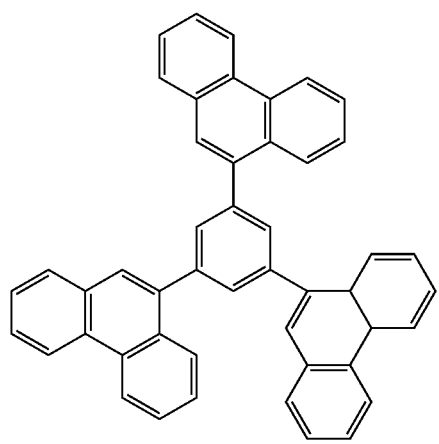
(E-126)
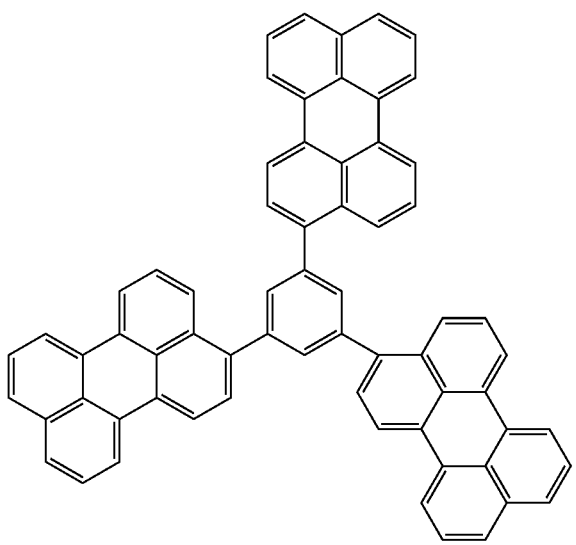

-continued
(E-127)
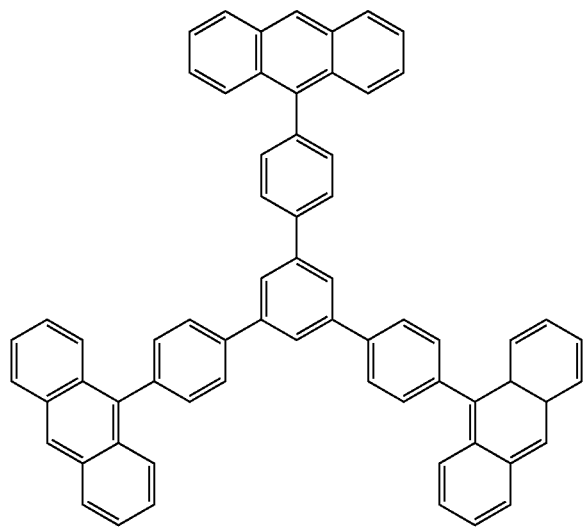
(E-128)
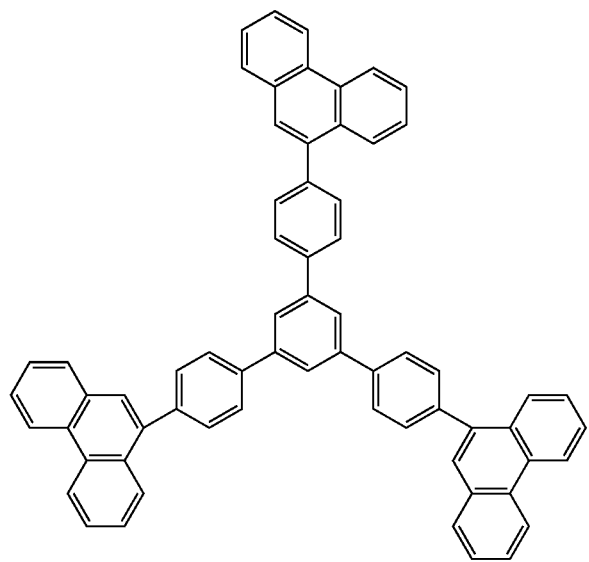
(E-129)
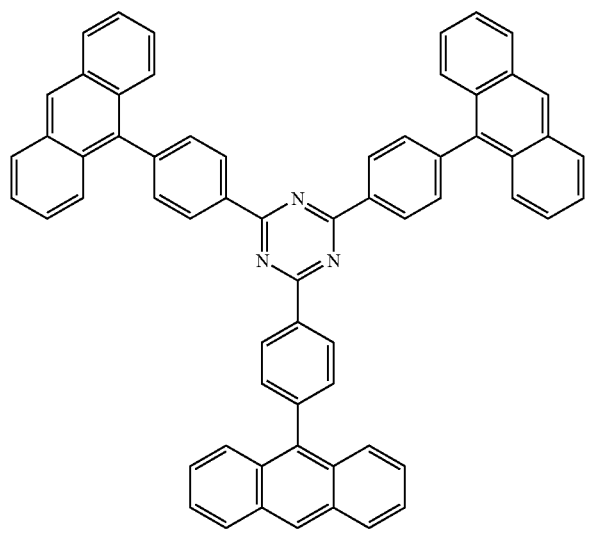
(E-130)
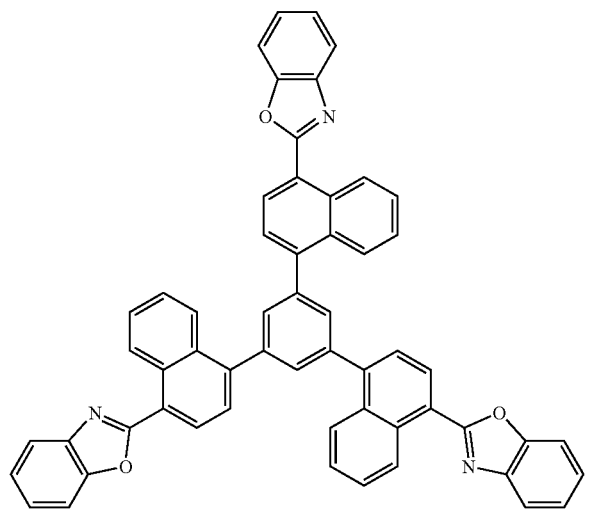
(E-131)
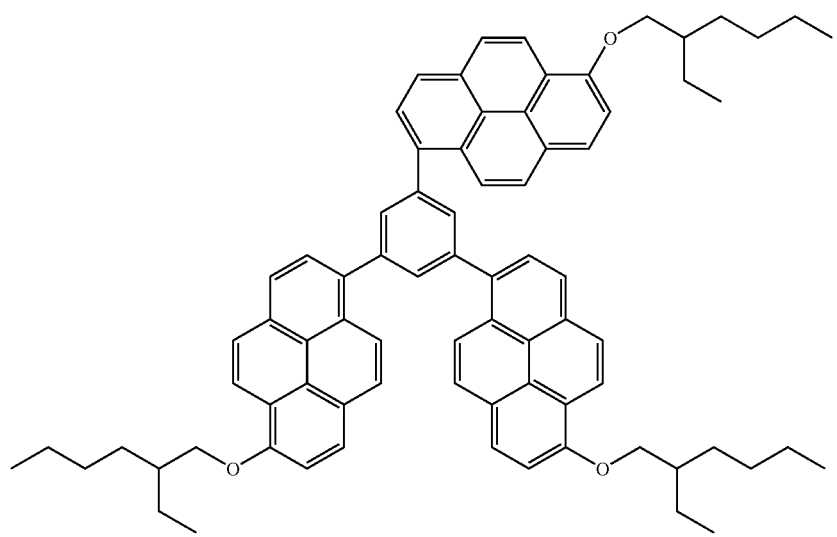

-continued (E-132)

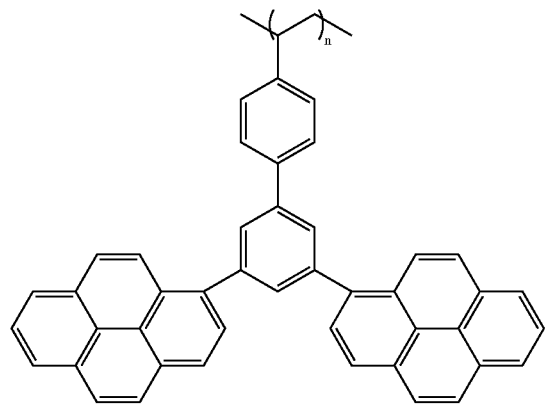

molecular weight in terms
of polystyrene Mw = 4200

(E-133)

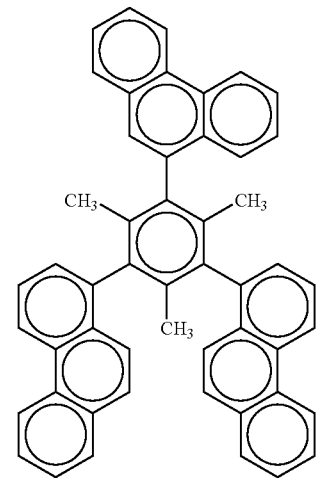

(E-134)

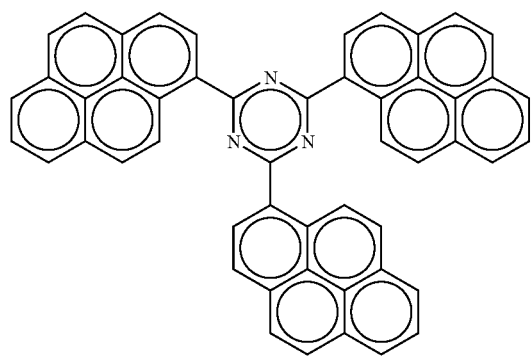

(E-135)

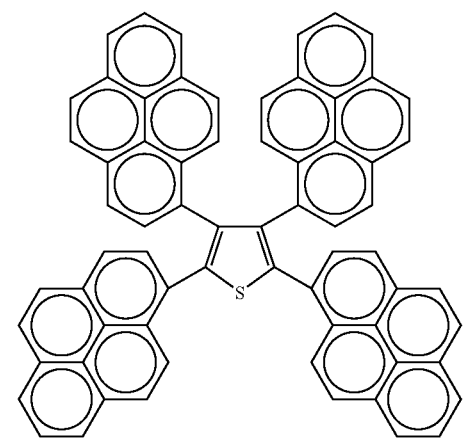

Next, the host material is described below. The compounds of the invention represented by the general formula (I) generally have an absorption in a green region, and hence, in order to emit light with a high efficiency by energy transfer from the host material, it is necessary to match the light-emitting spectrum of the host material with the absorption spectrum. The host material to be used in the invention generally emits a green light in the case where the compound represented by the general formula (I) is not contained. The host material is preferably a triarylamine compound, a styryl compound, an aromatic fused multi-ring compound or an organometalic complex, more preferably a metal complex of a 8-quinolinol derivative, particularly preferably Alq(tris(8-hydroxyquinolinato)aluminum.

Next, the EL element containing the compound of the invention is described below. Although methods for forming the organic layer of the EL element containing the compound of the general formula represented by the general formula (I) is not particularly limited, there may be employed a vacuum deposition method by resistance heating, an electron beam method, a sputtering method, a molecule-laminating method, a coating method, an inkjet method, a printing method or a transfer method. In view of properties and production aspects, a vacuum deposition method by resistance heating and a coating method are preferred.

The light-emitting element of the invention is an element wherein a light-emitting layer or a plurality of organic compound thin layers including the light-emitting layer are formed between a pair of electrodes of an anode and a cathode. The element may contain a hole injecting layer, a hole transporting layer, an electron injecting layer, an electron transporting layer and a protective layer in addition to the light-emitting layer. Each of these layers may have functions of other layers. Various materials may be used for forming respective layers.

The anode functions to feed holes to the hole injecting layer, the hole transporting layer and the light-emitting layer, and a metal, an alloy, a metal oxide, an electrically conductive compound or a mixture thereof may be used for it, with materials having a work function of 4 eV or more being preferred. Specific examples thereof include electrically conductive metal oxides such as tin oxide, zinc oxide, indium oxide and indium tin oxide (ITO), metals such as gold, silver, chromium and nickel, mixtures or laminates of these metals and the electrically conductive metal oxides, inorganic electrically conductive materials such as copper iodide and copper sulfide, organic electrically conductive materials such as polyaniline, polythiophene and polypyrrole, and laminates of these materials and ITO, with electrically conductive metal oxides being preferred. Particularly, in view of productivity, high conductivity and transparency, ITO is preferred. The thickness of the anode may properly be selected, but is preferably 10 nm to 5 μm, more preferably 50 nm to 1 μm, still more preferably 100 nm to 500 nm.

As the anode, an anode obtained by forming a layer of the above-described material on a substrate of soda-lime glass, alkali-free glass or transparent resin. In the case of using glass, it is preferred to use alkali-free glass so as to reduce the amount of ions dissolved from the glass. Also, in the case of using soda-lime glass, it is preferred to use soda-lime glass having provided thereon a barrier coat of silica or the like. The thickness of the substrate is not particularly limited as long as it is enough to maintain mechanical strength and, in the case of using glass, the thickness is usually 0.2 mm or more, preferably 0.7 mm or more.

Various methods may be employed for preparing the anode depending upon the kind of the material and, in the case of, for example, ITO, the membrane is formed by a method such as an electron beam method, a sputtering method, a vacuum deposition method by resistance heating, a chemical reaction method (e.g., sol-gel method) or a method of coating a dispersion of ITO, or like method.

Washing or other treatment of the anode permits to reduce the driving voltage or enhance light-emitting efficiency. In the case of, for example, ITO, UV-ozone treatment or plasma treatment is effective.

The cathode functions to feed electron to the electron injecting layer, the electron transporting layer and the light-emitting layer, and is selected by considering adhesion properties to a layer adjacent thereto such as the electron injecting layer, the electron transporting layer and the light-emitting layer, ionization potential and stability. As materials for the cathode, a metal, an alloy, a metal oxide, an electrically conductive compound and the mixture thereof may be used. Specific examples thereof include an alkali metal (e.g., Li, Na, K or CS) or the fluoride or oxide thereof, an alkaline earth metal (e.g., Mg or Ca) or the fluoride or oxide thereof, gold, silver, lead, aluminum, sodium-potassium alloy or the mixture metal thereof, lithium-aluminum alloy or the mixture metal thereof, magnesium-silver alloy or the mixture metal thereof, and a rare earth metal such as indium or ytterbium. More preferred are those which have a work function of 4 eV or less, with aluminum, lithium-alluminum alloy or the mixture metal thereof, and magnesium-silver alloy or the mixture metal thereof being more preferred. The thickness of the cathode may properly be selected, and is preferably in the range of 10 nm to 5μ, more preferably 50 nm to 1 μm, still more preferably 100 nm to 1 μm.

The cathode may be prepared by a method such as an electron beam method, a sputtering method, a vacuum deposition method by resistance heating or a coating method, and the metal may be vacuum-deposited as a single body, or two or more metals may be vacuum-deposited at the same time. Further, it is possible to vacuum-deposit a plurality of metals to form an alloy electrode or, alternatively, a previously prepared alloy may be vacuum-deposited.

As to the sheet resistances of the anode and the cathode, smaller resistances are preferred, with several hundreds Ω or less being preferred.

The material of the light-emitting layer contains at least one compound of the invention represented by the general formula (I), and may contain two or more of the compounds represented by the general formula (I). Also, other light-emitting materials than the compounds represented by the general formula (I) may be used together with the light-emitting material of the invention, and any compound may be used that can form a layer which, upon application of an electric field, permits to inject holes from the anode or from the hole injecting layer or the hole transporting layer and permits to inject electrons from the cathode or from the electron injecting layer or the electron transporting layer, which functions to move the injected charge, and which provides the site where the hole and the electron recombines to permit emission of light. As the compounds to be used in the light-emitting layer, either of those which emit a light from excited singlet and those which emit a light from excited triplet may be used. For example, there may be illustrated benzoxazole, benzimidazole, benzothiazole, styrylbenzene, polyphenyl, diphenylbutadiene, tetraphenylbutadiene, naphthalimide, coumarin, perylene, perynone, oxadiazole, aldazine, pyralizine, cyclopentadiene, bisstyrylanthracene, quinacridone, pyrrolipyridine, thiadiazolopyridine, styrylamine, aromatic dimethylidyne compound, metal complexes of 8-quinolinol, various metal complexes represented by organometallic complexes and rare earth metal complexes, the derivatives of the above-described compounds, and polymers such as polythiophene, polyphenylene and polyphenylenevinylene as well as the compounds of the invention. The thickness of the light-emitting layer is not particularly limited, but is preferably in the range of from 1 nm to 5 μm, more preferably from 10 nm to 500 nm.

Methods for forming the light-emitting layer are not particularly limited, and there may be employed a vacuum-depositing method by resistance heating, an electron beam method, a sputtering method, a molecule-laminating method, a coating method(e.g., a spin-coating method, a cast coating method or a dip-coating method), an LB method, an inkjet method, a printing method and a transfer method, with a vacuum-depositing method by resistance heating and a coating method being preferred.

As the materials for the hole injecting layer and the hole transporting layer, any one may be used that has one of the function to inject holes from the anode, the function of transporting holes, and the function of blocking electrons injected from the cathode. Specific examples thereof include carbazole, imidazole, triazole, oxazole, oxadiazole, polyarylalkane, pyrazoline, pyrazolone, phenylenediamine, arylamine, amino-substituted chalcone, styrylanthracene, fluorenone, hydrazone, stilbene, silazane, aromatic tertiary amine compound, styrylamine, aromaticdimethylidyne compounds, porphyrin-based compound, polysilane-based compound, poly(N-vinylcarbazole), aniline-based copolymer, electrically conductive high molecular oligomers and polymers such as thiophene oligomers and polymers and polythiophene, carbon film and derivatives of the above-described compounds. The thickness of the hole injecting layer and the hole transporting layer is not particularly limited depending upon the kind of the material, but is preferably in the range of from 1 nm to 5 μm, more preferably from 5 nm to 1 μm, still more preferably from 10 nm to 500 nm. The hole injecting layer and the hole transporting layer may be a single-layer structure comprising one, two or more of the materials described above, or may be a multi-layer structure composed of a plurality of layers of the same formulation or different formulations.

As a method for forming the hole injecting layer and the hole transporting layer, there may be employed a vacuum deposition method, an LB method, an ink jet method, a printing method, a transfer method, a coating method of dissolving or dispersing the aforementioned hole injecting material or the hole transporting material in a solvent (e.g., a spin-coating method, a cast-coating method or a dip-coating method). With the coating method, the materials may be dissolved or dispersed together with a resin component, and examples of such resin components include polyvinyl chloride, polycarbonate, polystyrene, polymethylmethacrylate, polyester, polysulfone, polyphenylene oxide, polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin and silicone resin.

Also, the thickness of the organic membrane to be used in the invention which exists between the light-emitting alyer and the cathode is not particularly limited, and is preferably 0.1 nm to 100 nm, more preferably 2 nm to 50 nm, still more preferably 5 nm to 40 nm.

Methods for forming the organic membrane are not particularly limited, and there may be employed a vacuum deposition method, an LB method, an ink jet method, a printing method, a transfer method, a coating method of dissolving or dispersing the aforementioned hole injecting material or the hole transporting material in a solvent (e.g., a spin-coating method, a cast-coating method or a dip-coating method).

As materials for the electron injecting layer and the electron transporting layer, any of those which exert one of the function of injecting electrons from the cathode, the function of transporting electrons and the function of blocking holes injected from the anode may be used with no limitations. Specific examples thereof include triazole, triazine, oxazole, oxadiazole, fluorenone, anthraquinodimethane, anthrone, diphenylquinone, tiopyran dioxide, carbodiimide, fluorenylidenemethane, distyrylpyrazine, aromatic tetracarboxylic acid anhydrides such as naphthaleneperylene, phthalocyanine, various metal complexes exemplified by metal complexes of 8-quinolinol derivatives or metal phthalocyanine, or metal complexes containing as a loigand benzoxazole or benzothiazole, and derivatives of the above-described compounds. The thickness of the electron injecting layer and the electron transporting layer is not particularly limited, but is preferably in the range of from 1 nm to 5 µm, more preferably from 5 nm to 1 µm, still more preferably from 10 nm to 500 nm. The electron injecting layer and the electron transporting layer may be a single-layer structure comprising one, two or more of the materials described above, or may be a multilayer structure composed of a plurality of layers of the same formulation or different formulations.

As a method for forming the electron injecting layer and the electron transporting layer, there may be employed a vacuum deposition method, an LB method, an ink jet method, a printing method, a transfer method, a coating method of dissolving or dispersing the aforementioned electron injecting material or the electron transporting material in a solvent (e.g., a spin-coating method, a cast-coating method or a dip-coating method). With the coating method, the materials may be dissolved or dispersed together with a resin component and, as such resin components, those illustrated with respect to the hole injecting and transporting layer may be used.

As the material for the protective layer, any of those which function to prevent invasion of element deterioration-accelerating substances such as moisture and oxygen may be used with no limitations. Specific examples thereof include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $YalF_3$ and $CaF_2$, polyethylene, polypropylene, polymethyl methacrylate, polyimide, polyurea, polytetrafluoroethylene, polychlorotrifluoroethylene, polydichlorodifluoroethylene, copolymer between chlorotrifluoroethylene and dichlorodifluoroethylene, copolymer obtained by copolymerizing a monomer mixture containing tetrafluoroethylene and at least one comonomer, fluorine-containing copolymer containing a cyclic structure in the copolymer main chain, a water-absorbing substance having a water absorption of 1% or more and a moisture-resistant substance having a water absorption of 0.1% or less.

Methods for forming the protective layer are not particularly limited, and there may be employed, for example, a vacuum deposition method, a sputtering method, a reactive sputtering method, an MBE (molecular beam epitaxy) method, a cluster ion beam method, an ion-plating method, a plasma polymerization method (high-frequency-excited ion plating method), a plasma CVD method, a laser CVD method, a heat CVD method, a gas source CVD method, a coating method, an ink jet method, a printing method and a transfer method.

EXAMPLES

The invention is now described by reference to Examples of the invention and Comparative Examples which, however, do not limit the invention in any way.

Comparative Example 1

A transparent supporting substrate (made by Tokyo Sanyo Shinku K.K.) comprising a 25 mm×25 mm×0.7 mm glass substrate having formed thereon a 150-nm thick ITO was used as a substrate. After etching and washing this transparent supporting substrate, the substrate was placed in a vacuum deposition apparatus, and TPD (N,N'-diphenyl-N,N'-di(m-tolyl)-benzidine) was vacuum deposited in a thickness of 40 nm, and a compound of the invention (D-1) and Alq (tris(8-hydroxyquinolinato) aluminum) were vacuum co-deposited at vacuum deposition rates of 0.004 nm/sec and 0.4 nm/sec, respectively in a vacuum of $10^{-3}$ to $10^{-4}$ Pa under the condition of room temperature in substrate temperature to form a 60-nm thick layer. Further, a patterned mask (for attaining light-emitting area of 4 mm×5 mm) was mounted on the organic thin film and, after vacuum co-depositing magnesium and silver (Mg:Ag=10:1) in a thickness of 250 nm, silver was vacuum deposited in a thickness of 250 nm, followed by sealing the element to prepare an EL element (Element No.101).

Comparative Example 2

After etching and washing the ITO substrate in the same manner as in Comparative Example 1, TPD was vacuum-deposited in a thickness of about 40 nm. Then, the compound of the invention (D-1) and Alq (tris(8-hydroxyquinolinato) aluminum) were vacuum co-deposited at vacuum deposition rates of 0.004 nm/sec and 0.4 nm/sec, respectively to form a 40-nm thick layer. Further, as a third layer, Alq alone was vacuum deposited in a thickness of 20 nm, then a cathode was vacuum deposited in the same manner as in Comparative Example 1, followed by sealing the element to prepare an EL element (Element No. 102).

Example 1

After etching and washing the ITO substrate in the same manner as in Comparative Example 1, TPD was vacuum-deposited in a thickness of about 40 nm. Then, the compound of the invention (D-1) and Alq (tris(8-hydroxyquinolinato) aluminum) were vacuum co-deposited at vacuum deposition rates of 0.004 nm/sec and 0.4 nm/sec, respectively to form a 40-nm thick layer. Further, as a third layer, the compound of the invention (E-16) alone was vacuum deposited in a thickness of 20 nm, then a cathode was vacuum deposited in the same manner as in Comparative Example 1, followed by sealing the element to prepare an EL element (Element No. 103). Further, similar elements (Element No. 104 to 106) were prepared by changing the light-emitting material to those described in Table 1.

Then, each of the elements was evaluated in the following manner. Results thus obtained are shown in Table 1.

Maximum Luminance and Wavelength of Emitted Light

A constant direct current was applied to each of the EL elements using a source measure unit 2400 made by Toyo Tekunika on the organic membrane to render the elements of Comparative Examples and Examples of the invention emit a light. The luminance of each of the thus-emitted lights was measured by means of a luminance meter, BM-8, made by Topukon K. K. to compare. The wavelength of each of the emitted lights was measured by means of a spectrum analyzer (PMA-11; Hamamatsu Photonics Co., Ltd.).

Temperature Dependence of Light-Emitting Period of Emitted Light Pulse (Width of Emitted Light Pulse)

The temperature of the element was adjusted to 15° C., and 10-ns intermittent pulse driving was imparted to the element at 10V to measure the light-emitting period per pulse. Then, the temperature of the element was raised to 55° C., and the light-emitting period per pulse was similarly measured. The temperature dependence of the light-emitting period of emitted light pulse (width of emitted light pulse) was evaluated in terms of the values calculated according to the following formula. The nearer to 1 the value is, the smaller is the temperature dependence.

Temperature dependence=Light-emitting period at 15° C./Light-emitting period at 55° C.

TABLE 1

| Element No. | Light-emitting Material | Maximum Luminance (cd/m$^2$) | Wavelength of Emitted Light Elmax (nm) | Temperature Dependence of Pulse Width of Emitted Light |
|---|---|---|---|---|
| 101 | D-1 | 2000 | 616 | 0.83 |
| 102 | D-1 | 2420 | 614 | 0.82 |
| 103 | D-1 | 4050 | 610 | 0.93 |
| 104 | D-22 | 3500 | 658 | 0.92 |
| 105 | D-27 | 6100 | 603 | 0.93 |
| 106 | D-34 | 3000 | 630 | 0.91 |

Compounds used in Comparative Example 1, Comparative Example 2 and Example 1 are shown below.

Additionally, the values of ionization potential (IP) given below are obtained by a photoelectric spectral apparatus (AC-1; made by Riken Keiki), cyclic voltammetry, and from literature (unit: eV).

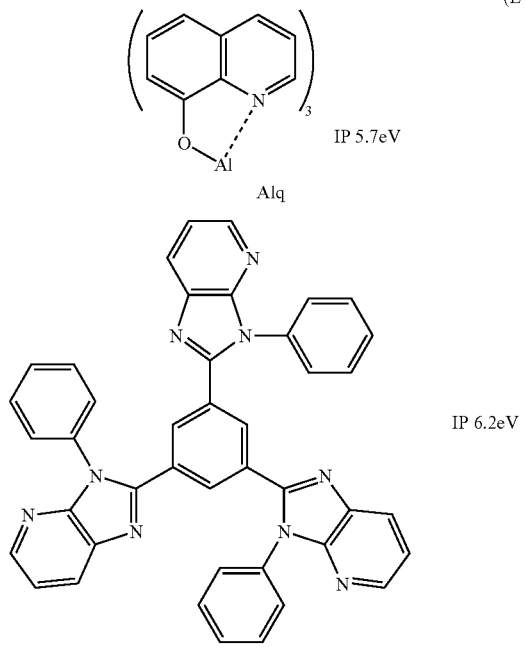

As is apparent from the results in Table 1, the elements of the invention can emit a light with a high luminance and a high efficiency, and show a temperature dependence of the pulse width of emitted light near to 1, thus being excellent.

Example 2

After etching and washing the ITO substrate in the same manner as in Comparative Example 2, TPD was vacuum-deposited in a thickness of about 40 nm. Then, the compound of the invention (D-1) and Alq (tris(8-hydroxyquinolinato) aluminum) were vacuum co-deposited at vacuum deposition rates of 0.004 nm/sec and 0.4 nm/sec, respectively to form a 40-nm thick layer. Further, as a third layer, each of the compounds described in Table 2 alone was vacuum deposited in a thickness of 5 nm, then, as a fourth layer, Alq was vacuum deposited thereon in a thickness of 15 nm. Subsequently, a cathode was vacuum deposited in the same manner as in Example 1, followed by sealing the element to prepare EL elements (Element Nos. 201 to 207).

TABLE 2

| Element No. | Compound of 3$^{rd}$ Layer | Temperature Dependence of Pulse Width of Emitted Light |
|---|---|---|
| 201 | E-16 | 0.93 |
| 202 | E-4 | 0.90 |
| 203 | E-1 | 0.91 |
| 204 | E-67 | 0.85 |
| 205 | E-111 | 0.87 |
| 206 | E-117 | 0.89 |
| 207 | E-125 | 0.87 |

Compounds used in Example 2 are shown below.

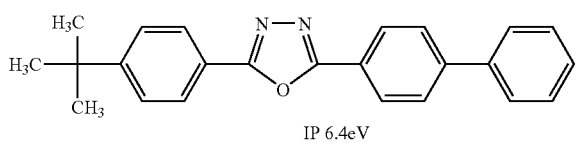
IP 6.4eV
(E-4)

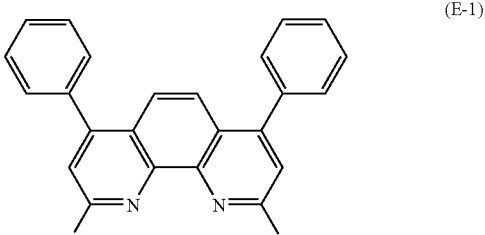
IP 6.7eV
(E-1)

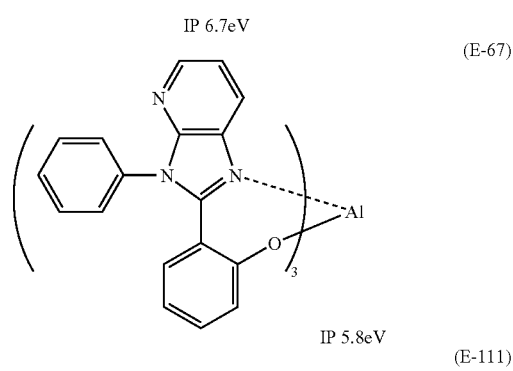
IP 5.8eV
(E-67)

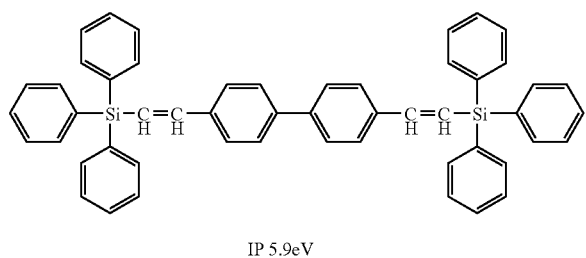
IP 5.9eV
(E-111)

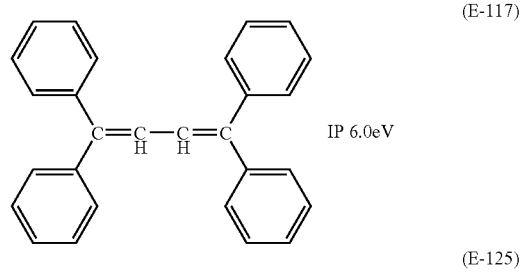
IP 6.0eV
(E-117)

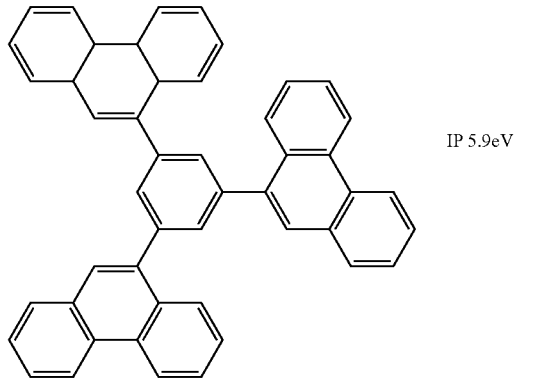
IP 5.9eV
(E-125)

Results obtained by measuring temperature dependence of pulse width in the same manner as in Example 1 are shown in Table 2. It can be confirmed from the results that, in comparison with Comparative Example 2 (Element No. 102), the elements of the invention have a less temperature dependence of the pulse width of emitted light. Additionally, red purity of the elements No. 101 to 106 and 201 to 207 were good.

While the invention has been described in detail and by reference to specific embodiments, it is apparent to those skilled in the art to make various alterations and modifications without departing from the spirit and the scope of the invention.

This application is based on Japanese Patent Application No. 2001-101027 filed on 30, Mar. 2001, and the contents are incorporated herein as a reference.

INDUSTRIAL APPLICABILITY

The light-emitting element of the invention has a small temperature dependence of the pulse width of emitted light upon pulse driving, and are excellent in red purity, light-emitting efficiency and durability. Hence, the light-emitting element of the invention may suitably be used in the field of backlight, flat panel display, illuminating light sources, display elements, electrophotography, organic semiconductor lasers, recording light sources, exposing light sources, reading light sources, signs, signboards and optical communication devices.

What is claimed is:

1. A light-emitting element, which comprises a substrate having provided thereon a pair of opposed electrodes between which are provided a light-emitting layer containing at least one light-emitting material selected from the compounds represented by the following general formula (I) and a host material, and which comprises an organic membrane having a larger ionization potential than that of the host material between the light-emitting layer and a cathode, the organic membrane being in contact with the light-emitting layer:

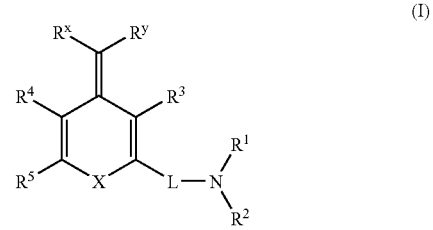
(I)

wherein $R^1$, $R^3$, $R^4$ and $R^5$ may be the same or different from each other and each represents a hydrogen atom or a substituent, X represents an oxygen atom, a sulfur atom or N—$R^{Y1}$, $R^{Y1}$ represents a hydrogen atom or a substituent, L represents a linking group comprising a conjugated bond, $R^X$ and $R^Y$ may be the same or different from each other and each represents a hydrogen atom or a substituent, with at least one of them being an electron-withdrawing group, wherein the organic membrane comprises at least one compound selected from the compounds represented by the general formula (E 12):

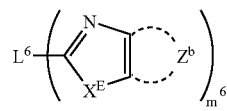

wherein, in the general formula (E 12) $X^E$ represents O, S, N—$R^a$ or C—$R^a$, $R^a$ represents a hydrogen atom or a substituent, $Z^b$ represents atoms necessary for forming a pyrimidine ring, a pyridazine ring, a pyrrole ring, a furan ring, a thiophene ring, a selenophene ring, a tellurophene ring, an imidazole ring, a thiazole ring, a selenazole ring, a tellurazole ring, a thiadiazole ring, an oxadiazole ring and a pyrazole ring, $m^6$ represents an integer of 2 or more, and $L^6$ represents a linking group.

2. The light-emitting element of claim 1, wherein a difference in ionization potential between the organic membrane and the host material in the light-emitting layer is 0.01 eV to 2 eV.

3. The light-emitting element of claim 1, wherein the compound represented by the general formula (I) is a compound represented by the following general formula (II):

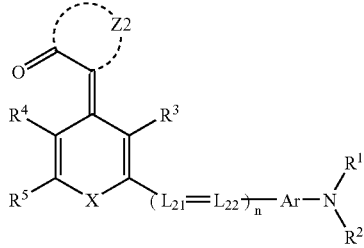

wherein $R^1$, $R^2$, $R^3$, $R^4$ and $R^5$ may be the same or different from each other and each represents a hydrogen atom or a substituent, X represents an oxygen atom, a sulfur atom or N—$R^{Y1}$, $R^{Y1}$ represents a hydrogen atom or a substituent, $Z^2$ represents atoms necessary for forming 5- or 6-membered ring, $L_{21}$ and $L_{22}$ may be the same or different from each other and each represents a methine group, a substituted methine group or a nitrogen atom, n represents an integer of 0 to 3, and Ar represents an arylene group or a divalent aromatic hetero ring group.

4. The light-emitting element of claim 3, wherein the compound represented by the general formula (II) is a compound represented by the following general formula (III):

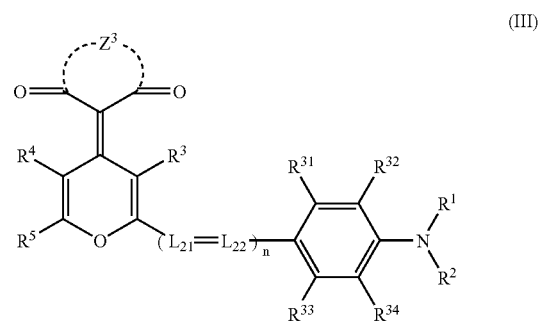

wherein $R^1$, $R^2$, $R^3$, $R^4$, $R^5$, $R^{31}$, $R^{32}$, $R^{33}$ and $R^{34}$ may be the same or different from each other and each represents a hydrogen atom or a substituent, $Z^3$ represents atoms necessary for forming 5- or 6-membered ring, $L_{21}$ and $L_{22}$ may be the same or different from each other and each represents a methine group, a substituted methine group or a nitrogen atom, and n represents an integer of 0 to 3.

5. The light-emitting element of claim 4, wherein the compound represented by the general formula (III) is a compound represented by the following general formula (IV):

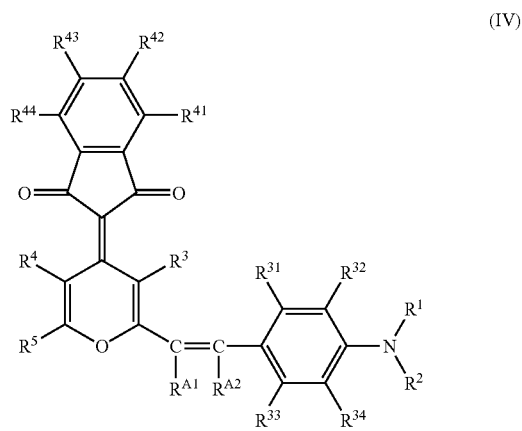

wherein $R^1$, $R^2$, $R^3$, $R^4$, $R^5$, $R^{31}$, $R^{32}$, $R^{33}$, $R^{34}$, $R^{41}$, $R^{42}$, $R^{43}$ and $R^{44}$ may be the same or different from each other and each represents a hydrogen atom or a substituent, and $R^{A1}$ and $R^{A2}$ may be the same or different from each other and each represents a hydrogen atom or a substituent and, when possible, $R^{A1}$ and $R^{A2}$ may be connected to each other and further to other substituent to form a ring.

6. The light-emitting element of claim 1, wherein the host material is an aluminum quinoline derivative.

* * * * *